United States Patent
Li et al.

(10) Patent No.: US 10,020,311 B1
(45) Date of Patent: Jul. 10, 2018

(54) SEMICONDUCTOR MEMORY DEVICE PROVIDED WITH DRAM CELL INCLUDING TWO TRANSISTORS AND COMMON CAPACITOR

(71) Applicant: AP MEMORY TECHNOLOGY CORPORATION, Zhubei, Hsinchu County (TW)

(72) Inventors: Owen Li, Zhubei (TW); Wenliang Chen, Zhubei (TW)

(73) Assignee: AP MEMORY TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 15/666,834

(22) Filed: Aug. 2, 2017

(51) Int. Cl.
*H01L 27/10* (2006.01)
*H01L 27/108* (2006.01)
*H01L 27/115* (2017.01)

(52) U.S. Cl.
CPC ...... *H01L 27/10897* (2013.01); *H01L 27/108* (2013.01); *H01L 27/10841* (2013.01); *H01L 27/115* (2013.01)

(58) Field of Classification Search
CPC . H01L 27/10841; H01L 27/115; H01L 27/108
See application file for complete search history.

(56) References Cited

U.S. PATENT DOCUMENTS

| 7,488,664 | B2 | 2/2009 | Cook et al. |
| 7,505,299 | B2 | 3/2009 | Takemura et al. |
| 8,059,471 | B2 * | 11/2011 | Lueng ............ G11C 11/404 365/185.21 |
| 8,391,078 | B2 * | 3/2013 | Leung ............ G11C 11/404 365/185.05 |
| 8,890,227 | B1 | 11/2014 | Chen et al. |

* cited by examiner

*Primary Examiner* — Nicholas Tobergte
(74) *Attorney, Agent, or Firm* — Wenderoth, Lind & Ponack, L.L.P.

(57) ABSTRACT

A semiconductor memory device is provided such as a random-access memory (DRAM) including a plurality of DRAM memory cells. Each of the DRAM cells includes an N-type transistor, a P-type transistor, and a common capacitor. The components are disposed in the same direction as the bit-line, with the common capacitor occupying the center region between the N- and P-type transistors. The common capacitor is a metal insulator metal (MIM) capacitor configured by connecting three capacitor elements in parallel. The three capacitors include a first capacitor element formed on a first source/drain region of the N-type transistor, a second capacitor element formed on a first source/drain region of the P-type transistor, and a third element over the field isolation region between the transistors. A bottom electrode of each of these capacitor elements connects the first source/drain region of the N-type transistor to a first source/drain region of the P-type transistor.

13 Claims, 56 Drawing Sheets

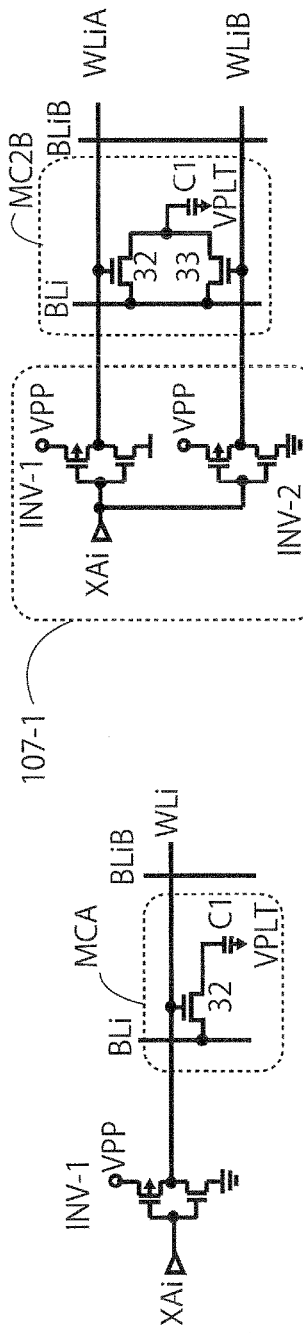
FIG. 5A PRIOR ART
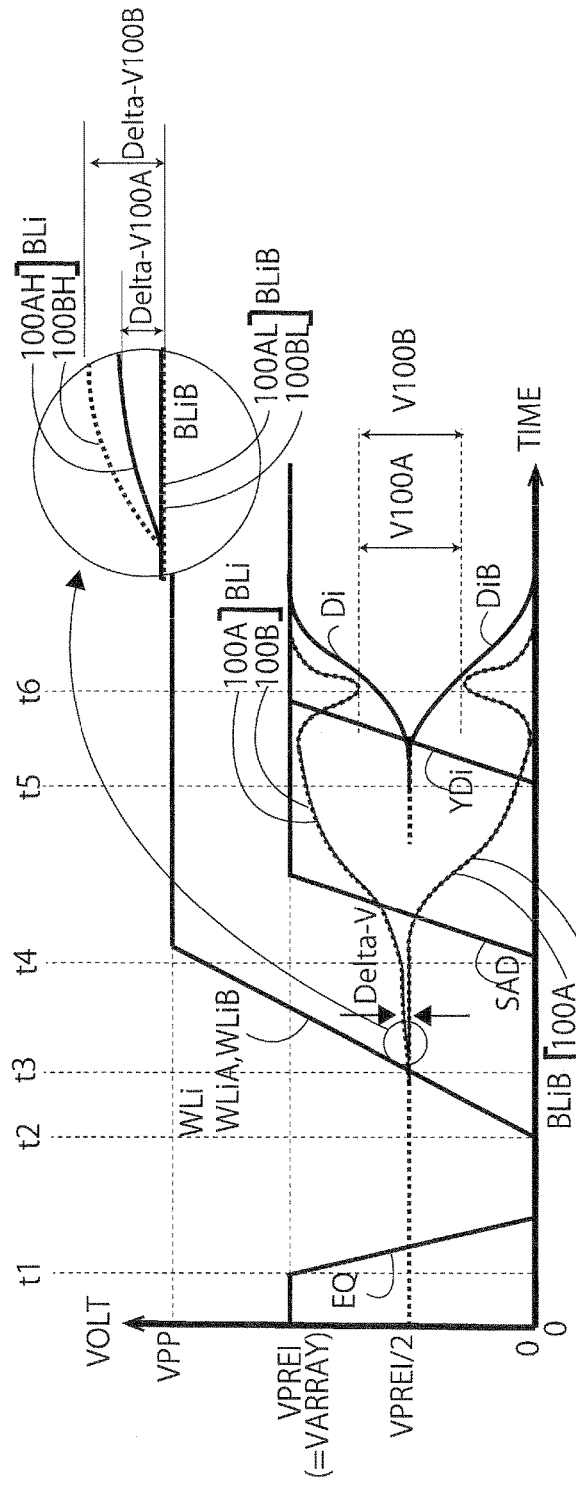
FIG. 5B PRIOR ART
FIG. 5C PRIOR ART

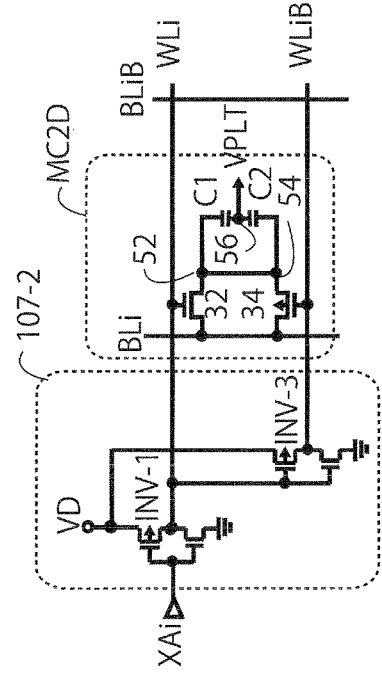
FIG. 6A PRIOR ART
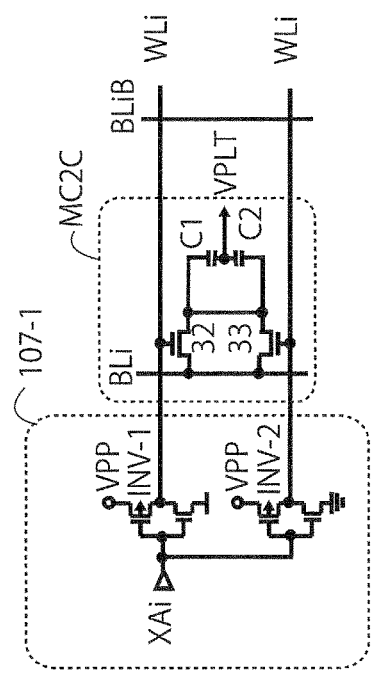
FIG. 6C PRIOR ART
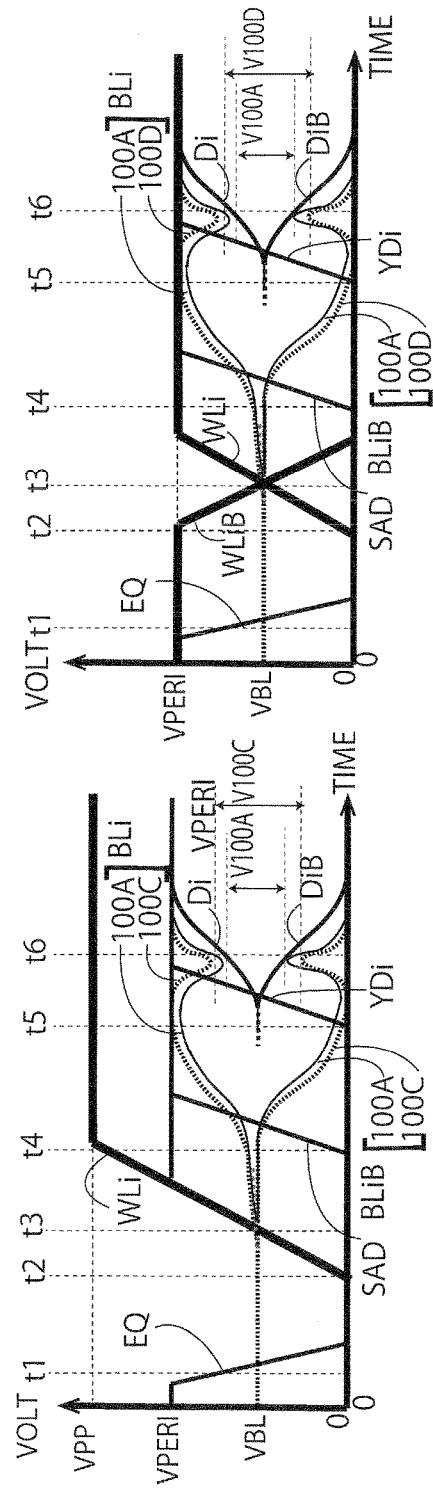
FIG. 6B PRIOR ART
FIG. 6D PRIOR ART

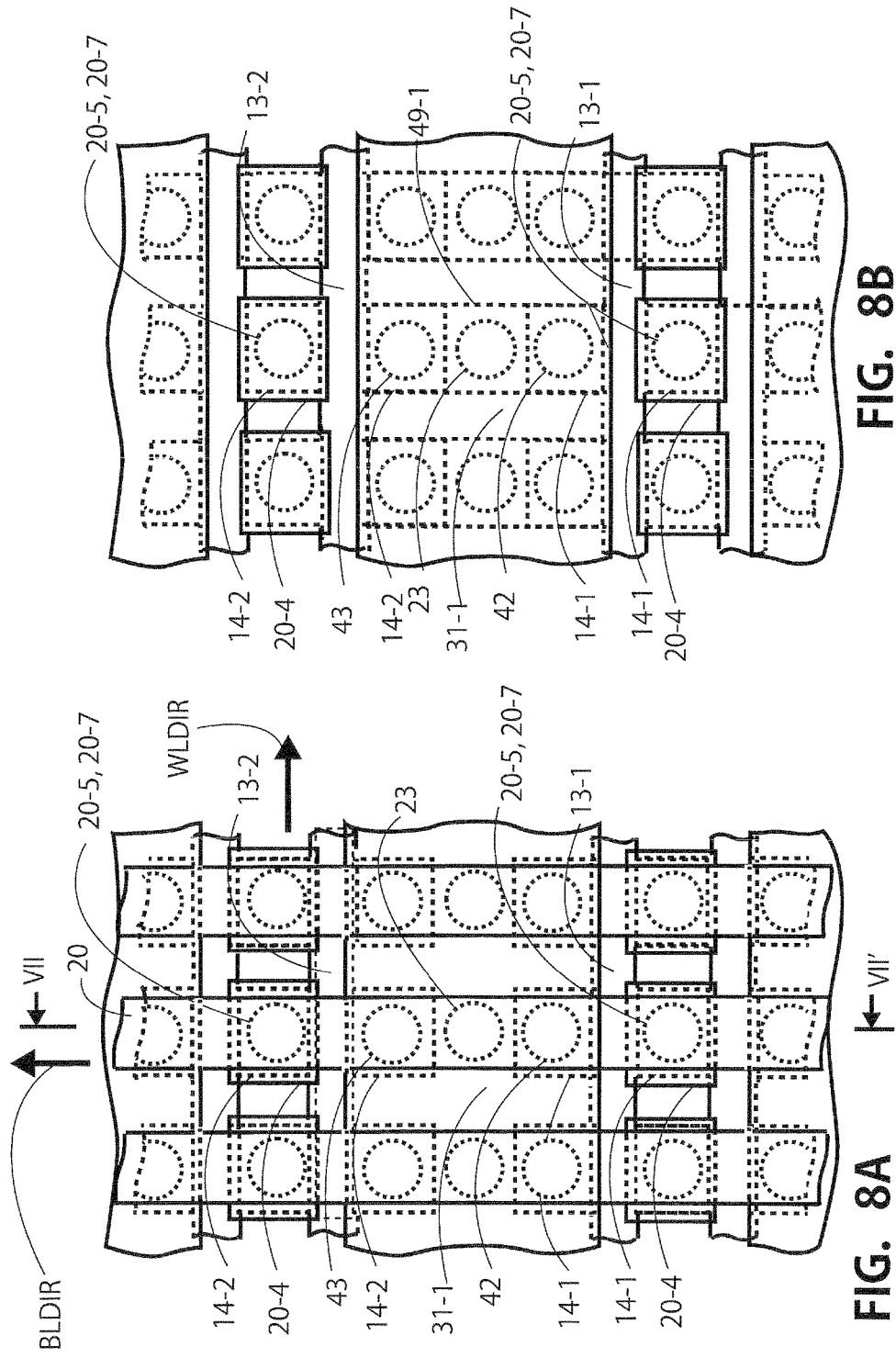

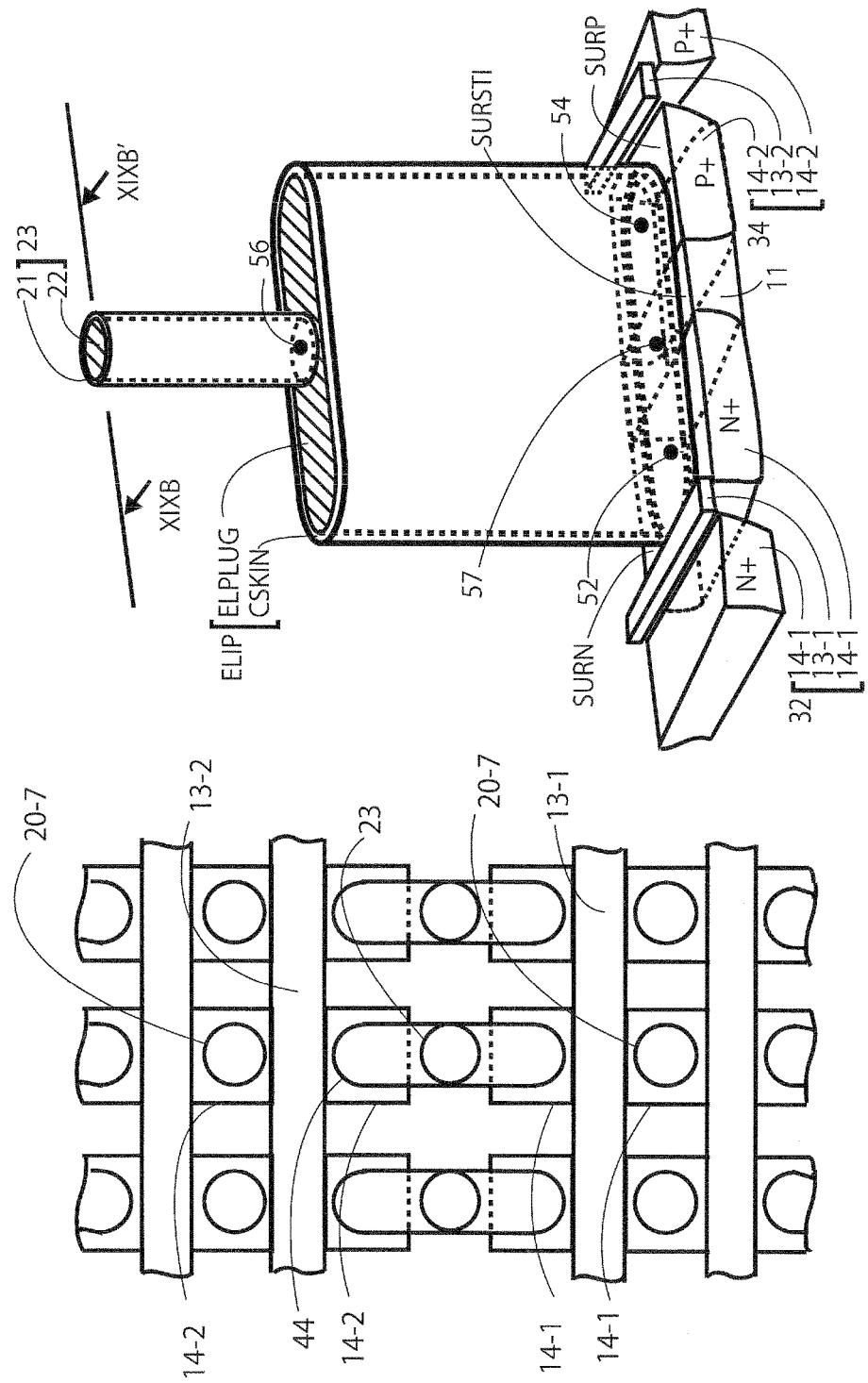

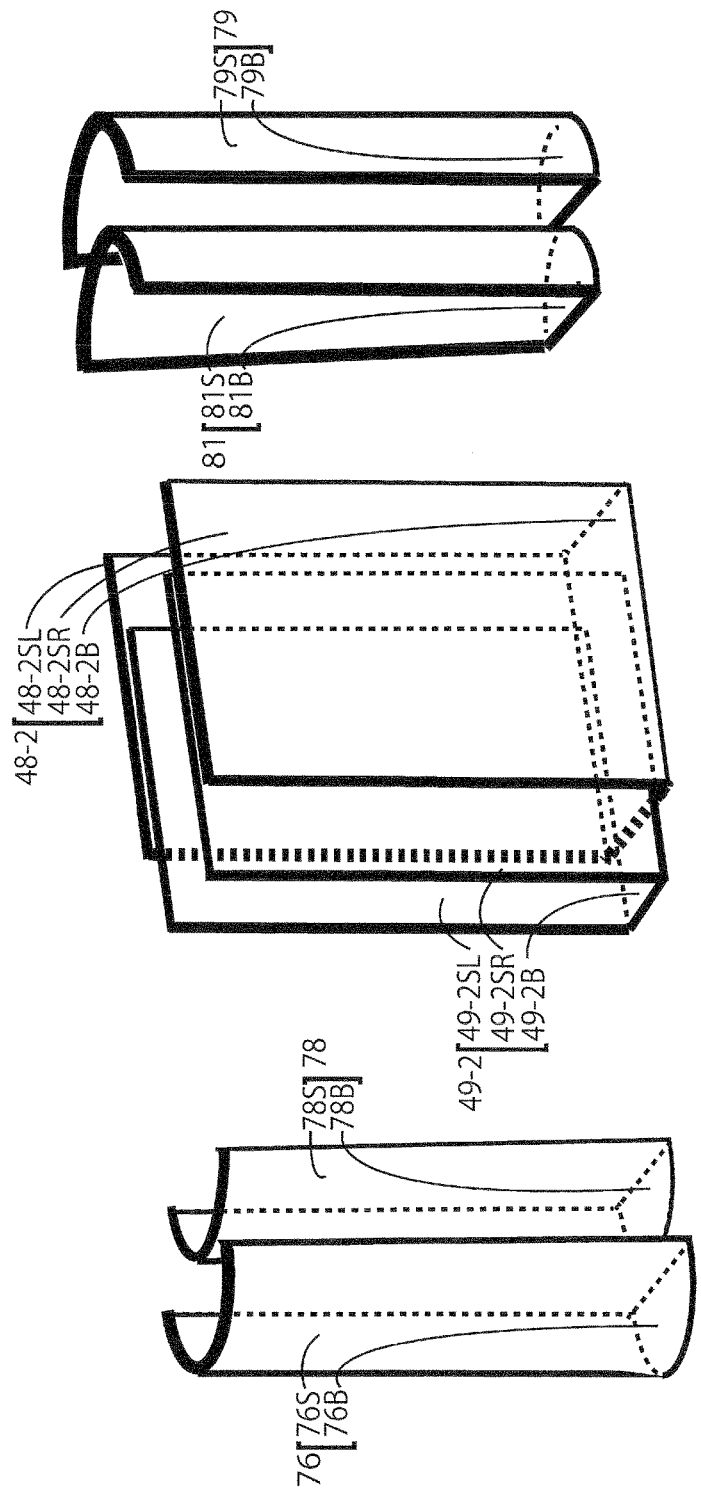

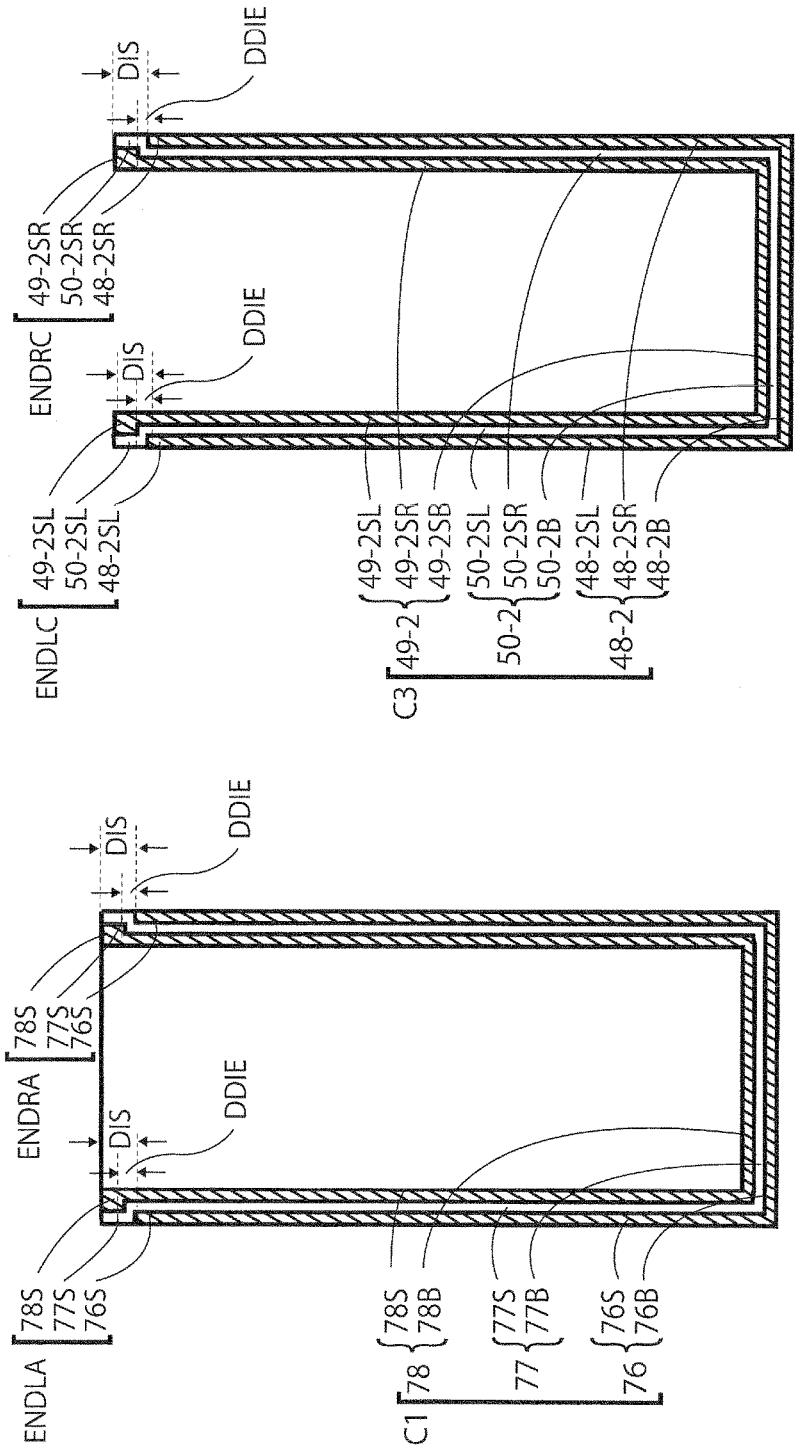

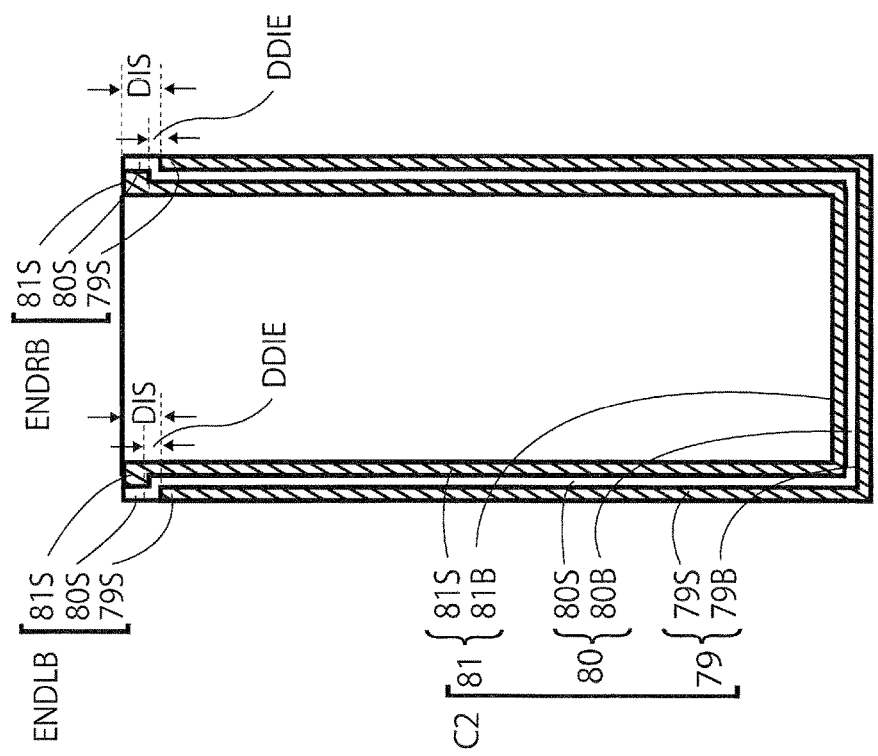

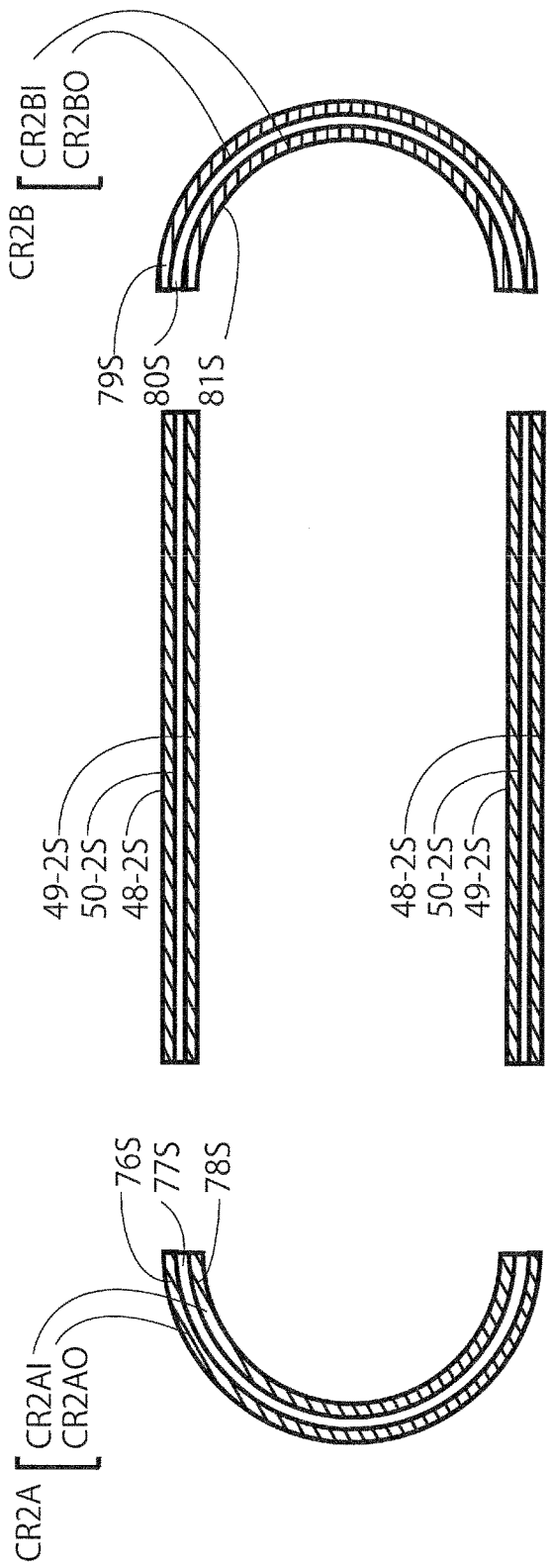

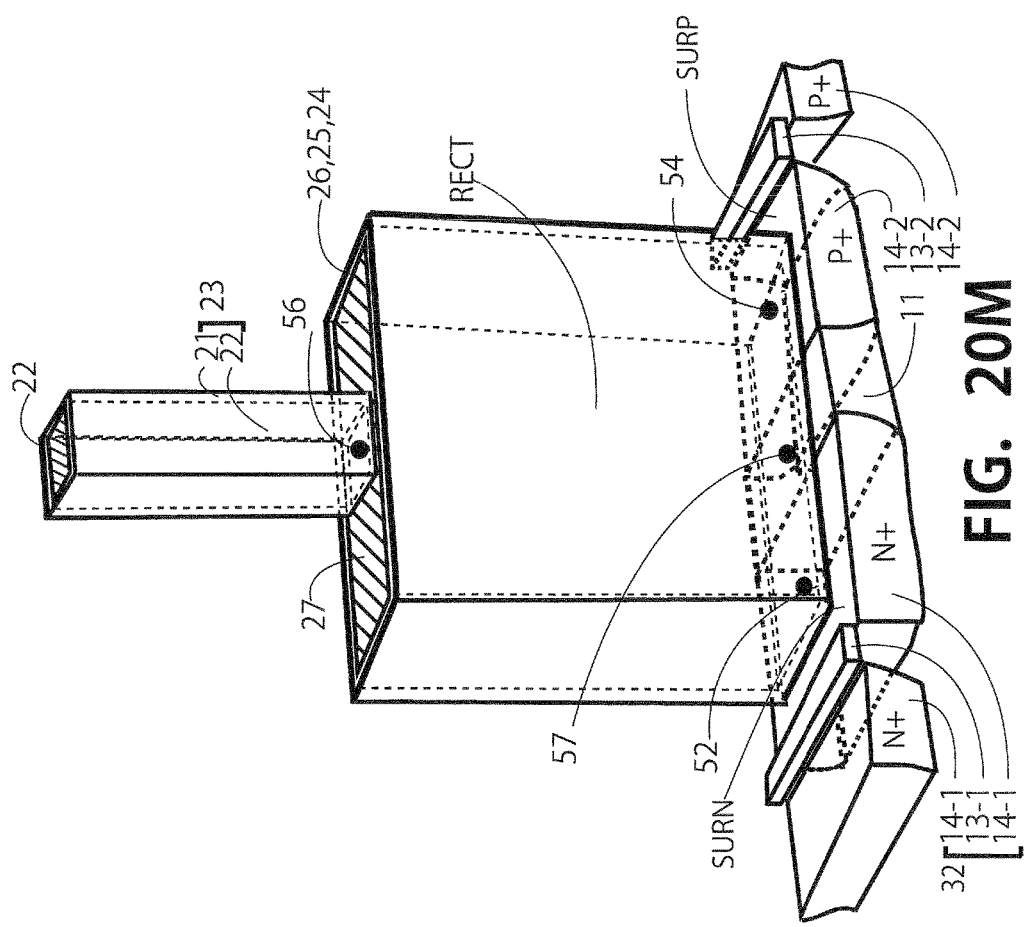

SEMICONDUCTOR MEMORY DEVICE PROVIDED WITH DRAM CELL INCLUDING TWO TRANSISTORS AND COMMON CAPACITOR

BACKGROUND OF THE INVENTION

Field of the Invention

The present invention relates to a semiconductor memory device such as a dynamic random-access memory (DRAM) memory, and in particular, relates to a new structure of capacitors of DRAM cells, each DRAM cell including an N-type transistor, a P-type transistor, and a common capacitor.

Description of Related Art

In DRAMs, information data is stored by accumulating electric charges in a capacitor via memory-cell transistor. The area occupied by the DRAM memory cells decreases as process technology scales down.

Semiconductor process scaling and network technology advances have been generating new mobile device markets such as mobile phones, tablet PCs and IOT applications.

FIG. 3 shows a block diagram of a typical mobile device 200, which includes a host circuit 201, a CPU 202, a DRAM 203, a flash memory 204, a communication device 205, a camera and sensor interface 206, a graphics controller 207, a serial data transfer interface 208, an I/O interface 209, an analog/digital device and interface 210, a signal processor 211 and an inner CPU bus 212. The mobile device 200 further includes an LCD driver IC 213 including a serial data transfer interface 214, a simple graphics controller 216, a frame buffer 217, an X-driver output 221 and a Y-driver output 223; an LCD panel device 220 including an LCD screen 225, a X-driver 224 and a Y-driver 222; a high voltage generator 218; and a battery 226.

The mobile device 200 receives several kinds of data by equipped interfaces as shown in FIG. 3. For example, a huge amount of compressed data such as high-resolution motion picture is transferred to the mobile device 200 from a cloud environment and processed in the communication device 205 to be viewed by the LCD screen 225. The compressed data is decoded by using the CPU 202 and by the signal processor 211, and then, is modified by the graphics controller 207 by using memories, such as the DRAM 203 or the flash memory 204. Thereafter, the data are sent from the host circuit 201 to the LCD driver IC 213 through the serial interfaces 208 and 214 of both sides. The data sent to the LCD driver IC 213 is temporarily stored in the frame buffer 217, and finally the data are viewed on the LCD screen 225.

When a motion picture is displayed, the host circuit 201, mainly the graphics controller 207, the DRAM 203, the signal processor 211 and the serial data transfer interface 208 are made in active state without interruption. These uninterrupted circuit operations consume large electric power stored in the battery 226 which is generally only a power source of the mobile device 200.

In order to reduce the power consumption of the battery 226, especially when a still picture is displayed, the simple graphics controller 216 and the frame buffer 217 are used. The frame buffer 217 generally includes an embedded SRAM, and a SRAM cell thereof generally includes six transistors widely known to those in the art, where this kind of SRAM cell having six transistors is called "6T-SRAM".

When a still picture is displayed, data of one picture are stored in the frame-buffer 217 which is controlled by the simple graphics controller 216. Because the same frame picture stored in the frame buffer 217 is refreshed by the LCD driver IC 213, the host circuit 201 can be in a stand-by mode for power saving. This makes the mobile battery 226 power consumption significantly lower. Because of this power reduction, the frame buffer 217 is regarded as an indispensable device for mobile devices 200.

As required pixel processing speed for mobile devices 200 has become much faster by the increased LCD screen resolution, the increase of the power consumption of mobile devices has become evident. To this date, power reduction technology of the mobile device has not yet fully caught-up with power reduction requirements.

Requirements for IC chips in the mobile device 200, such as the CPU 202, the graphics controllers, 207 and 216 and the memories 203, 204 and 217, sometimes conflict with each other. For an example, the requirements for the mobile devices on random access memories are "compact chip size", "higher band-width", "larger data storage", "lower cost" and "lower power consumption". In particular, the requirements such as "larger memory storage size and lower cost" and "higher band-width and lower power" conflict with one another. In order to overcome the problems of the conflicting requirements, choosing "system on chip solution with embedded SRAM" and "using smaller process node" have been reasonable solutions.

In some new market as mobile applications which require more memory size, embedded DRAM logic process has been reviewed again, because of the reason that its relatively high process cost can be offset by chip area savings.

As described above, the widely used embedded SRAM uses six-transistor cells. On the other hand, the embedded DRAM cell uses only one capacitor and one transistor cells as shown in FIG. 2B, since a DRAM cell capacitor is fabricated over a transistor, roughly, DRAM cell size is ⅕ to ⅙ of that of 6T-SRAM cell. The area advantage of DRAM embedded process is evident than that of SRAM embedded process. Further, FIG. 2C shows an equivalent circuit of another conventional DRAM cell including two transistors and one capacitor.

However, in a DRAM embedded logic process, for having a cell capacitor enough to guarantee DRAM functionalities, additional unique process steps are required. This is a cost increase factor of the embedded DRAM logic process.

In order to overcome this disadvantage, some ideas to form DRAM cells without using special process steps have been proposed, but large-enough DRAM capacitor with reasonable area has been difficult to achieve. Because of the scaling of the embedded DRAM logic process, there are two problems when used in "high speed and low power mobile devices as 200 shown in FIG. 3". One problem is the voltage drop across the transfer transistor, due to both threshold and on-resistance, which can reduce storage level and memory access speed. Another problem is a smaller capacitance of the shrunk capacitor, which requires frequent refresh, and which can lead to larger stand-by power consumption.

In order to solve these two problems on the embedded DRAM logic process, several new ideas by US patents, which use a DRAM cell having two transistors, have been proposed.

U.S. Pat. No. 7,505,299B2 by Riichiro TAKEMURA shows a new idea to make use of a dual-port DRAM cell by activating two word-lines at the same timing, and equivalently, halves the transistor's on-resistance. This helps to improve the access speed. U.S. Pat. No. 7,488,664B2 by Keith Cook shows a new idea to connect two DRAM cell capacitors for a dual-port DRAM cell. U.S. Pat. No. 8,890, 227B1 by Wenliang Chen shows a similar two-transistor structure with that of U.S. Pat. No. 7,505,299B2.

A difference is that U.S. Pat. No. 8,890,227B1 uses an N-type transistor and a P-type transistor for a two-transistor cell. The DRAM cell of U.S. Pat. No. 8,890,227B1 also uses two capacitors, which can make the capacitor size double. The use of P-type transistor can eliminate boost voltage VPP, which is used for word-line drive in widely used conventional DRAMs, and this means stand-by current for VPP pumping is eliminated.

Next, a functionality of a conventional DRAM 0 is explained by using a block diagram of a conventional DRAM 0, which includes plural number of one-transistor DRAM cell 100-1 shown in FIG. 1. FIG. 2A shows a simplified memory array 8A of conventional one-transistor and one capacitor DRAM cell and control blocks thereof. For this explanation, the simplified memory array 8A has a 4×5 structure, namely, four rows by five columns, memory cells. FIG. 2B shows an equivalent circuit of a conventional one-transistor and one capacitor DRAM cell 100-1.

The conventional DRAM 0 includes a memory array 8A including a plurality of column units 108A. The column unit 108 includes a pair of bit-lines 116, a BLy or a BLyB (y=i, j, k, l or m), and a plurality of DRAM cell units MC 100-1. The DRAM cell unit MC 100-1 includes an N-type transistor 32, and the N-type transistor 32 includes a gate being 13-1 connected to a world-line WLx (x=i, j, k or l), a first source/drain 14-1 including a cell-node 52 and being connected to a capacitor 35, a second source/drain 14-1 including a cell-plate-node 56 which is connected to a bit-line BLy (y=i, j, k, l or m). The DRAM cell unit MC 100-1 further includes a capacitor 35 including two electrode plates; a first plate being connected to the cell-node 52, a second plate connected to a cell plate at a node 56; the cell-plate node 56 connected to a plate potential VPLT which is generated by a VPLT generator 2-7.

The conventional DRAM 0 further includes a row decoder 3, including a plurality of row decoder units XDCs 107, which selecting a word-line WLx (x=i, j, k or l) among a plurality of word lines according to an internal ROW address XAx. The internal Row address XAx is generated by an address buffer 2-4A, and a boosted level potential VPP, which is generated by VPP generator 2-2, is supplied to the Row decoder 3 for driving a selected word-line WLx to the boosted voltage level VPP.

The conventional DRAM 0 further includes a column decoder 5 including a plurality of column decoder units YDCs 118 which is provided for selecting a column switch unit YSW among from column switches 115 by a Column switch signal YDy (y=i, j, k, l or m) according to the internal column address YAy (y=i, j, k, l or m) which is generated by the address buffer 2-4A. The selected column-switch YSW connects a bit-line pair, Bly and BLyB, to a relevant data-bus pair DBy, DBiB (y=i, j, k, l or m), respectively.

The conventional DRAM 0 further includes a BL equalize circuit 111 including a plurality of bit-line equalize units BLEs 102 which is provided for equalizing the voltage levels of a connected bit line pair, BLy and BLyB (y=i, j, k, l and m), in a DRAM's reset cycle by an inputted bit-line equalize signal EQ at a reset timing. The bit-line equalize signal EQ charges the voltage level of the bit-line pairs to a bit-line precharged voltage level VBL. In this case, generally, the VBL equals to half of a peripheral circuit source voltage VPERI. The voltage VBL is generated by a BL voltage generator 2-6.

The conventional DRAM 0 further includes a sense amps and I/O control circuit 7. In the circuit 7, a sense amplifier circuit 114 including a plurality of sense amplifier units, each of which is connected to a common pull up node VSP and a pull-down node VSN. Data bus amplifiers 109 includes a plurality of amplifier units AMP, each of which connected to corresponding data bus pairs DBy, DBiB (y=i, j, k, l or m). A sense amplifier driver 113 includes a sense amplifier pull-up transistor 119, a sense amplifier pull-down transistor 120 and an inverter 113, which is driven by a sense amplifier drive signal SAD generated by a "Input buffers and memory control signal generator" 2-7. A sense amplifier reset circuit SRS 106 is provided for initializing sense amplifier nodes VSP and VSN to a supplied VPLT voltage level.

The conventional DRAM 0 further includes a self-refresh control circuit 9 for controlling the refresh functions of the conventional DRAM 0 by generating a refresh Row address ARX in refresh cycles.

The conventional DRAM 0 further includes a memory control circuit 2, which generates DRAM control signals and several internal voltages by using supplied external source voltage VDD. The memory control circuit 2 includes an address buffer 2-4A, and a control signal input buffers and DRAM control signal generator 2-4B including input buffer units and DRAM control signals generator (not shown in FIG. 1), where the control signals include external DRAM control signals such as external address ADD, memory clock CLK, Read/Write control signals R/W and so on are inputted to the memory control circuit 2 from a CPU 1. The memory control circuit 2 further includes a cell plate voltage VPLT generator 2-7, a peripheral voltage VPERI generator 2-1, a boost voltage VPP generator 2-2, an Array voltage generator 2-3, and a bit-line voltage generator 2-6.

A source voltage for peripheral circuit blocks in the Memory control 2 is a VPERI, which is generated by a VPERI generator 2-1 in the memory control 2. The VPERI is used almost all the memory control blocks as shown in FIG. 1.

FIG. 4 shows a memory array 8B including a plurality of DRAM cells MC2 and control blocks thereof, and the DRAM cell MC2 includes two transistors as proposed in the prior art provided by as U.S. Pat. No. 7,505,299 B2 and U.S. Pat. No. 8,890,227B1. Hereafter, a DRAM cell including two transistors is referred to as a "two-transistor DRAM cell".

Since a basic structure of the MC 2 is originally a dual-port DRAM cell including two transistors and a common capacitor, which can be accessed from either of the two transistors as conventional one-transistor DRAM cell, the memory array 8A, including one-transistor DRAM cells, and the memory array 8B, including two-transistor DRAM cells, are controlled almost same circuit blocks as shown in FIG. 2A and FIG. 4. Only difference is that the two-transistor DRAM cells are driven by two word-lines and the one-transistor DRAM cell is driven by one word-line. So, the two-transistor cell DRAM's control can be done by using the circuit blocks shown in FIG. 1.

Next, improvements of the two-transistor DRAM cells, proposed by prior art, to the conventional one transistor DRAM cell by the DRAM's functional margin, are explained.

Compared prior art DRAM cells are identified and grouped into the following:
(1) A case-100A: A conventional one-transistor and one capacitor DRAM cell;

(2) A case-100B: A two-transistor DRAM cell including two N-type transistors and a capacitor being proposed by U.S. Pat. No. 7,505,299 B2;

(3) A case-100C: A two-transistor DRAM cell including two N-type transistors and two capacitors by a process technique proposed by U.S. Pat. No. 7,488,664B2; and (4) A case-100D: A two-transistor DRAM cell changing one of the two N-type transistors in the case-100C to a P-type transistor proposed by U.S. Pat. No. 8,890,227B1.

FIG. 5A shows a simple equivalent circuit to drive a conventional one-transistor and a one-transistor DRAM cell MCA. The equivalent circuit includes the MCA, an N-type transistor 32 and a capacitor C1, and word-line drive inverter INV-1, assuming a memory cell MCA is accessed by a word-line WLi selected by an internal Row address XAi. Hereafter, this circuit case is defined as a "case-100A".

FIG. 5B shows a simple equivalent circuit comprises a two-transistor DRAM cell MC2A, including two N-type transistors 32 and 33, and a capacitor C1, and word-line drives 107-1 including inverters INV-1 and INV-2. Word-lines WLiA and WLiB are activated simultaneously by a same Row address XAi as shown in FIG. 5B as proposed by U.S. Pat. No. 7,505,299 B2. Hereafter, this circuit case is defined as "case-100B".

FIG. 5C shows DRAM cells' functional margin difference between the case-100A and the case-100B by comparing waveforms of a bit line pair BLi and BLiB. For clarifying an expected margin difference by the waveforms of the bit line pair, BLi and BLiB, the wave forms, just after a rising time of the word-line WLi, WLiA and WLiB, are shown magnified in a circle shown in FIG. 5C.

Next, prior art DRAM functional margin differences between a one-transistor DRAM cell in case-100A and a two-transistor DRAM cell in case-B are explained by using voltage difference, Delta-V, of a pair of bit lines, BLi and BLiB, showing waveforms at the following timings t1 to t6. In this case, a positive charge, which is equivalent to a digital data "1", is stored in the cell capacitor C1, and the N-type transistor/transistors 32, 33, is/are connected to a bit-line BLi. As for DRAM control signals in FIG. 5C, see FIG. 1 and FIG. 2A.

At the timing t1, a bit-line equalize signal EQ, which equalized and pre-charged the bit-line pair BLi and BLiB, before t1, to a bit line reset voltage VBL level, goes low.

At the timing t2, the word-line WLi is selected by an internal Row address XAi. The word-line voltage level goes from zero volt to boosted VPP level with some delay time.

At the timing t3, when the voltage level of the word-line WLi exceeds the threshold voltage Vtn of the N-type transistors, 32 and 33, the N-type transistor/transistors turns/turn on, and then, the charge stored in the memory cell C1 is transferred to the connected bit-line BLi.

Because the charge stored in C1 had a polarity of plus, the voltage level of the connected bit line BLi gradually goes to slightly higher level than that of the bit-line equalized voltage level VBL from the timing t3 until to the timing t4.

"Delta-V" shown in FIG. 5C is a voltage difference between BLi and BLiB, which is generally regarded as an indicator of the DRAM's sensing margin by those skilled in the art. Because the opposite bit-line BLiB of the complementary bit line remains at the bit-line equalize voltage level VBL, a voltage difference Delta-V gradually widens. Since a spreading speed of Delta-V is proportional to the on-conductance of the transistor of the DRAM cell, as shown in the circle of FIG. 6C, the spreading speed of the voltage difference between the bit line pair wave-forms, 100 BH and 100 BL, of case-100B, is faster than that of the voltage difference in the case-100A of the waveforms 100AH and 100AL of the bit-line pair.

In the case-100B, because two word-lines WLA and WLiB, are simultaneously activated and two-transistors are used for transferring a charge stored in the capacitor C1 to the bit-line BLi, the on-resistance of the case-100B is half compared with that of the case-100A. The halved on-resistance will speed up the transfer of the charge from the capacitor C1 to the bit-line BLi At the timing t4, a sense-amp activation signal SAD, shown in FIG. 2A, goes high and sense-amps 114 are activated. The "Delta-V" developed by the charge transferred from capacitor C1 to the bit-line pair, BLi and BLiB at the timing t3, is amplified by a sense-amp 103 the latter being connected to the corresponding bit-line pair.

The functional margin of the sense amplifier is related to the delta-V at the timing t4 as known by those in the art. As shown in FIG. 5C, the case-100B has the ability to make the DRAM access faster than the case-100A because charge transfer from capacitor C1 to bit-line BLi in the case-100B is much faster than that of case-100A. This is one of the merits being proposed by U.S. Pat. No. 7,505,299B2.

At the timing t5, the column switch signal YDi goes high and turns-on a relevant column switch unit YSW. Before the timing t5, a data bus pair 121 DBi and DBiB, which is supposed to be connected to the bit-line pair 116, BLi and BLiB, is equalized and pre-charged to a peripheral source voltage level VPERI. The data on the bit-line pair 116, BLi and BLiB, starts to be sent to a corresponding data bus pair 121 Di and DiB through the column switch unit YSW.

At the timing t6, just after the moment when the selected column switch YSW is on, Delta-V which is widened before the timing t5 will show a sudden narrowing, looks like a "bottleneck", in a short period to a minimum value by a charge flow from the data-bus pair 121 to the bit-line pair 116. The narrowest Delta-V value can be an indicator of the bit line of the DRAM to data-bus data transfer margin.

In this case, the minimum Delta-V value at around the timing t6 is defined as "V100A" in the case-100A and "V100B" in the case-100B. As shown in FIG. 5B, when the capacitor size is same as the case-100A and the case-100B, a V100A and a V100B is same. This means that use of the two transistors can make sensing margin higher, however, the bit-line pair to data-bus pair data-transfer margin will not be improved without increasing the capacitor size.

FIG. 6A shows a simple equivalent circuit comprises a two-transistors DRAM cell MC2C including two N-type transistors, 32 and 33, and two capacitors, C1 and C2, and word-line drives INV-1 and INV-2. A basic idea thereof is proposed by prior art as U.S. Pat. No. 7,505,299 B2 but the capacitor is replaced to connected-two-capacitor idea according to U.S. Pat. No. 7,488,664B2. Hereafter, this circuit case is defined as "case-100C".

FIG. 6B shows a functional margin difference of the DRAM cells between the case-100A and the case-100C as explained by using FIG. 5C. In the case-100C, because the capacitor size is doubled, bit-line to data-bus transfer margin is further improved.

The maximum voltage level of the word-line WLi in the case-100A, case-100B and case-100C is a boosted level VPP, which is generated by a VPP voltage pumping circuit 2-2A in the VPP generator 2-2. To be prepared for an unexpected DRAM access and asynchronously occurred self-refresh cycles, the VPP voltage pumping circuit 2-2A has to be kept running even in a stand-by period.

For DRAMs which use conventional one-transistor DRAM cell, the VPP pumping in stand-by period is one of the main components of conventional stand-by power consumption, which leads to deterioration of battery 226 life.

When it comes to the case-100B and case-100C, because two-transistor DRAM cells require to activate two word-line WLiA and WLiB at the same timings for one bit DRAM access, the two-transistor DRAM need to drive double number of word-lines. This means that loading of the VPP generator is doubled compared with that of one-transistor DRAM cells.

By the doubled VPP loading, a VPP leakage current is expected to be also doubled, which requires much stronger VPP pumping to the VPP voltage pumping circuit 2-2A. The stronger VPP pumping will increase DRAM stand-by power. This stand-by power consumption increase is an evident short coming of the prior arts, case-100B and case-100C. Keeping the merits of the case-100C, the idea proposed by U.S. Pat. No. 8,890,227B1, eliminates or lowers the stand-by power consumed in the VPP generator 2-1.

FIG. 6C shows a simple equivalent circuit including a two-transistors DRAM cell MC2C, which includes two different type two-transistors, 32 and 34, and capacitors C1 and C2, and word-line drives 107-2 including INV-1 and INV-2; the idea thereof is proposed by U.S. Pat. No. 8,890,227B1. Hereafter, this circuit case is defined as "case-100D".

FIG. 6D shows a functional margin difference of the DRAM cells between the case-100A and the case-100D as explained in FIG. 5C. In the case-100D, because the capacitor size is doubled same as case-100C, the bit-line to data-bus transfer margin is improved as compared with the case-100A. The case-100D's evident difference with case-100C is that an N-type transistor 33 in the case-100C is changed to a P-type transistor 34 and a word-line drivers 107-2, including an inverter INV-1 and an inverter INV-3, they do not use boosted voltage VPP, and the INV-1 and the INV-2 are serially connected to generate different polarity word-lines, WLi and WLiB, in order to drive the N-type transistor 32 and P-type transistor 34 at a same timing. The evident characteristic of case-100D, using N-type transistor and P-type transistor in two-transistor DRAM cell as proposed by U.S. Pat. No. 8,890,227B1, is not to use boosted level VPP for word-line drives. Not to mention, as far as the two-transistor DRAM cells, MC2C and MC2D, are fabricated by using conventional DRAM process, doubled capacitor size is effective for enhancing DRAM functional margin as show in FIG. 6B and FIG. 6D.

Next, a disadvantage of the above explained prior arts are explained.

In the DRAMs, it is believed that a DRAM cell capacitor needs to have around 15-fF capacitance for keeping stable functionality by those skilled in the art. By using the two-transistor cells, MCF or MC2D, enough capacity can be expected as far as standard DRAM process is used. However, even using the two-transistor DRAM cells using two DRAM cell capacitors, MC2C or MC2D, as for an embedded DRAM memory macro based on cheaper general logic process, enough DRAM cell capacitance cannot be obtained. This is the disadvantage of the prior arts mentioned above.

SUMMARY OF THE INVENTION

The objective of the present invention is to provide a semiconductor memory device including new DRAM cells, capable of improving the disadvantages of the prior arts based on the two-transistor DRAM cells to be fabricated by using expensive DRAM process.

According to a first aspect of the present invention, a semiconductor device is provided which includes a memory array (8B) including a plurality of DRAM cells (MC2), two synchronously operated complementary word-lines (WLi, WLiB), and a bit-line (20) including a layer which is a first metal (20). Each of DRAM cell (MC2) is selected among from the plurality of DRAM cells by a row address (XAx), and a column address (YAy) which is generated by an address buffer (2-4A). The two synchronously operated complementary word-lines (WLi, WLiB) include a high-active word-line (WLi), and a low-active word-line (WLiB).

Each of the DRAM cells (MC2) includes an N-type transistor (32) including a gate (13-1), a first source/drain region (14-1), and a second source/drain region (14-1); a P-type transistor (34) including a gate (13-2), a first source/drain region (14-2), and second source/drain region (14-2); and a common capacitor (CCOM).

The gate (13-1) of the N-type transistor (32) is connected to the high-active word-line (WLi), the first source/drain region (14-1) of the N-type transistor (32) is connected to the common capacitor (CCOM) directly, and the second source/drain region (14-1) of the N-type transistor (32) is connected to the bit-line (20) via a cell contact (20-1, 20-3 or 20-5, 20-7). The gate (13-2) of the P-type transistor (34) is connected to the low-active word-line (WLiB), the first source/drain region (14-2) of the P-type transistor (34) is connected to a common capacitor (CCOM) directly, and the second source/drain region of the P-type transistor (34) is connected to the bit-line (20).

The plurality of DRAM cells (MC2) is aligned in a bit-line direction (BLDIR) of the bit-line (20) so that the common capacitor (CCOM) is arranged at substantially a center of each of the DRAM cell (MC2). The common capacitor (CCOM) includes a first capacitor element (C1); a second capacitor element (C2); and a third capacitor element (C3).

The first capacitor element (C1) includes an outer metal cylinder (70), an inner metal cylinder (72), and a dielectric layer (71). The outer metal cylinder (70) of the first capacitor element (C1) includes a sidewall metal layer (70S) and a bottom metal layer (70B), the inner metal cylinder (72) of the first capacitor element (C1) includes a side-wall metal surface (72S) and a bottom metal layer (72B), the dielectric layer (71) of the first capacitor element (C1) includes a side-wall dielectric layer (71S) and a bottom dielectric layer (71B), and the bottom metal layer (70B) of the outer metal cylinder (70) is connected to a surface (SURN) of the first source/drain region (14-1) of the N-type transistor (32).

The second capacitor element (C2) includes an outer metal cylinder (73), inner metal cylinder (75), and a dielectric layer (74). The outer metal cylinder (73) of the second capacitor element (C2) includes a sidewall metal layer (73S) and a bottom metal layer (73B), the inner metal cylinder (75) includes a side-wall metal surface (75S) and a bottom metal layer (72B), the dielectric layer (74) of the second capacitor element (C2) includes a side-wall dielectric layer (74S) and a bottom dielectric layer (74B), and the bottom metal layer (73B) of the outer metal cylinder (73) is connected to a surface (SURP) of the first source/drain region (14-2) of the P-type transistor (34).

The third capacitor element (C3) includes a bottom metal electrode plate (48-1), a top metal electrode plate (49-1), and a dielectric layer (50-1). The bottom metal electrode plate (48-1) of the third capacitor element (C3) is connected to the sidewall metal layer (70S) of the outer metal cylinder (70)

of the first capacitor element C1, and the sidewall metal layer (73S) of the outer metal cylinder (73) of the second capacitor element C2. The top metal electrode plate (49-1) of the third capacitor element (C3) is connected to the sidewall metal layer (72S) of the inner metal cylinder (72) of the first capacitor element C1, and the sidewall metal layer (75S) of the inner metal cylinder (75) of the second capacitor element (C2).

The dielectric layer (50-1) of the third capacitor element (C3) is connected to the side-wall dielectric layer (71S) of the dielectric layer (71) of the first capacitor element (C1), and the side-wall dielectric layer (74S) of the dielectric layer (74) of the second capacitor element (C2).

According to a second aspect of the present invention, there is provided a semiconductor memory device including a memory array (8B), which includes a plurality of DRAM cells (MC2), two synchronously operated complemental word-lines (WLi, WLiB), and a bit-line (20) including a first metal layer. Each of the DRAM cells (MC2) is selected among from the plurality of DRAM cells by a row address (XAx) and a column address (YAy) which is generated by an address buffer (2-4A), and the two synchronously operated complemental word-lines (WLi, WLiB) includes a high-active word-line (WLi) and a low-active word-line (WLiB).

Each of the DRAM cells (MC2) includes an N-type transistor (32) including a gate (13-1), a first source/drain region (14-1) and a second source/drain region (14-1); a P-type transistor (34) including a gate (13-2), a first source/drain region (14-2) and a second source/drain region (14-2); and a common capacitor (CCOM).

The gate (13-1) of the N-type transistor (32) is connected to the high-active word-line (WLi), the first source/drain region (14-1) of the N-type transistor (32) is connected to the bottom electrode of the common capacitor (CCOM); the second source/drain region (14-1) of the N-type transistor (32) is connected to the bit-line (20) via a cell contact (20-1, 20-3 or 20-5, 20-7).

The gate (13-2) of the P-type transistor (34) is connected to the low-active word-line (WLiB), and the first source/drain region (14-2) of the P-type transistor (34) is connected to the bottom electrode of the common capacitor (CCOM); the second source/drain region of the P-type transistor (34) is connected to the bit-line (20).

The plurality of DRAM cells (MC2) is aligned in a bit-line direction (BLDIR) of the bit-line (20) so that the common capacitor (CCOM) is arranged at substantially a center of each of the DRAM cells (MC2).
The top electrode of the common capacitor CCOM is connected to the storage plate supply (VPLT) via the first available interconnect metal which runs in the word-line direction (WLDIR).

BRIEF DESCRIPTION OF THE DRAWINGS

FIG. 5A is a circuit diagram showing a simplified equivalent circuit including a word-line driver and a conventional one-transistor DRAM cell.

FIG. 5B is a circuit diagram showing a simplified equivalent circuit including word-line drivers and a common capacitor in a two-transistor DRAM cell, which is a first prior art two-transistor DRAM cell.

FIG. 5C is a graph showing waveforms of a read function of the DRAM for explaining a functional margin difference between the conventional one-transistor DRAM cell and the first prior art two-transistor DRAM cell shown in FIG. 5B.

FIG. 6A is a circuit diagram showing a simplified equivalent circuit including word-line drivers and a common capacitor including two capacitors in a two-transistor DRAM cell, which is a second prior art two-transistor DRAM cell.

FIG. 6B is a graph showing waveforms of a read function of the DRAM for explaining a functional margin difference between the conventional one-transistor DRAM cell and the second prior art two-transistor DRAM cell shown in FIG. 6A.

FIG. 6C is circuit diagram showing a simplified equivalent circuit including word-line drivers and a third two-transistor DRAM cell of the prior art, which includes an N-type transistor and a P-type transistor and two capacitors.

FIG. 6D is a graph showing waveforms of a read function of the DRAM for explaining a functional margin difference between the conventional one-transistor DRAM cell and the third prior art two-transistor DRAM cell shown in FIG. 6C.

FIG. 8A is a top view showing one example of a first memory cell layout configuration in a DRAM cell according to the first embodiment of the invention.

FIG. 8B is a top view showing a second memory cell layout configuration, in which a first metal layer 20 and contacts 20-5 penetrating a third insulating layer 18-3 shown in FIG. 8A are removed.

FIG. 18C is a top view showing the memory cell layout configuration in which second metal layers 31-1 and via metal contacts 23 shown in FIG. 18B are removed.

FIG. 19A is a perspective view showing the second embodiment of the invention.

FIG. 20A is a perspective view of a first capacitor element C1 of the common capacitor of the second embodiment of the invention.

FIG. 20B is a perspective view of a third capacitor element C3 of the common capacitor of second embodiment of the invention.

FIG. 20C is a perspective view of a second capacitor element C2 of the common capacitor of the second embodiment of the invention.

FIG. 20D is a cross sectional view of the first capacitor element C1 of the second embodiment of the invention, taken on a line XXD-XXD' of FIG. 20.

FIG. 20E is a cross sectional view of the second capacitor element C2 of the second embodiment of the invention, taken on a line XXE-XXE' of FIG. 20.

FIG. 20F is a cross sectional view of the second capacitor element C2 of the second embodiment of the invention, taken on a line XXF-XXF' of FIG. 20.

FIG. 20G is a cross sectional view of the first capacitor element C1 of the second embodiment of the invention, taken on a line XXD-XXD' of FIG. 20.

FIG. 20H is a cross sectional view of the third capacitor element C3 of the second embodiment of the invention, taken on a line XXE-XXE' of FIG. 20.

FIG. 20I is a cross sectional view of the second capacitor element C2 of the second embodiment of the invention, taken on a line XXI-XXI' of FIG. 20.

FIG. 20M is a perspective view of a DRAM cell, which is a first modification of the first modification of the second embodiment of the invention.

DETAILED DESCRIPTION OF THE EMBODIMENTS

Figure 1:
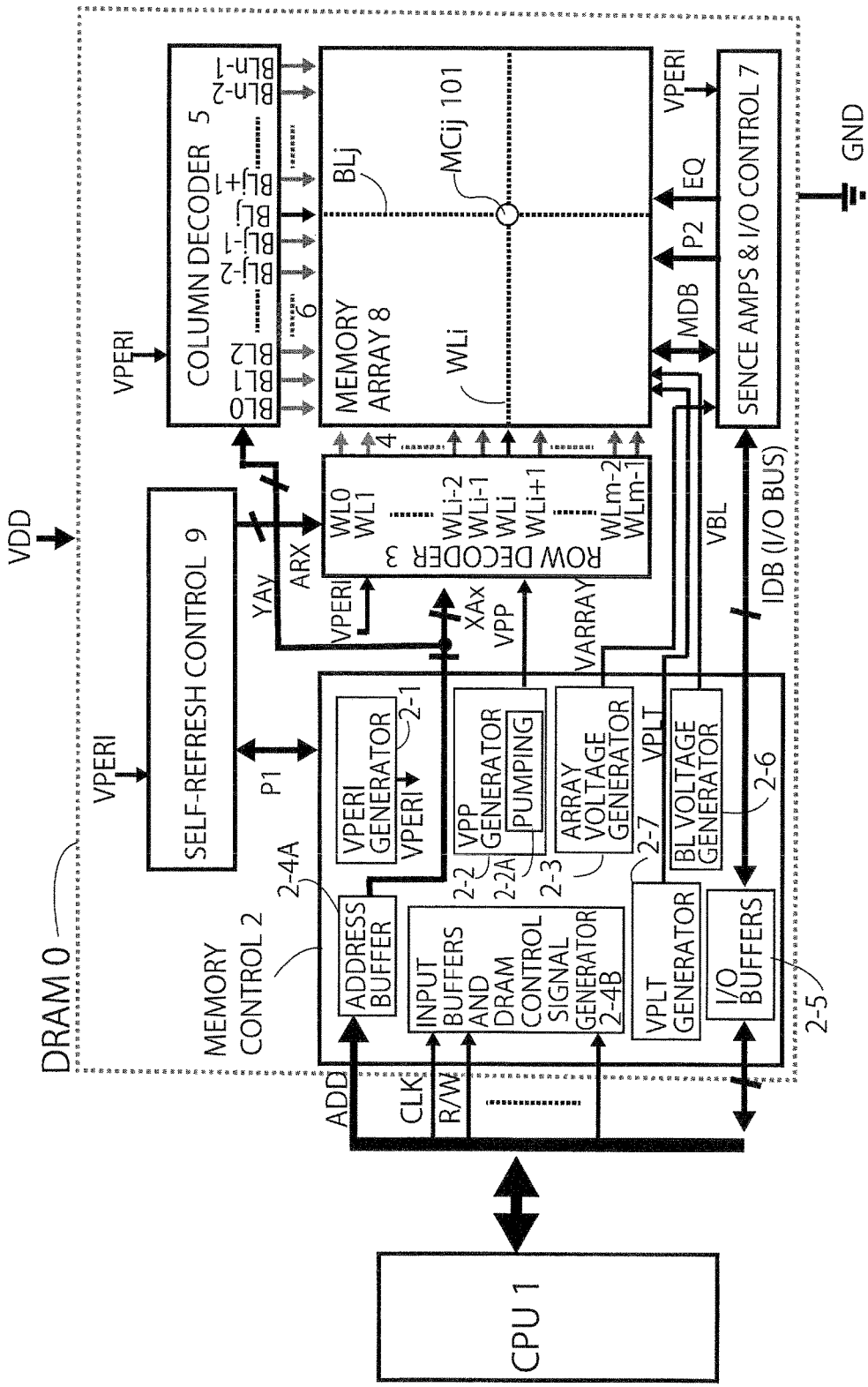
FIG. 1 is a detailed circuit block diagram of a whole block configuration with respect to a conventional DRAM.
Figure 2A:
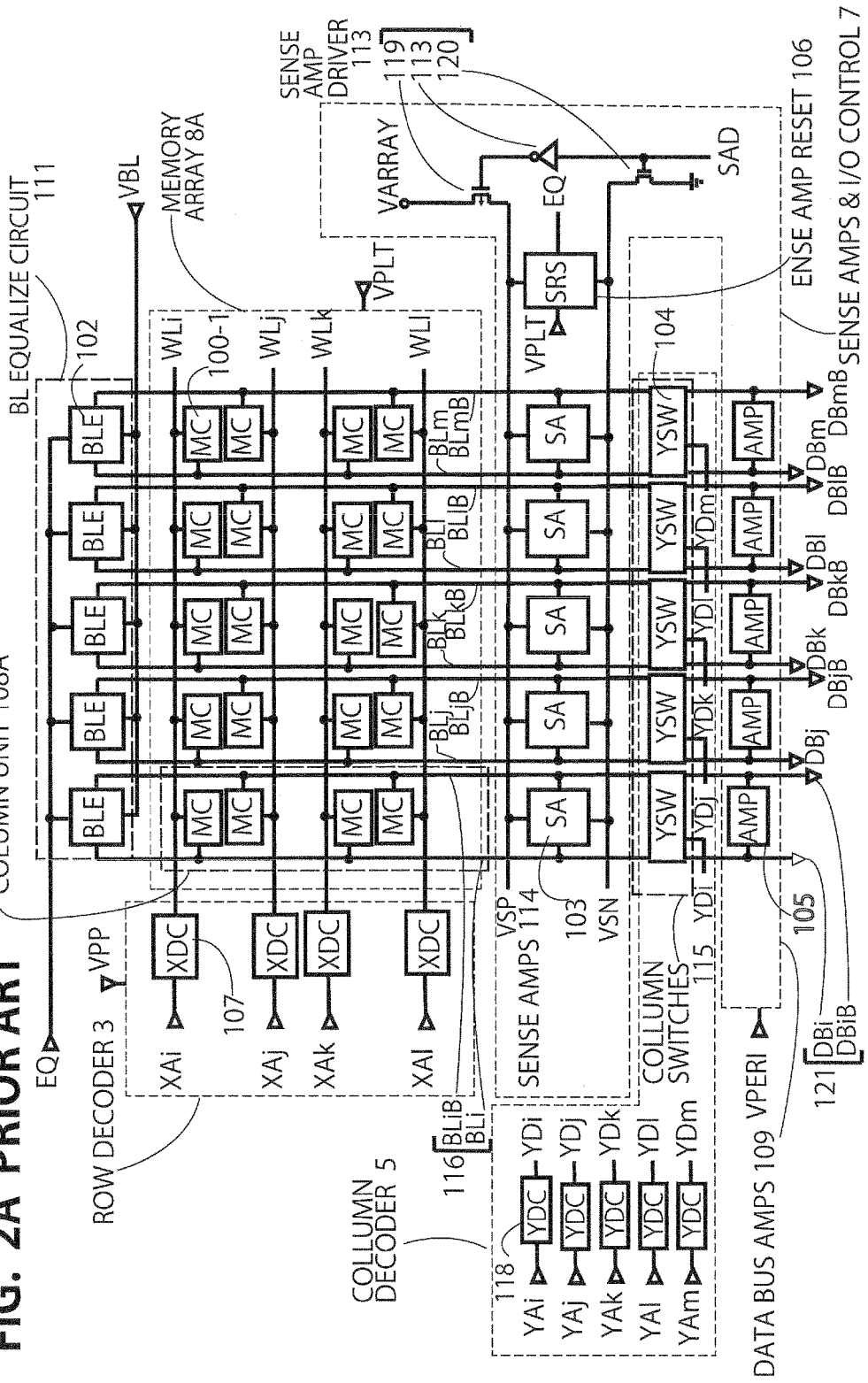
FIG. 2A is a circuit block diagram especially showing a memory array block, which consists of a plurality of standard one-transistor DRAM cells, and showing memory array control blocks in whole block configuration of the DRAM shown in FIG. 1.
Figures 2B, 2C:
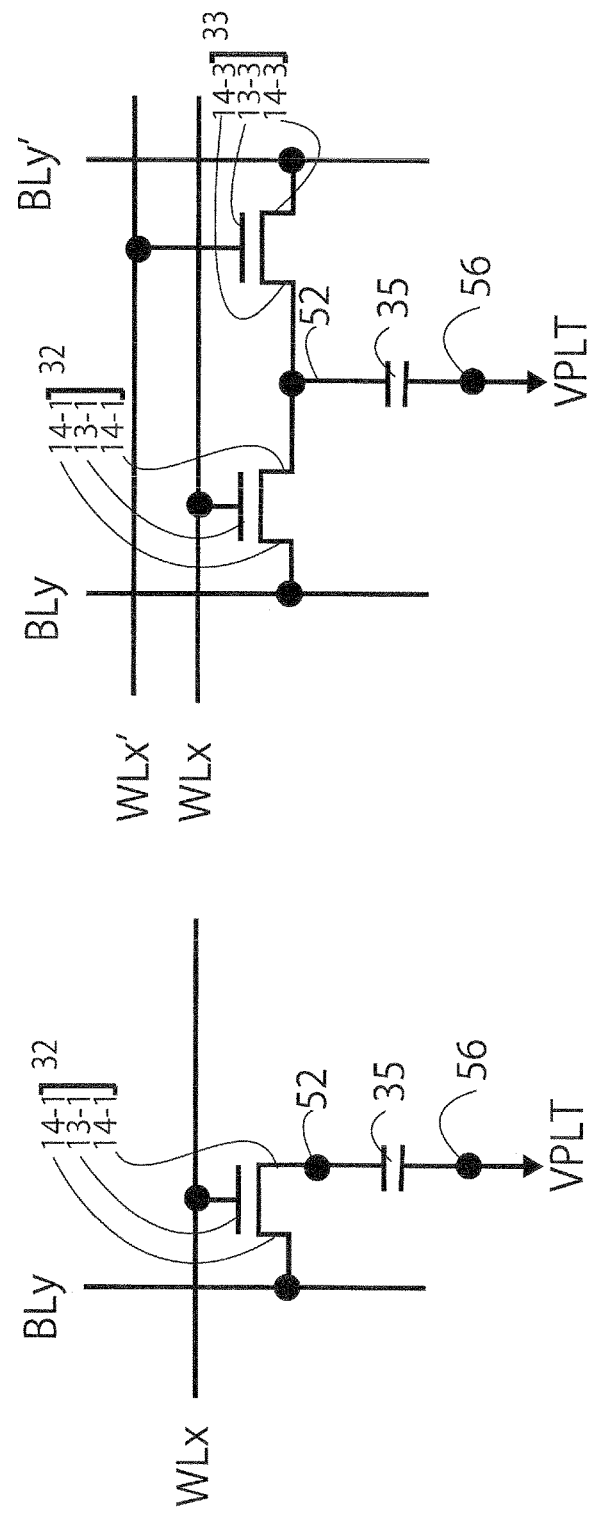
FIG. 2B is a circuit diagram showing an equivalent circuit of a conventional DRAM cell including one transistor and one capacitor.
FIG. 2C is a circuit diagram showing an equivalent circuit of another conventional DRAM cell including two transistors and one capacitor.
Figure 3:
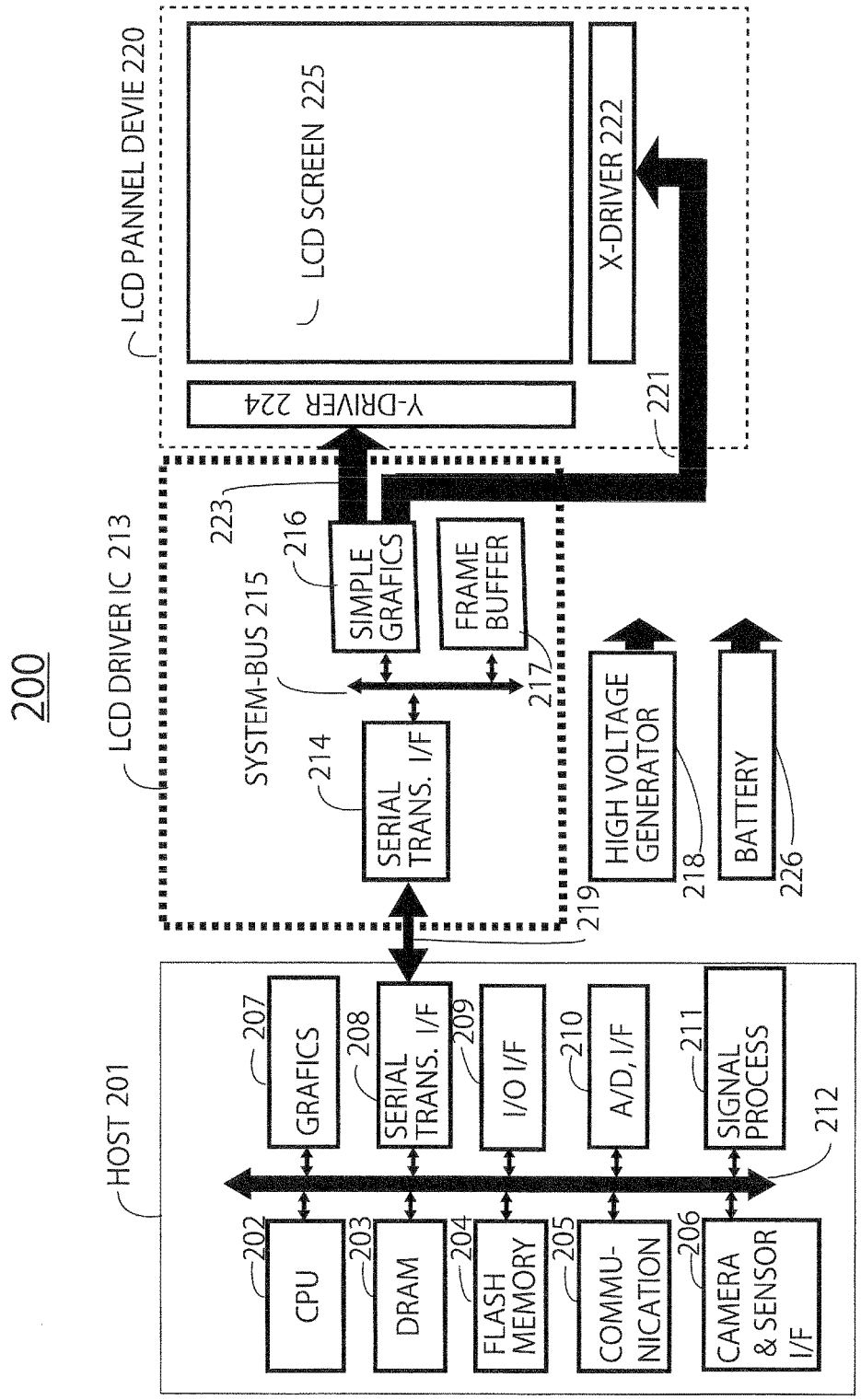
FIG. 3 is a block diagram of a prior art general mobile device.
Figure 4:
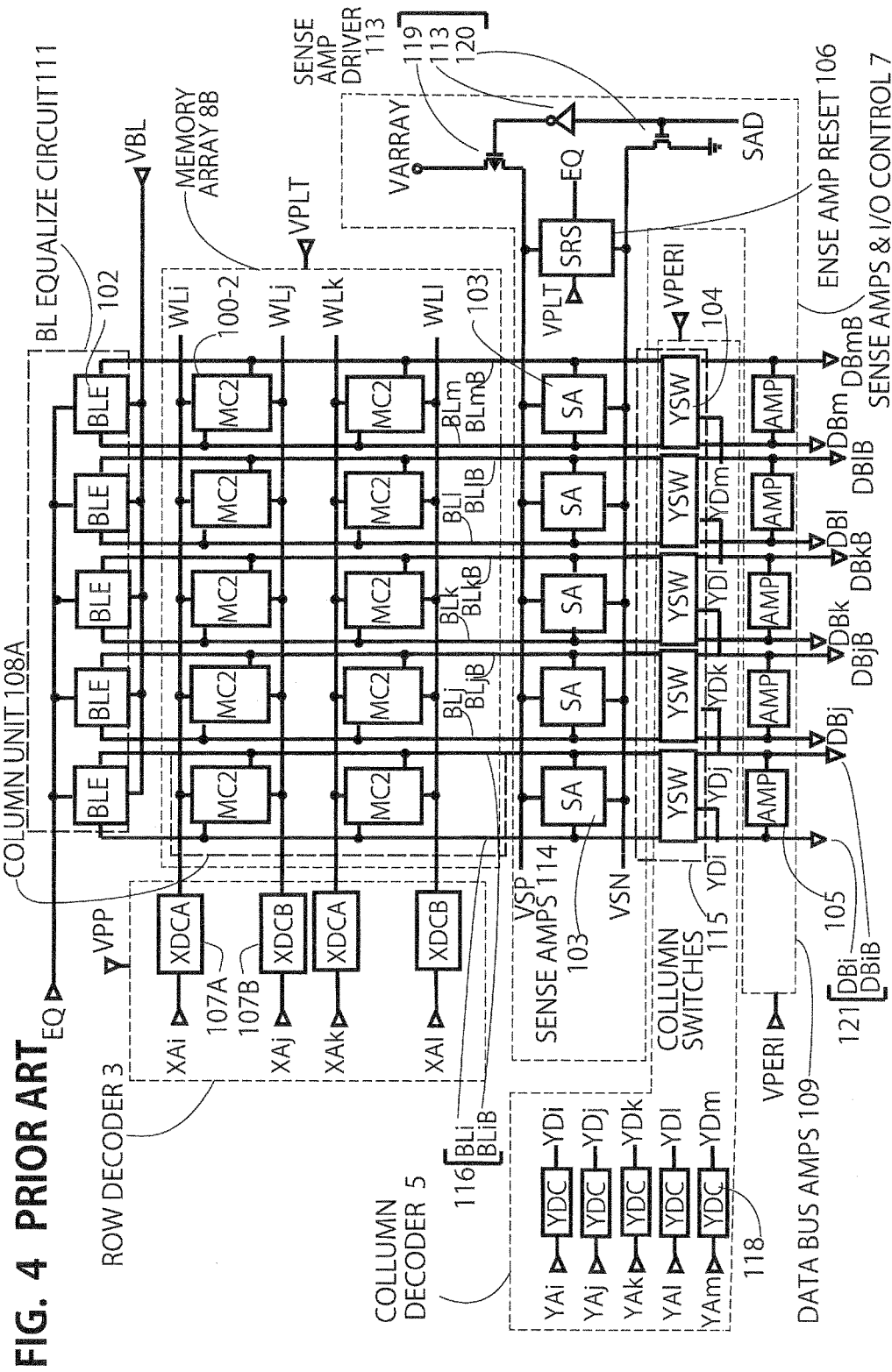
FIG. 4 is a circuit block diagram showing a memory array block including a plurality of prior art two-transistor DRAM cells, and memory array control blocks.

In the following detailed description, numerous specific details are set forth to provide a thorough understanding of claimed subject matter. For purposes of explanation, specific numbers, systems and/or configurations are set forth, for example. However, it should be apparent to one skilled in the relevant art having benefit of this disclosure that claimed subject matter may be practiced without specific details.

In other instances, well-known features may be omitted and/or simplified so as not to obscure claimed subject matter. While certain features have been illustrated and/or described herein, many modifications, substitutions, changes and/or equivalents may occur to those skilled in the art.

It is, therefore, to be understood that appended claims are intended to cover any and all modifications and/or changes as fall within claimed subject matter. Reference throughout this specification to one implementation, an implementation, one embodiment, an embodiment and/or the like may mean that a particular feature, structure, or characteristic described in connection with a particular implementation or embodiment may be included in at least one implementation or embodiment of claimed subject mat ter. Thus, appearances of such phrases, for example, in various places throughout this specification are not necessarily intended to refer to the same implementation or to any one particular implementation described.

Furthermore, it is to be understood that particular features, structures, or characteristics described may be combined in various ways in one or more implementations. In general, of course, these and other issues may vary with context. Therefore, particular context of description or usage may provide helpful guidance regarding inferences to be drawn. Operations and/or processing, such as in association with networks, such as computer and/or communication networks, for example, may involve physical manipulations of physical quantities.

Typically, although not necessarily, these quantities may take the form of electrical and/or magnetic signals capable of, for example, being stored, transferred, combined, processed, compared and/or otherwise manipulated. It has proven convenient, at times, principally for reasons of common usage, to refer to these signals as bits, data, values, elements, symbols, characters, terms, numbers, numerals, and/or the like.

It should be understood, however, that all of these or similar terms are to be associated with appropriate physical quantities and are intended to merely be convenient labels. Likewise, in this context, the terms "coupled", "connected," and/or similar terms, may be used. It should be understood that these terms are not intended as synonyms. Rather, "connected" may be used to indicate that two or more elements or other components, for example, are in direct physical and/or electrical contact; while, "coupled" may mean that two or more components are in direct physical or electrical contact; however, "coupled" may also mean that two or more components are not in direct contact, but may nonetheless co-operate or interact.

The term "coupled" may also be understood to mean indirectly connected, for example, in an appropriate context. The terms, "and", "or", "and/or" and/or similar terms, as used herein, may include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense.

In addition, the term "one or more" and/or similar terms may be used to describe any feature, structure, and/or characteristic in the singular and/or may be used to describe a plurality or some other combination of features, structures and/or characteristics. Though, it should be noted that this is merely an illustrative example and claimed subject matter is not limited to this example. Again, particular context of description or usage may provide helpful guidance regarding inferences to be drawn.

Referring now to the drawings, embodiments according to the present invention will be described in detail hereinafter.

Throughout the drawings to explain the embodiments, like reference characters designate like or corresponding members and the repetitive explanation will be omitted. In addition, the circuit symbol of MOSFET (Metal Oxide Semiconductor Field Effect Transistor) with no arrow mark attached is distinguished as an N-type MOSFET (NMOS transistor), while that with an arrow mark attached is distinguished as a P-type MOSFET (PMOS transistor). Hereinafter MOSFET is called just a transistor.

In drawings showing cross-sectional views, oblique views and waveforms for explaining the embodiments, where the dimensions of each part are drawn differently from the actual magnitude relation in order to clarify the explanation visually.

The process of the present invention provides methods to fabricate two major kinds of embodiments, a first embodiment and a second embodiment, and their modification embodiments for fabricating a metal-insulator-metal or MIM capacitor in a two transistor DRAM cell.

First Embodiment

Figure 7:
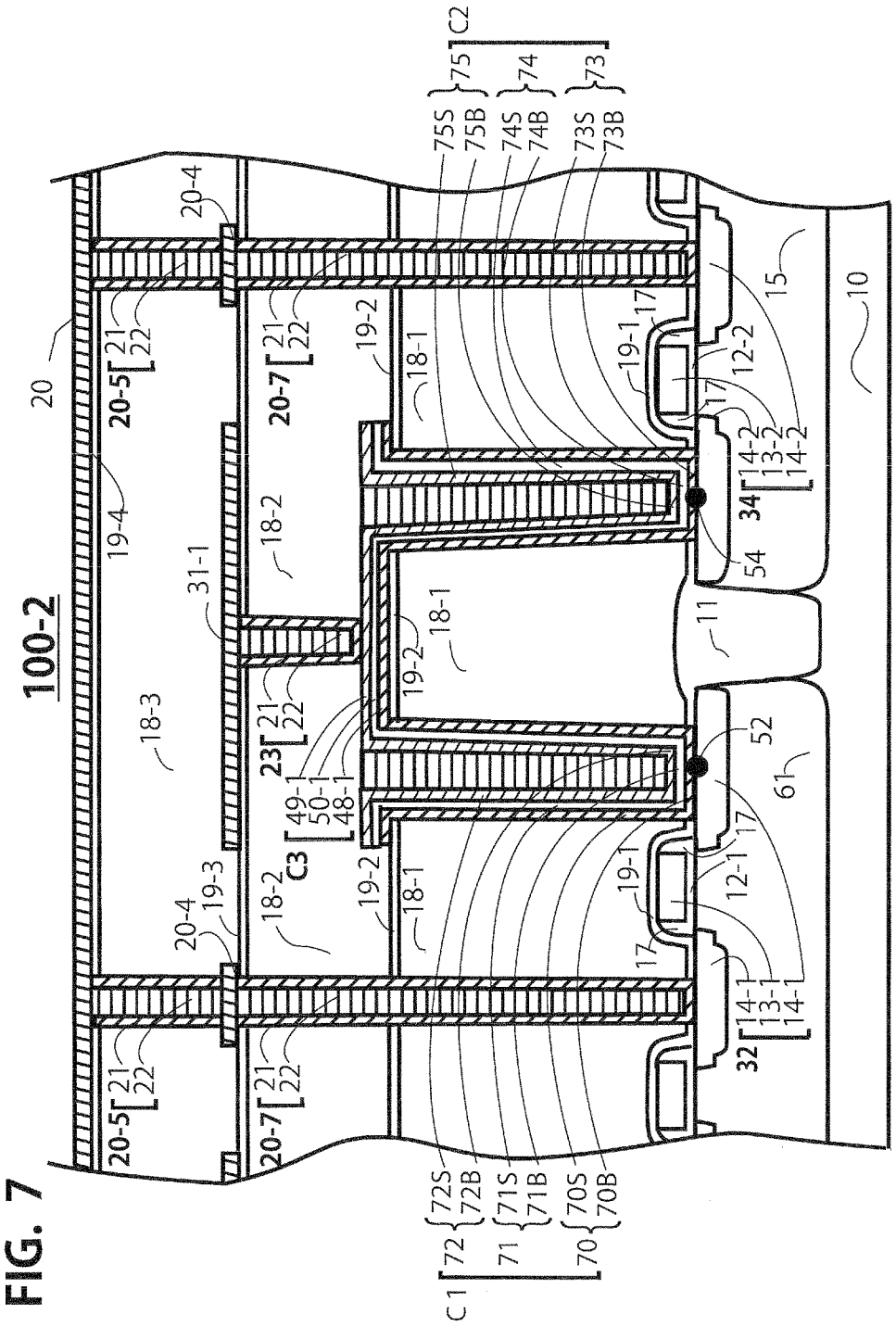
FIG. 7 is a cross sectional view of a DRAM cell which is a first embodiment of the invention, showing a structure taken on line VII-VII' of FIG. 8A.

FIG. 7 is a cross sectional view of an example of a DRAM cell according to a first embodiment of the invention, showing a structure taken on a line A-A' of FIG. 8A, which shows a layout drawing of the DRAM cell. FIG. 8A shows one example of a first memory cell layout configuration of the DRAM cell by the first embodiment of the invention.

The feature of the layout of the first embodiment of the invention is that an N-type transistor 32, a P-type transistor 34 and a common capacitor CCOM are aligned in a bit-line direction BLDIR of the bit line 20 as shown in FIG. 8A, so that the common capacitor CCOM is arranged between the N-type transistor and the P-type transistor, and at substantially a center of the DRAM cell. The top electrode of the common capacitor CCOM connects to a storage plate VPLT supply line 31-1 which is aligned in the word-line direction WLDIR as shown in FIG. 8A.

Figures 8C, 9:
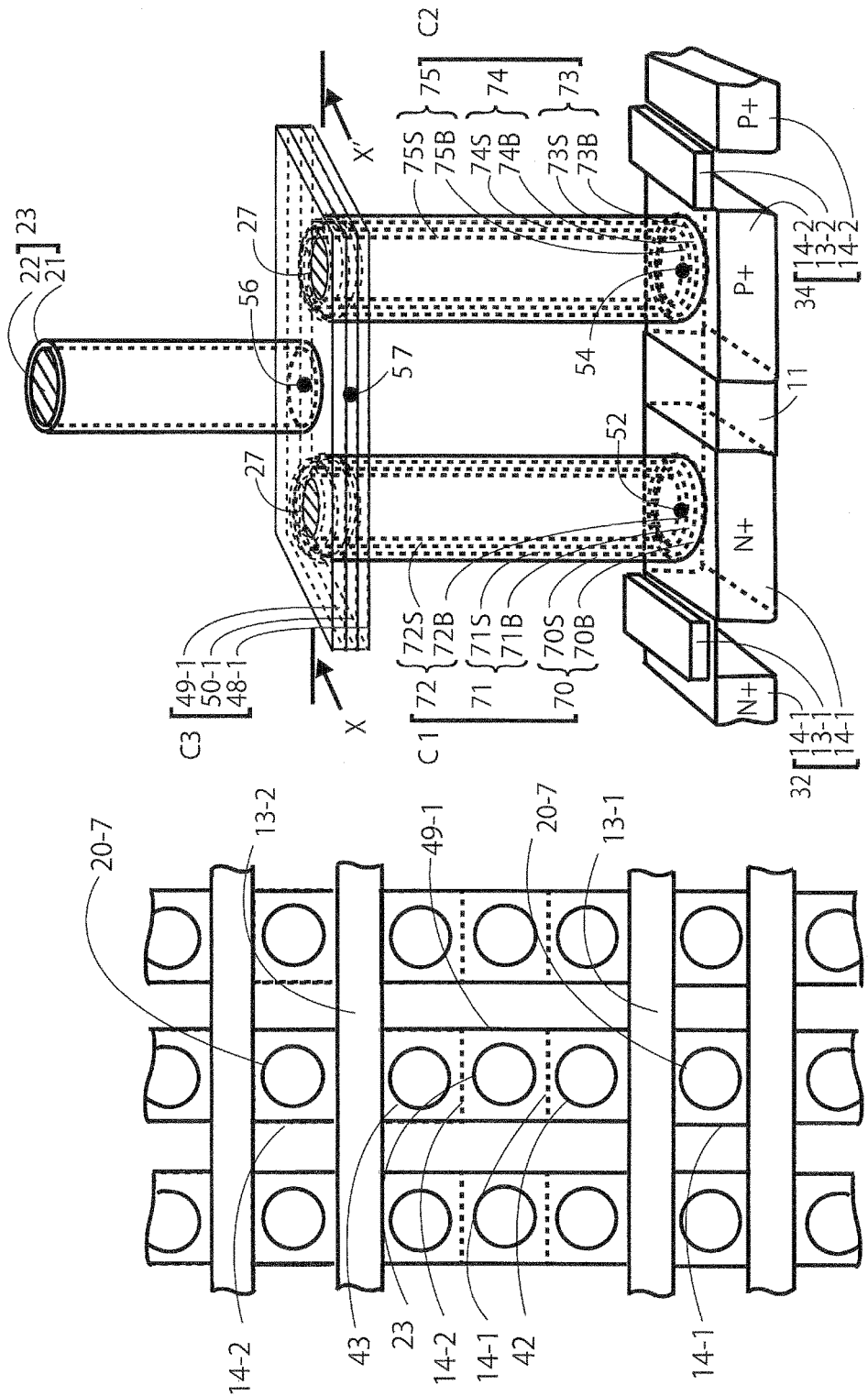
FIG. 8C is a top view showing a third memory cell layout configuration, in which a second metal layer 31-1 and a cell-plate contact 23 and second metal bit-line pads 20-4 shown in FIG. 8B are removed.
FIG. 9 is a perspective view of a main part of the first embodiment of the invention.

FIG. 8B shows a second cell layout configuration, in which a first metal layer 20 and a contact 20-5 penetrating the third insulating layer 18-3. FIG. 8C shows a third DRAM cell layout configuration, in which a second metal layer 31-1, which forms a memory cell plate voltage VPLT wirings, and second metal bit-line pads 20-4s are removed from the second layout configuration shown in FIG. 8B.

Figure 10:
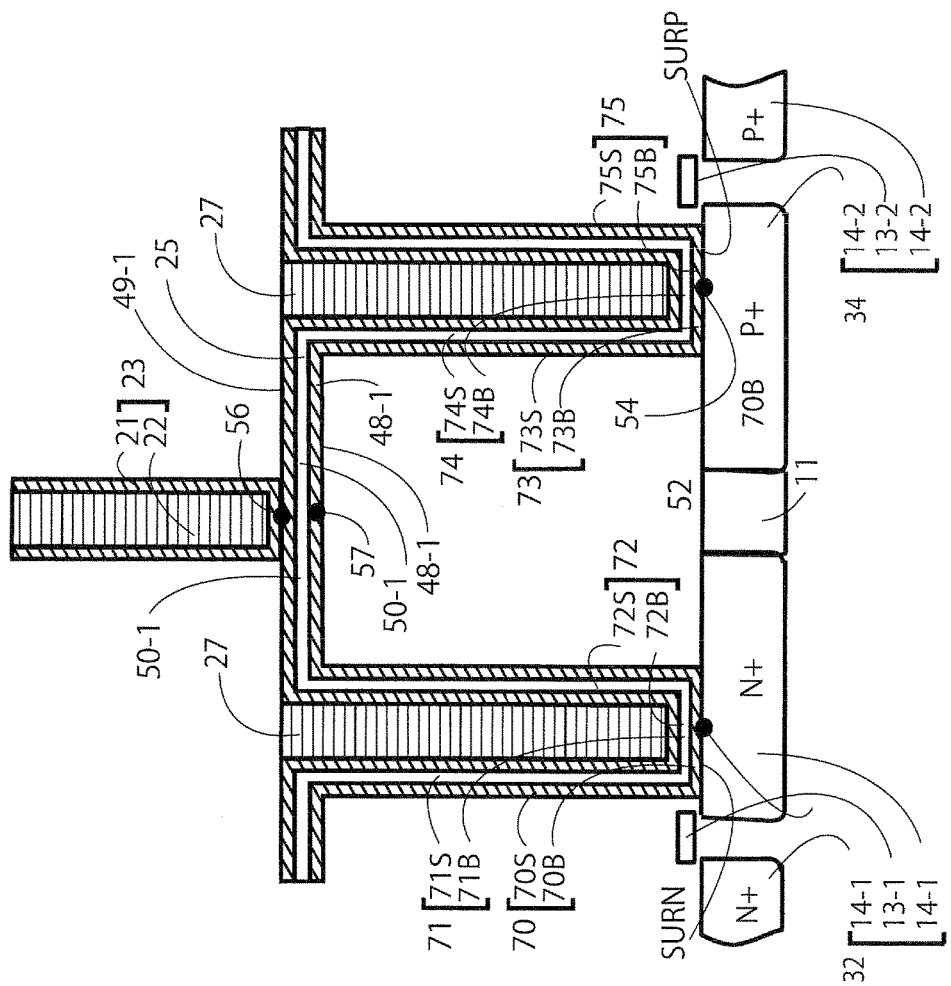
FIG. 10 is a cross sectional view of the first embodiment of the invention, taken on a line X-X' of FIG. 9.

FIG. 9 is a perspective view of key components of the first embodiment of the invention, in which the key elements includes an N-type transistor 32, a P-type transistor 34, and a common capacitor CCOM, which includes a first capacitor element C1, a second capacitor element C2 and a third capacitor element C3. A cell plate contact 23 is added to the key components of FIG. 9 for a later explanation of modifications of the first embodiment of the invention. As shown in FIG. 9, the common capacitor CCOM has a shape of letter "n". FIG. 10 is a cross sectional view of the first embodiment of the invention, taken on a line X-X' of FIG. 9.

Next, referring to FIG. 7 to FIG. 11, the key components of the first embodiment of the invention and their structures are explained.

As shown in FIG. 7, the DRAM cell 100-2 according to the first embodiment of the invention includes (1) the N-type transistor 32 including a gate polysilicon layer 13-1, which is conformally covered with a first stop layer 19-1 and is connected to a high-active word-line WLi;

(2) a first source/drain region 14-1 having a cell-node 52 on a surface thereof, and a second source/drain region 14-1 electrically connected to a bit-line 20 through a first contact 20-7 penetrating a first insulating layers 18-1 and a second insulating layer 18-2, and a second contact 20-5 penetrating a third insulating layer 18-3 via a third metal layer 20-4;

(3) the P-type transistor 34, including a gate polysilicon gate 13-2, which is typically covered with the first stop layer 19-1 and is connected to a low-active word-line WLiB, a first source/drain region 14-2 having a cell-node 54 on a surface thereof, and a second source/drain region 14-2 electrically connected to the bit-line 20 through a second contact 20-7 penetrating a first insulating layers 18-1 and a second insulating layer 18-2, and a first contact 20-5 penetrating a third insulating layer 18-3 via a second metal layer 20-4; and (4) the common capacitor CCOM including parallelly-connected three elements, which include a first capacitor element C1, a second capacitor element C2 and a third capacitor element C3.

In this case, the first capacitor element C1 includes an outer metal cylinder 70, an inner metal cylinder 72 and a dielectric layer 71, the outer metal cylinder 70 including a sidewall metal portion 70S and a bottom metal layer portion 70B. The inner metal cylinder 72 includes a side-wall metal portion 72S and a bottom metal layer portion 72B, and the dielectric portion 71 includes a side-wall dielectric layer 71S and a dielectric bottom portion 71B. The bottom metal layer portion 70B of the outer metal cylinder 70 is connected to a surface SURN of the first source/drain region 14-1 of the N-type transistor 32 as shown in FIG. 9.

The second capacitor element C2 includes an outer metal cylinder 73, inner metal cylinder 75 and a dielectric layer 74, the outer metal cylinder 73 including a sidewall metal portion 73S and a bottom metal layer portion 73B. The inner metal cylinder 75 includes a side-wall metal portion 75S and a bottom metal layer 72B, and the dielectric layer 74 includes a side-wall dielectric portion 74S and a dielectric bottom portion 74B. The bottom metal layer portion 73B of the outer metal cylinder 73 is connected to a surface SURP of the first source/drain region 14-2 of the P-type transistor 34 as shown in FIG. 9.

The third capacitor element C3 includes a bottom metal electrode plate 48-1, a top metal electrode plate 49-1 and a dielectric layer 50-1.

Next, a connection-relation among the first capacitor element C1, the second capacitor element C2 and the third capacitor element C3, is explained.

Figure 11A:
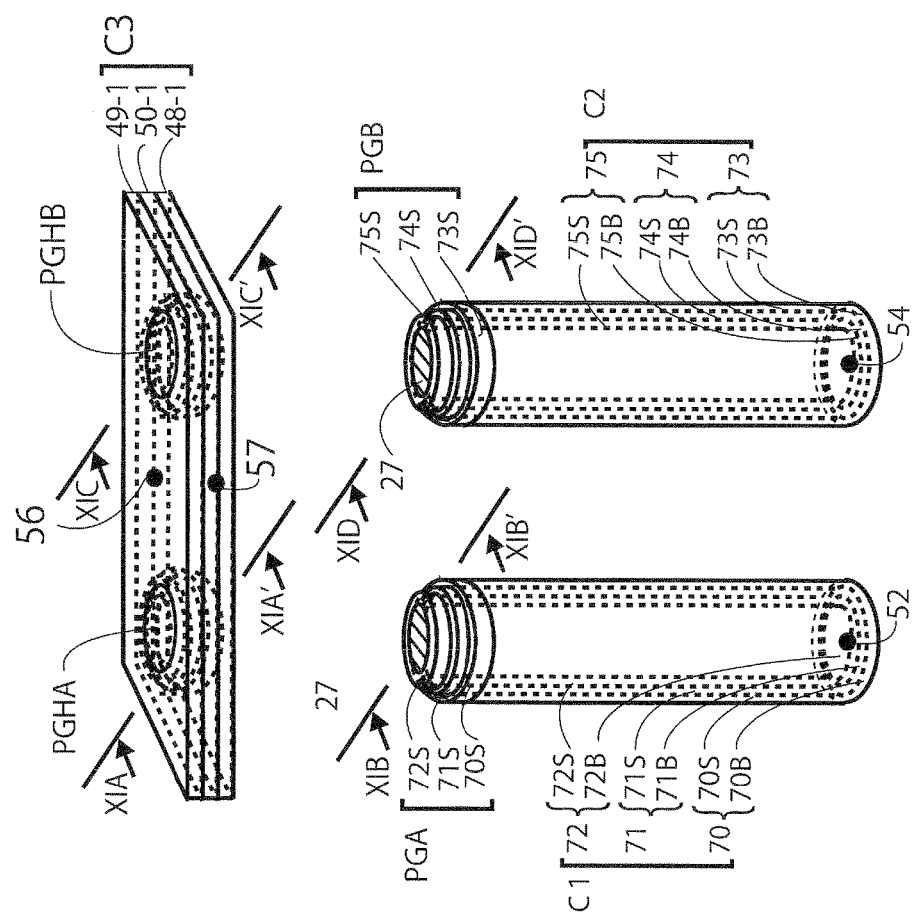
FIG. 11A is an exploded perspective view of three capacitor elements of the first embodiment of the invention.
Figure 11B:
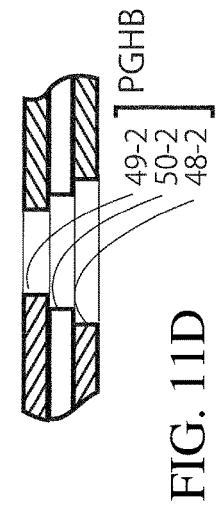
FIG. 11B is a cross sectional view of a first plug-hole PGHA of a third capacitor element C3, taken on a line XIA-XIA' of FIG. 11A.
Figure 11C:
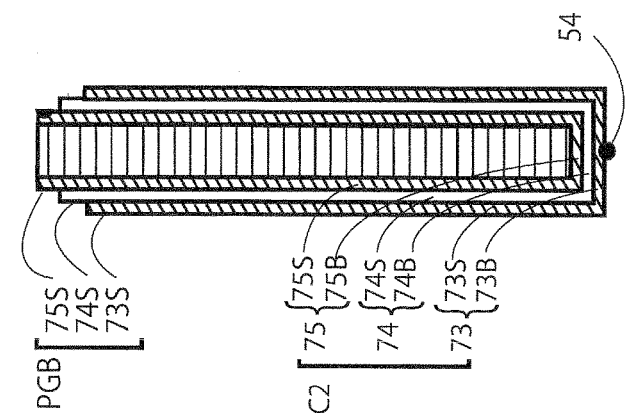
FIG. 11C is a cross sectional view of a first capacitor element C1 of the first embodiment of the invention wat, taken on a line XIB-XIB' of FIG. 11A.
Figure 11D:
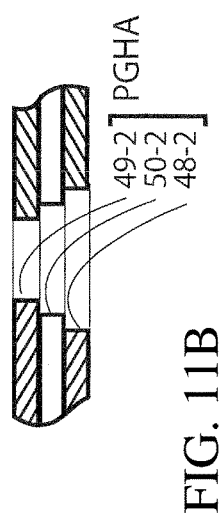
FIG. 11D is a cross sectional view of a second plug-hole PGHB of the third capacitor element C3, taken on a line XIC-XIC' of FIG. 11A.
Figure 11E:
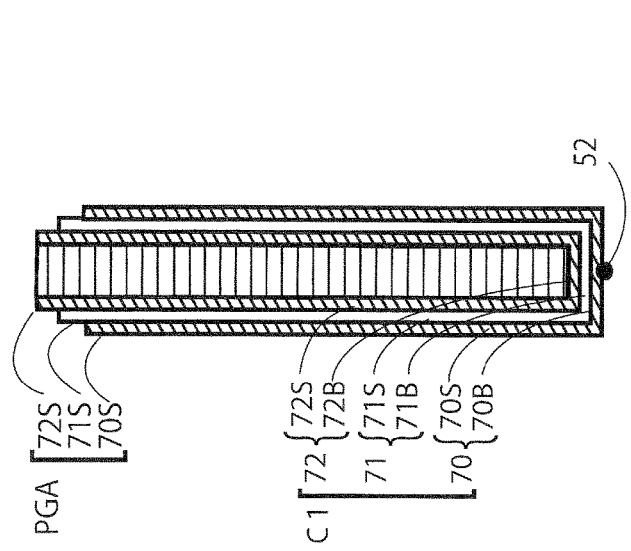
FIG. 11E is a cross sectional view of a second capacitor element C2 of the first embodiment of the invention, taken on a line XID-XID' of FIG. 11A.

In an actual fabrication process, the three capacitor elements, namely, the first to third capacitor elements C1, C2 and C3 are fabricated in one piece, however, for a visual understanding, the three elements are divided into three parts and shown by 3D views to explain complex electrical connections as shown in FIG. 11A.

As shown in FIG. 11A, the first capacitor element C1 has a connection zone PGHA at the top portion thereof, the second capacitor element C2 similarly has a connection zone PGHB at the top portion thereof, and the third (plate) capacitor element C3 has two contact zones matching the PGHA and PGHB. The cylinders PGA and PGB have two-terminals, namely, an outer terminal and an inner terminal. The contact zones PGHA and PGHB similarly have two terminals, where the two terminals include a bottom terminal, and a top terminal. When the columns are connected to the plate, the outer terminal of the columns is connected to the bottom terminal of the plate, the inner terminal of the columns is connected to the top terminal of the plate, and the dielectric filling of the columns (71S, 74S) and that of the top plate (50-1) are contiguous.

Figure 12:
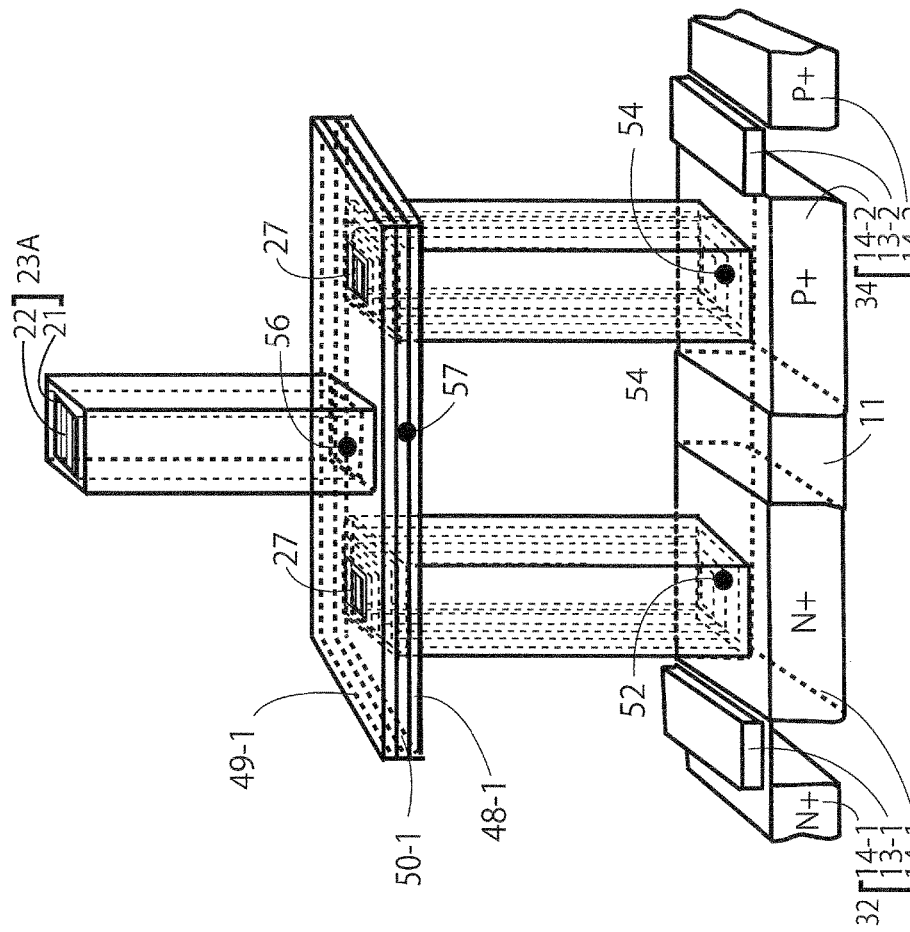
FIG. 12 is a perspective view of a first modification of the first embodiment of the invention.

FIG. 12 shows a first modification of the first embodiment of the invention. In an actual semiconductor process, while a contact layout mask data is rectangle the physical shape of the contact holes may be cylindrical or nearly cylindrical because angles of the rectangle are rounded. When the process was good enough, shaping a rectangle contact hole without angle rounding might be possible. Then, the inner metal cylinders 72, 74, outer metal cylinders 70, 73 and via metal contact 23 used in the first embodiment of the invention might be rectangular shapes as shown in FIG. 12.

Figure 13:
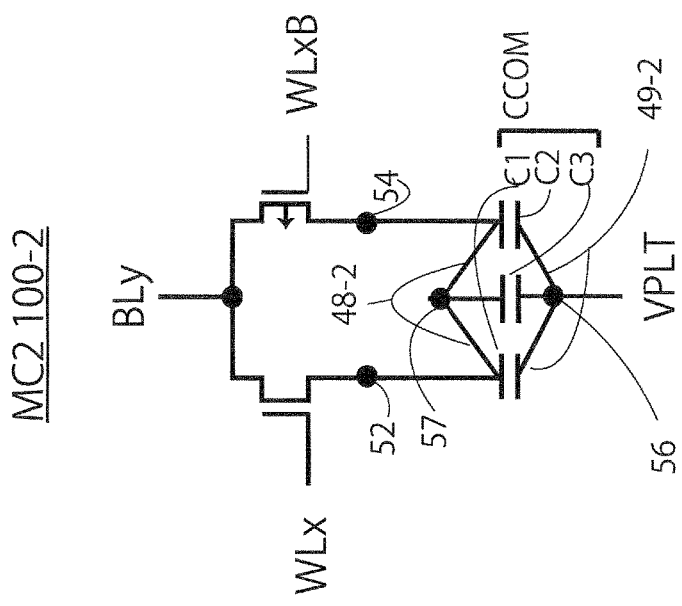
FIG. 13 is a circuit diagram showing a simplified equivalent circuit including word-line drivers and a DRAM cell according to the embodiment of the invention.

FIG. 13 shows an equivalent circuit to drive a DRAM cell MC2E 100-2, which is the invention; in terms of circuitry, all the embodiments and their modifications of the invention explained are same. Simply, the invention is an idea to add additional unique structure third capacitor element C3 to a prior art being taught by U.S. Pat. No. 8,890,227B1. The functionality of the prior art has been explained by using FIG. 6C and FIG. 6D. The circuit case has been defined as "case-100D".

Figure 14:
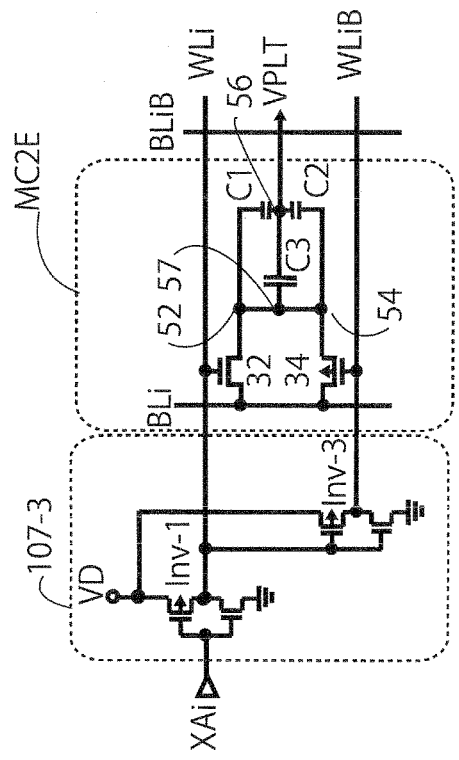
FIG. 14 is a circuit diagram showing an equivalent circuit of a DRAM cell according to the embodiment of the invention.

FIG. 14 shows a simplified equivalent circuit of a set of word-line drivers 107-3 and a DRAM cell MC2E of the invention. Hereafter, this circuit case in this invention is defined as "case-100E". A difference of the case-100E to the case-100D is that the case-E has an additional third capacitor element C3. The evident advantage of the invention is that the invention enables the prior art DRAM cell provided by U.S. Pat. No. 8,890,227B1 to fabricate an additional capacitor element between the two transistors, with increasing no or not much layout area increase, under the condition that the same semiconductor process is used. Further, the connection between the first N- and P-transistor source/drain areas is completed without using interconnect metal resource.

Figure 15:
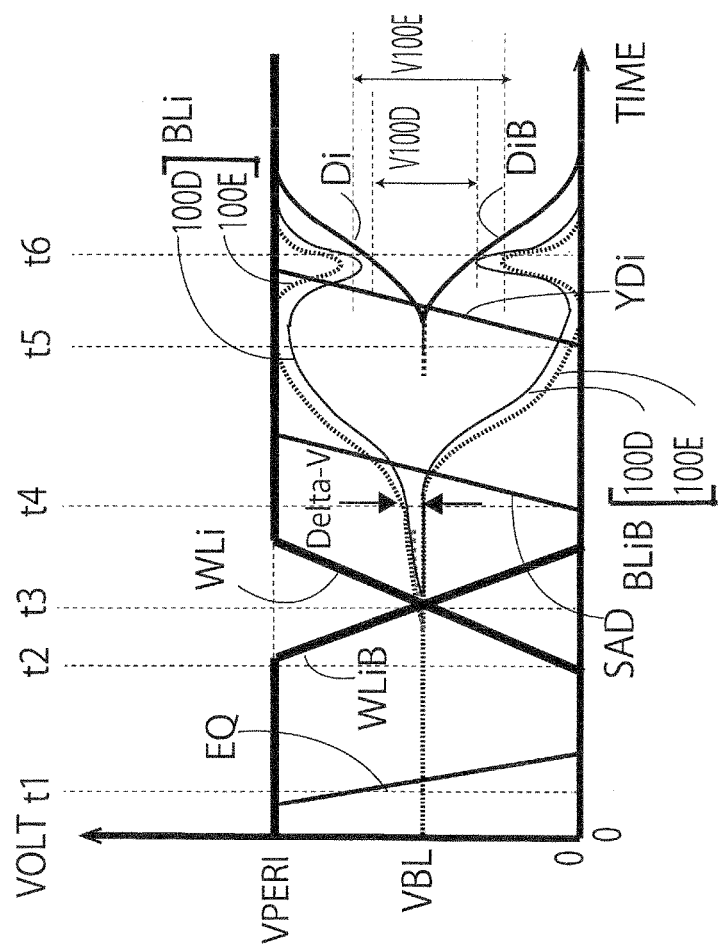
FIG. 15 is a graph showing waveforms of a read function of the DRAM for explaining a functional margin difference between the third prior art two-transistor DRAM cell shown in FIG. 6C and the DRAM cell according to the embodiment of the invention.

FIG. 15 shows a functional margin difference of the DRAM cells between the case-100D and the case-100E by comparing the voltage differences Delta-V of the bit-line pairs BLi and BLiB as already explained. The timings of the control signals and wave forms in FIG. 15 are same with those explained in FIG. 6D.

In the case-100E, because the third capacitor element C3 is added to the case-100D by the embodiment of the invention, the voltage differences Delta-Vin the case-100E at the timing t4 is wider than that in the case-100D. This means that the present embodiment improves the sensing margin in the case-100D to be better than that of the prior arts. In addition, when the minimum values of decreased voltage differences Delta-V are compared with each other between the case-100D and the case-E at around the timing t6, when a Y-switch signal YDi goes high, it is evident that "bit-line pair to data-bus pair data-transfer margin" in the case-100E becomes better because the minimum value of decreased Delta-V, V100E, in the case-100E is larger than that of the voltage difference Delta-V, V100D. This means that the first embodiment also improves the "bit-line pair to data-bus pair data-transfer margin" as compared with those of the prior arts.

Figure 16:
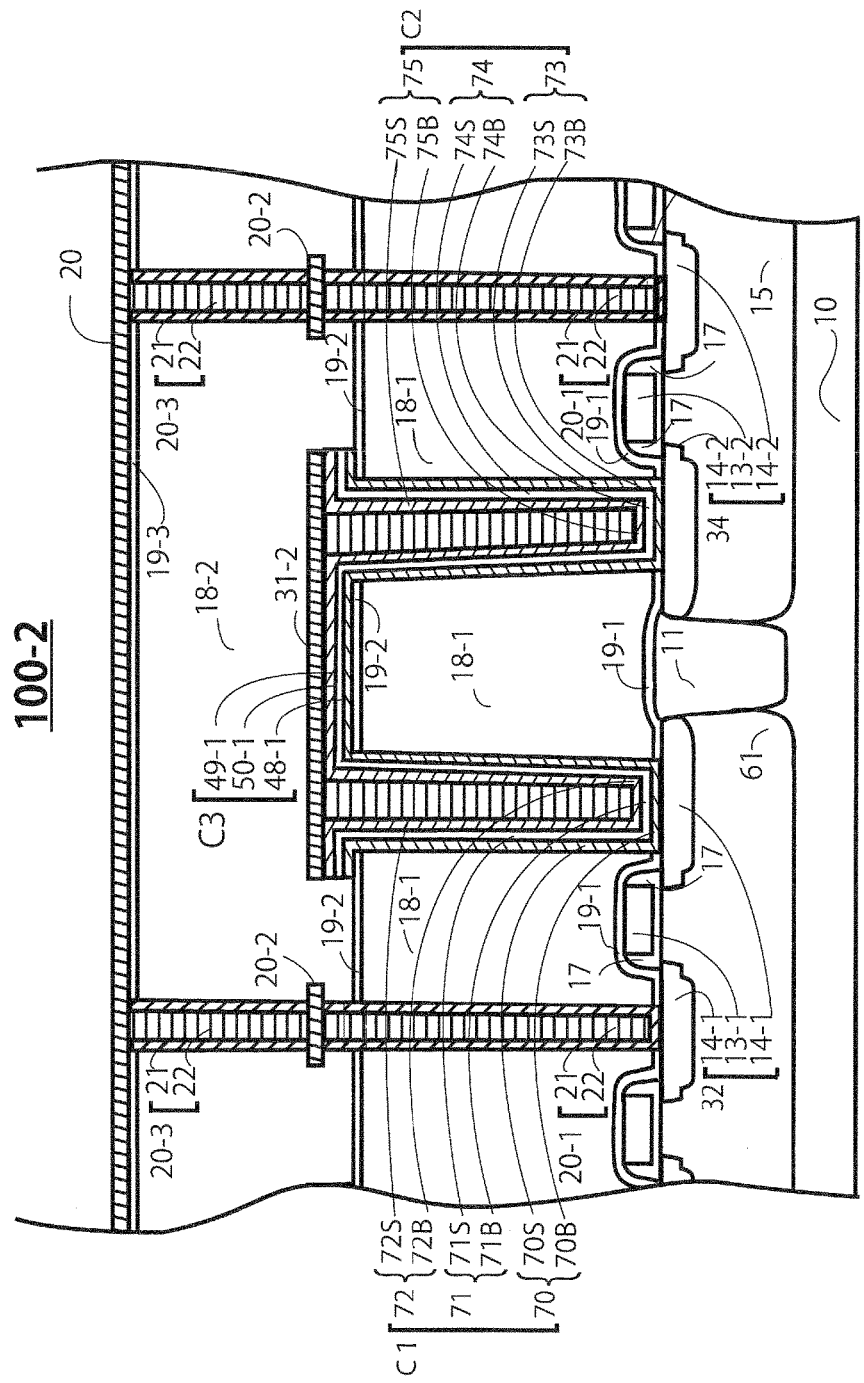
FIG. 16 is a cross sectional view of a DRAM cell, which is a first modification of the first embodiment of the invention, showing a structure taken on the line A-A' of FIG. 8A.

FIG. 16 shows a cross-sectional view of a second modification of the first embodiment of the invention. The modification is a removal of the cell plate contact 23 from the first embodiment of the invention. This modification is provided for supporting such a case that the cell plate voltage VPLT is supplied by a metal wiring on the second stop layer 19-2. In this case, cell-plate contact 23 is not required; but plate supply is still needed.

Next, a simple example of how to fabricate the first embodiment of the invention is explained according to generally used process steps with reference to FIG. 24 to FIG. 42.

Figure 24:
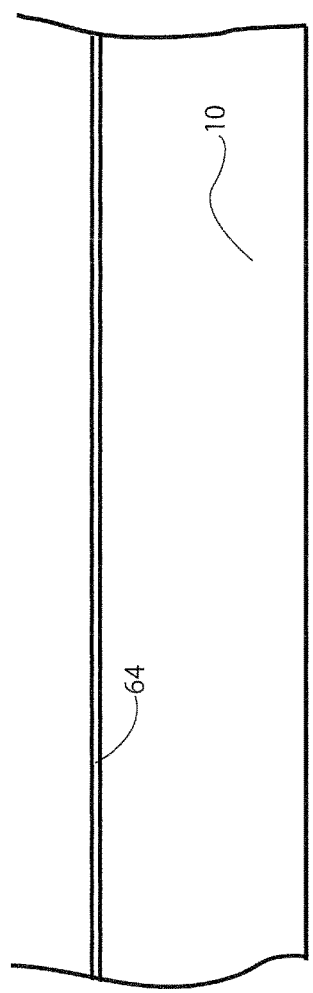
FIG. 24 is a cross sectional view showing a first process of a process flow to fabricate the DRAM cell of the first embodiment of the invention.

Referring to FIG. 24, firstly, a pad oxide layer 64, which is a very thin oxide layer, is grown over a silicon substrate 10.

Figure 25:
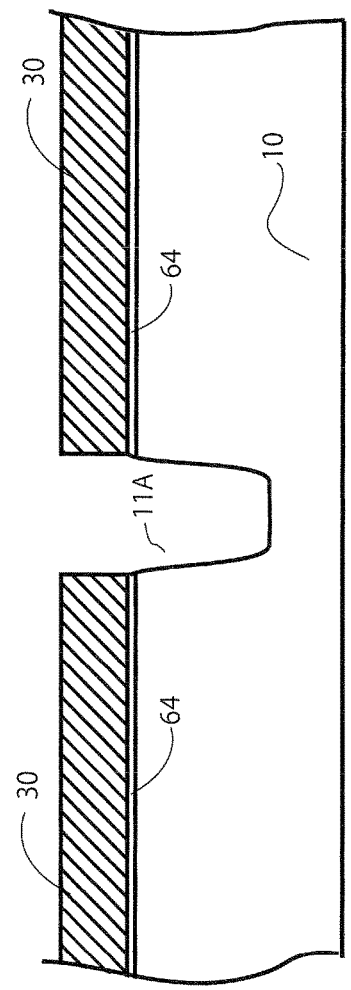
FIG. 25 is a cross sectional view showing a second process of the process flow to fabricate the DRAM cell of the first embodiment of the invention.

Referring to FIG. 25, by using a nitride mask 30, a shallow trench hole 11A is defined, and the trench hole 11A is dug by oxide under-etching. After a growth of the pad oxide layer 64, the layer 64 may be a silicon nitride (Si3N4) layer 30, which is used as a photo mask for selective etching later, then the layer 30 is deposited by chemical vapor deposition or CVD thereon for digging a hole for a shallow trench insulating region or STI layer 11. There is a large variety deposition methods of CVD such as APCVD, SACVD, LPCVD.

A trench for the STI layer 11, which will electrically isolate devices, is etched into the silicon substrate 10 by active-area-patterning and oxide planarization or CMP, Chemical Mechanical Polish. Widely, nitride is used as CMP stop point since CMP rate is much smaller in nitride than in oxide. For one embodiment, the material of the nitride mask 30 may be silicon nitride, however, the nitride mask 30 is a sacrificial layer and may be any material that can function as an etch or planarization stop layer and that is selective to removal over surrounding layers.

Figure 26:
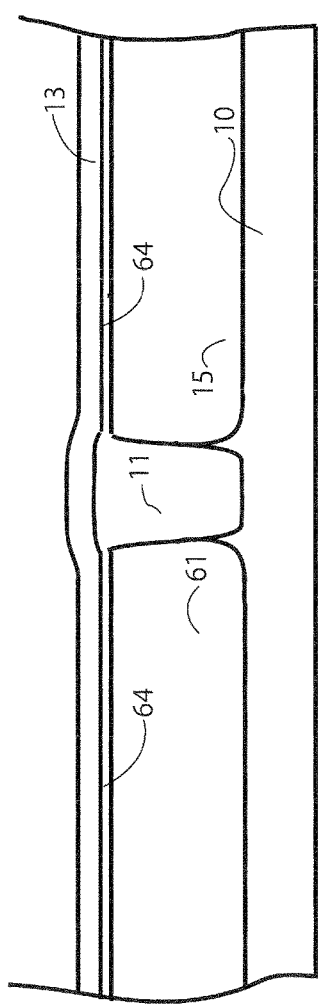
FIG. 26 is a cross sectional view showing a third process of the process flow to fabricate the DRAM cell of the first embodiment of the invention.

Referring to FIG. 26, an oxidation of STI layer 11 and N-well 15 and P-well 61 formations are done. After a chemical treatment of the damaged pad oxide layer 64 by a high energy implantation for a formation of N-well 15 and P-well 61 on top surface of active area. As a replacement, as shown in FIG. 26, a new thin oxide layer 13 may be a nitride oxide layer, and the layer is grown on the surface of the N-well 15, the P-well 61 and the STI layer by CVD. Because the gate oxide layer 13 determines the characteristic of transistors, the thickness thereof should be uniform and the quality thereof should be homogeneous.

Figure 27:
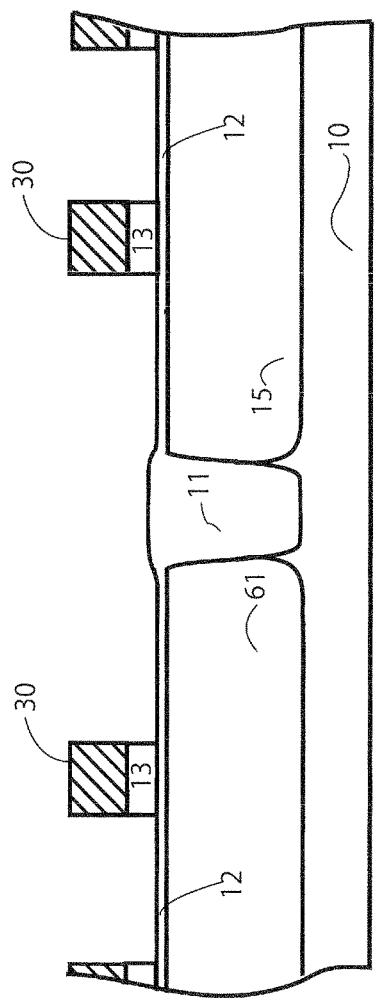
FIG. 27 is a cross sectional view showing a fourth process of the process flow to fabricate the DRAM cell of the first embodiment of the invention.

Referring to FIG. 27, firstly, gate patterning is done by using a nitride mask 30 deposited on the poly-silicon layer 13.

Figure 28:
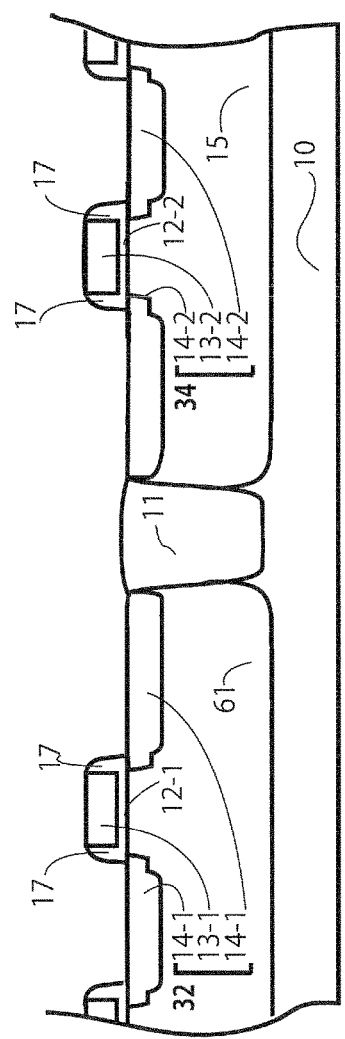
FIG. 28 is a cross sectional view showing a fifth process of the process flow to fabricate the DRAM cell of the first embodiment of the invention.

Not shown in the FIG. 28, the formation process of N-type transistor 32 and a P-transistor 34 is done and side-walls 17s are formed at the both sides of each transistor gates 13-1 and 13-2. Then, as shown in FIG. 28, a thin gate oxide layer 12-1 is formed under the gate of N-type transistor 32 and a thin gate oxide layer 12-2 is formed under the gate 13-2 of the P-type transistor 34.

Figure 29:
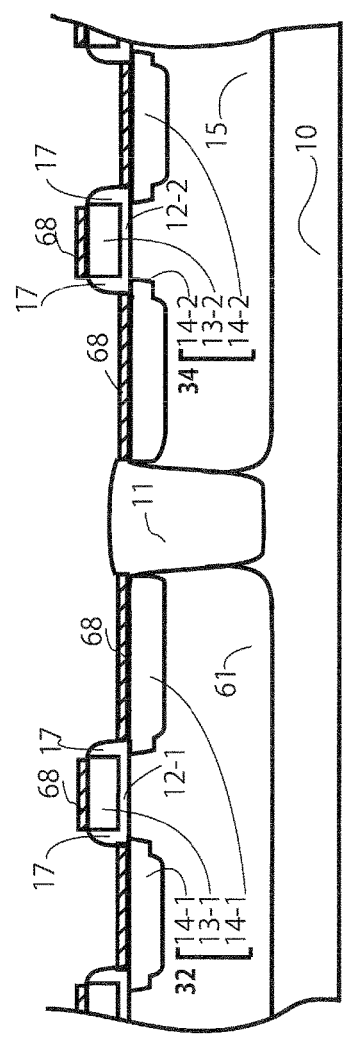
FIG. 29 is a cross sectional view showing a sixth process of the process flow to fabricate the DRAM cell of the first embodiment of the invention.

Referring to FIG. 29, a silicidation process, which is for lowering gate resistance and source/drain region resistances, is done. In this case, a silicide layer 68 is formed on the source/drain region 14-1, source/drain region 14-2 and the transistors' gates 13-1 and 13-2. For making this process-step-explanation drawing simple, the silicide layer 68 is not shown on drawings hereafter.

Figure 30:
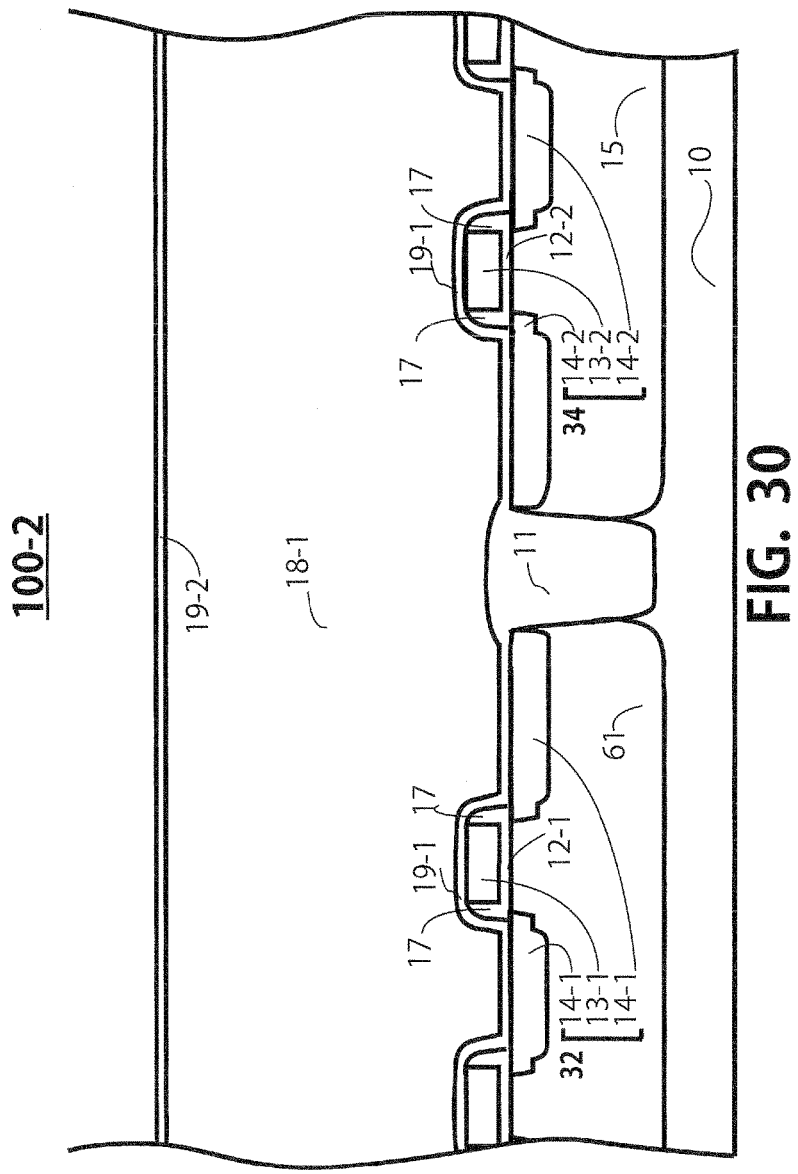
FIG. 30 is a cross sectional view showing a seventh process of the process flow to fabricate the DRAM cell of the first embodiment of the invention.

Referring to FIG. 30, a first conformal silicon oxynitride layer 19-1, which is also a first stop layer, is deposited over the device structures. Then, a first thick insulating layer 18-1, such as CVD deposited silicon dioxide, phosphosilicates glass (PSG), high density plasma oxide, or so, is deposited over the gate electrodes 13-1 and 13-2. Then, the insulating layer 18-1 is planarized, for example by CMP to obtain a flat surface. The insulating layer 18-1 should have a thickness of about 600-1500 Angstroms over the gate electrodes after CMP. After the formation of flat surface a first insulator 18-1 as shown, the second stop layer 19-2 deposited over the insulating layer 18-1. For example, the stop layer 19-2 may comprise silicon oxynitride or silicon nitride and have a thickness of between about 300 and 1000 Angstroms.

Figure 31:
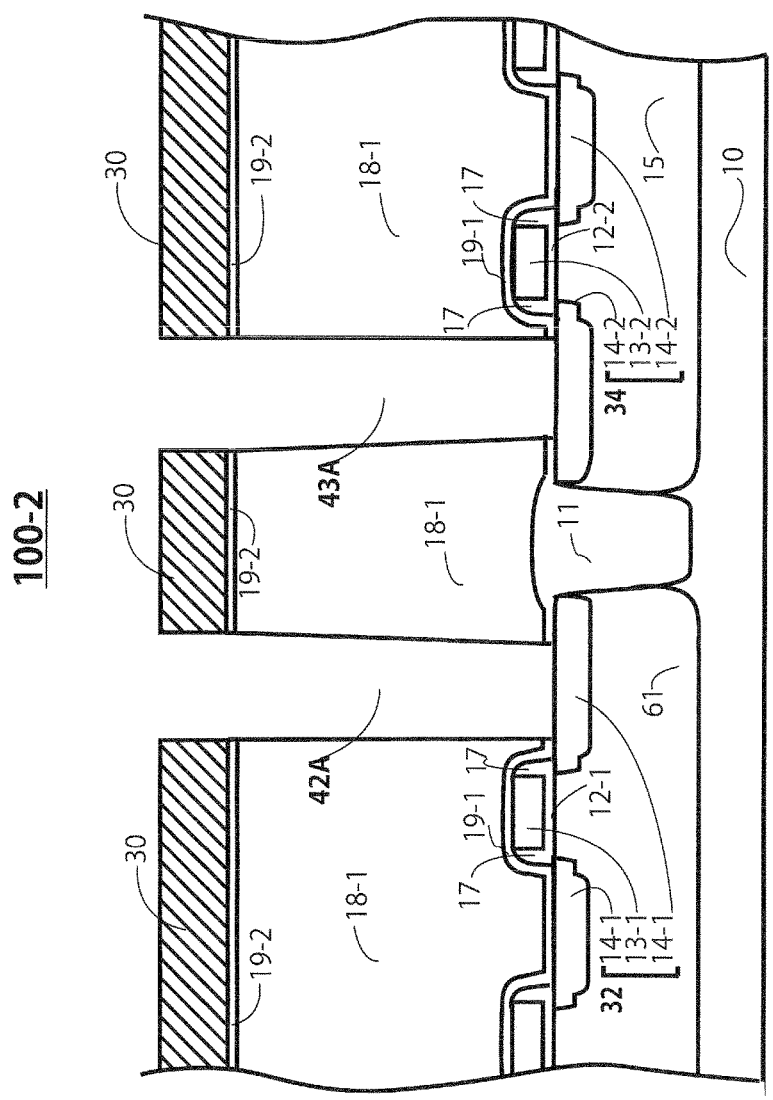
FIG. 31 is a cross sectional view showing an eighth process of the process flow to fabricate the DRAM cell of the first embodiment of the invention.

Referring to FIG. 31, next, holes 42A. 43A are etched, by using generally used contact etching process, through the second stop layer 19-2, an insulating layer 18-1 and a first stop layer 19-1 to source/drain regions 14-1 and 14-2, which will form the memory cell storage portions by using nitride mask 30 as shown in FIG. 31.

Figure 32:
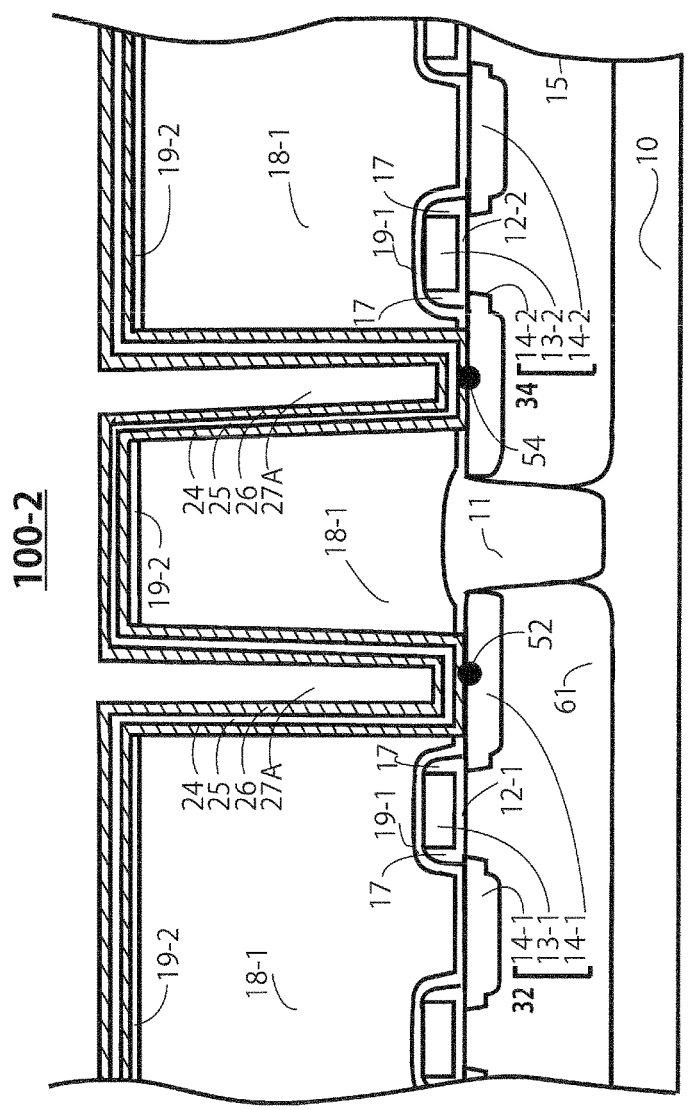
FIG. 32 is a cross sectional view showing a ninth process of the process flow to fabricate the DRAM cell of the first embodiment of the invention.

Referring to FIG. 32, then, a thin barrier metal layer 24, which is composed of such as tantalum nitride or titanium nitride, is deposited over the top surface of the device structure including on the side-walls of the hole openings and the opening bottoms thereof by CVD. The thin barrier metal 24 works not only as a barrier, which is a help for next tungsten deposition and low resistance contact material, but the barrier metal layer 24 becomes one of the two capacitor plates as an important element of the first embodiment of the invention. The thin barrier metal 24 works not only as one of the two capacitor plates but also works as a conductor to connect the N-type transistor 32 to the P-type transistor 34 as an important element of the first embodiment of the invention.

Next, a capacitor dielectric material 25, which has a high dielectric constant such as tantalum oxide, is deposited over the thin barrier metal layer 24 by CVD. As a final step to form a prototype metal-insulator-metal structure, again, a thin barrier metal layer 26, such as tantalum nitride or titanium nitride, is deposited onto the capacitor dielectric material layer 25. The thin second barrier metal 26 works as one of the two capacitor plates as an important element of the first embodiment of the invention.

Figure 33:
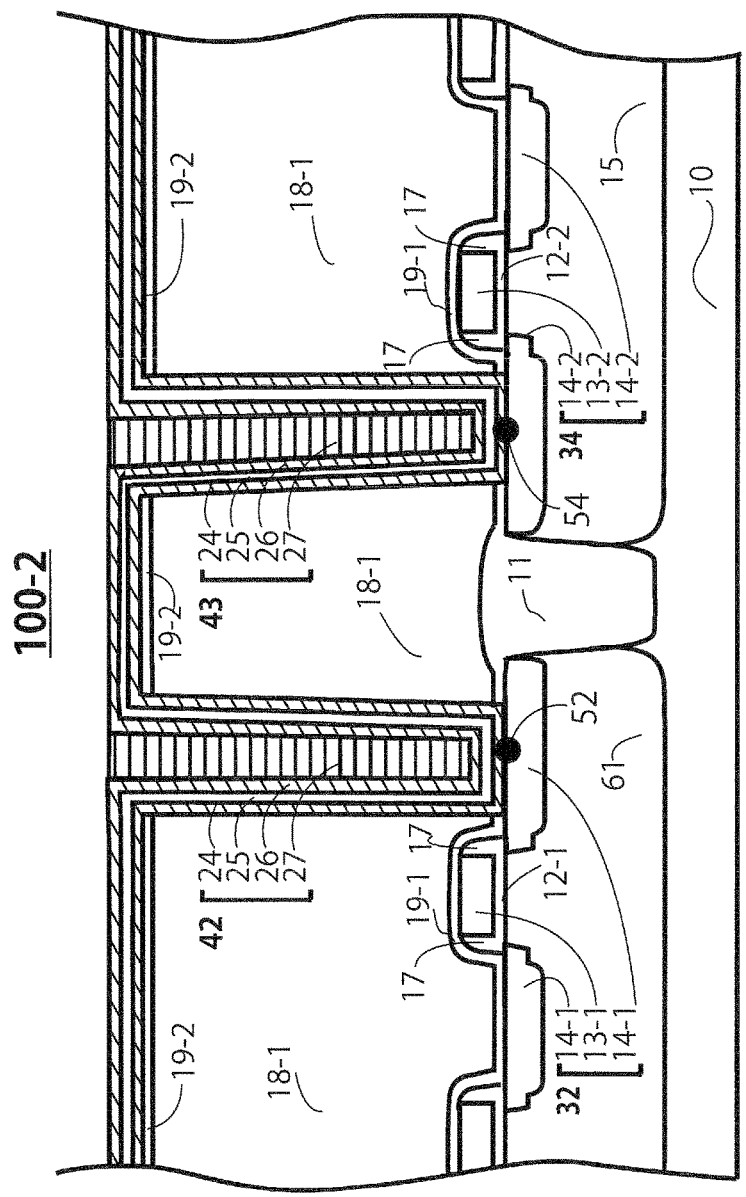
FIG. 33 is a cross sectional view showing an tenth process of the process flow to fabricate the DRAM cell of the first embodiment of the invention.

Referring to FIG. 33, a tungsten plug 27 is deposited to fill the rest of the capacitor contact hole 27A. By the sandwich structure of the barrier metal layers, 24 and 26, and dielectric layer 25, a capacitor is built-up on the substrate 10.

Figure 34:
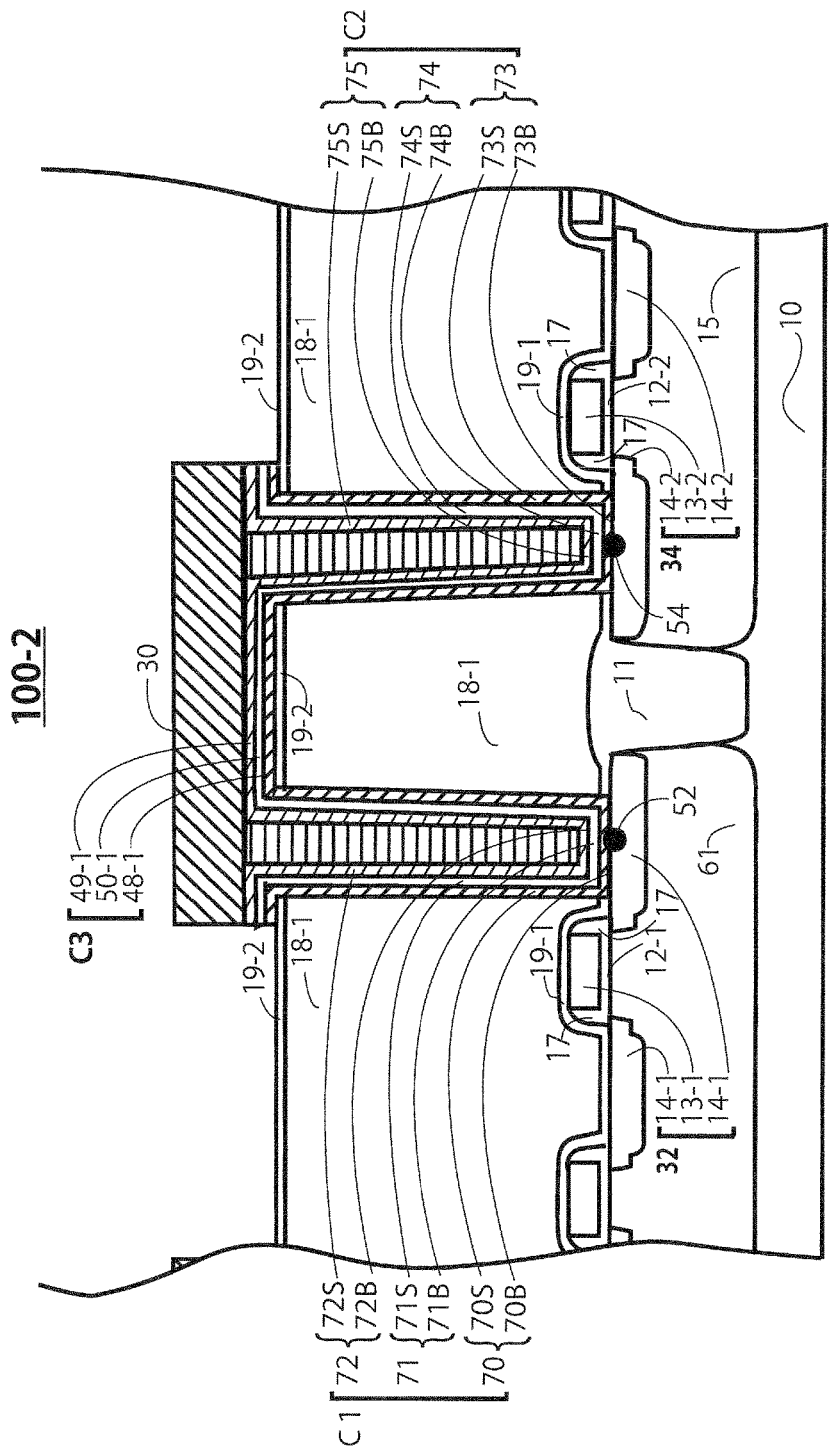
FIG. 34 is a cross sectional view showing a eleventh process of the process flow to fabricate the DRAM cell of the first embodiment of the invention.

Referring to FIG. 34, by the patterning using nitride mask 30, a large capacitor, shown in FIG. 33, is separated to each unit capacitor which is configured by three parallelly-connected capacitor elements including the first to third capacitor elements C1, C2 and C3. In this case, the first capacitor element C1 is formed on a side-wall and a bottom of the filled hole 42 shown in FIG. 33, the second capacitor element C2 is formed on a side-wall and a bottom of the filled hole 43 shown in FIG. 33, and the third capacitor element C3 is formed to connect the first capacitor element C1 to the second capacitor element C2 with its plates serving as bridge conductors.

The common capacitor CCOM is made by a parallel connection of the three first to third capacitor elements C1, C2 and C3. The bottom electrode plate including 76B, 76S, 48-1, 79S and 79B, of the common capacitor CCOM electrically connects a cell-node 52 on a first source/drain region 14-1 of the N-type transistor 32 and a cell-node 54 on a first source/drain region 14-2 of the P-type transistor 34 as an important element of the first embodiment of the invention.

Figure 35:
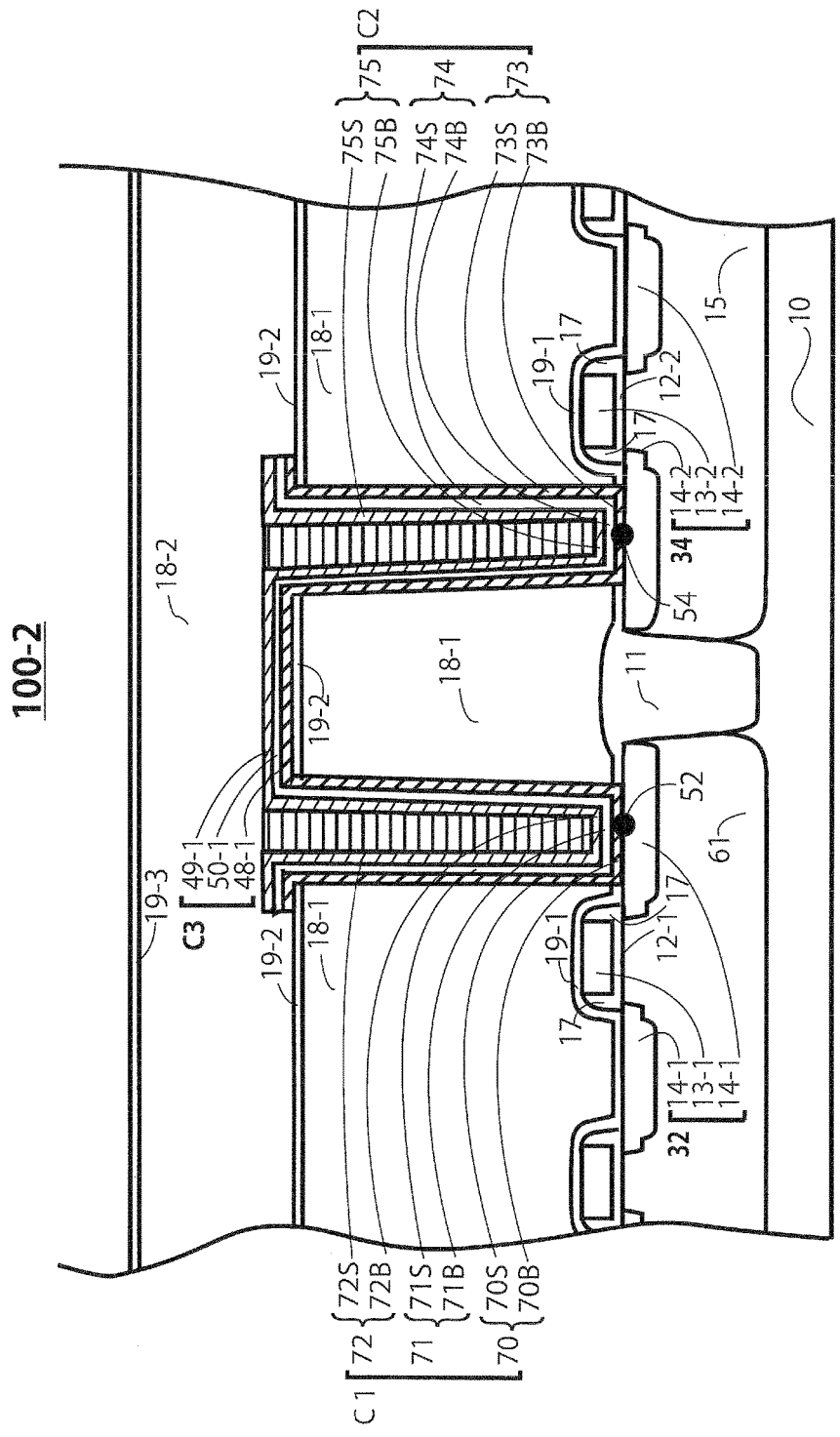
FIG. 35 is a cross sectional view showing a twelfth process of the process flow to fabricate the DRAM cell of the first embodiment of the invention.

Referring to FIG. 35, a thick second insulating layer 18-2 is deposited over the memory cell capacitance units formed in FIG. 34. Next, the top of the thick insulator layer 18-2 is planarized, for example by CMP. Then, a third stop layer 19-3 is deposited on the flatten insulator 18-2's surface.

Figure 36:
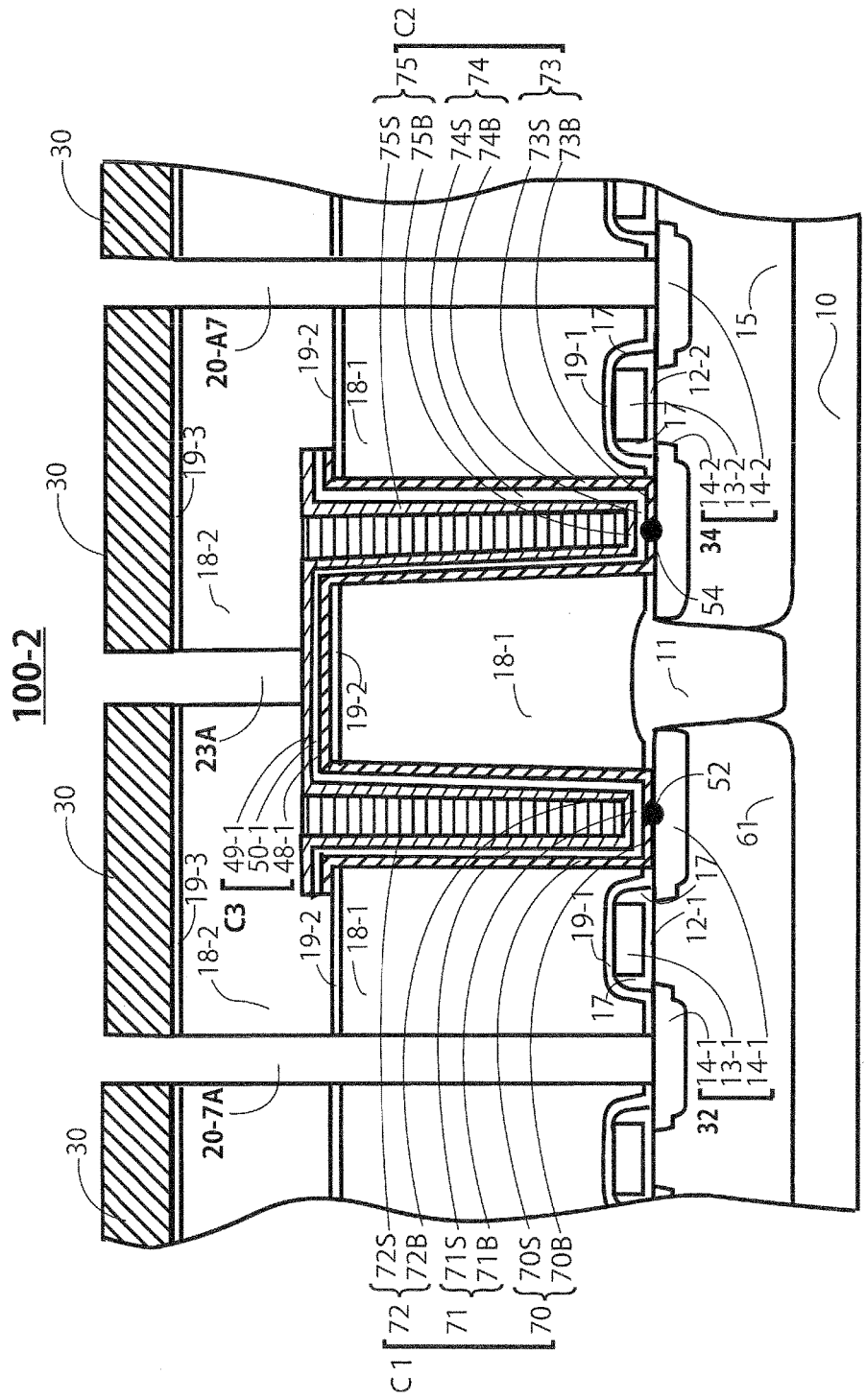
FIG. 36 is a cross sectional view showing a thirteenth process of the process flow to fabricate the DRAM cell of the first embodiment of the invention.

Referring to FIG. 36, next, bit-line contact holes 20-7A are etched through the third stop layer 19-3, second insulator layer 18-2, second stop layer 19-2, the first insulator layers 18-1 and the first stop layer 19-1 to the source/drain regions 14-1 and 14-2, which will form memory cell bit-line nodes by using nitride mask 30 by the patterning using nitride mask 30. At the same timing, a memory cell plate contact hole 23A is also etched through the third stop layer 19-3, the second insulator layer 18-2 to the top surface of the top metal electrode plate 49-1.

Figure 37:
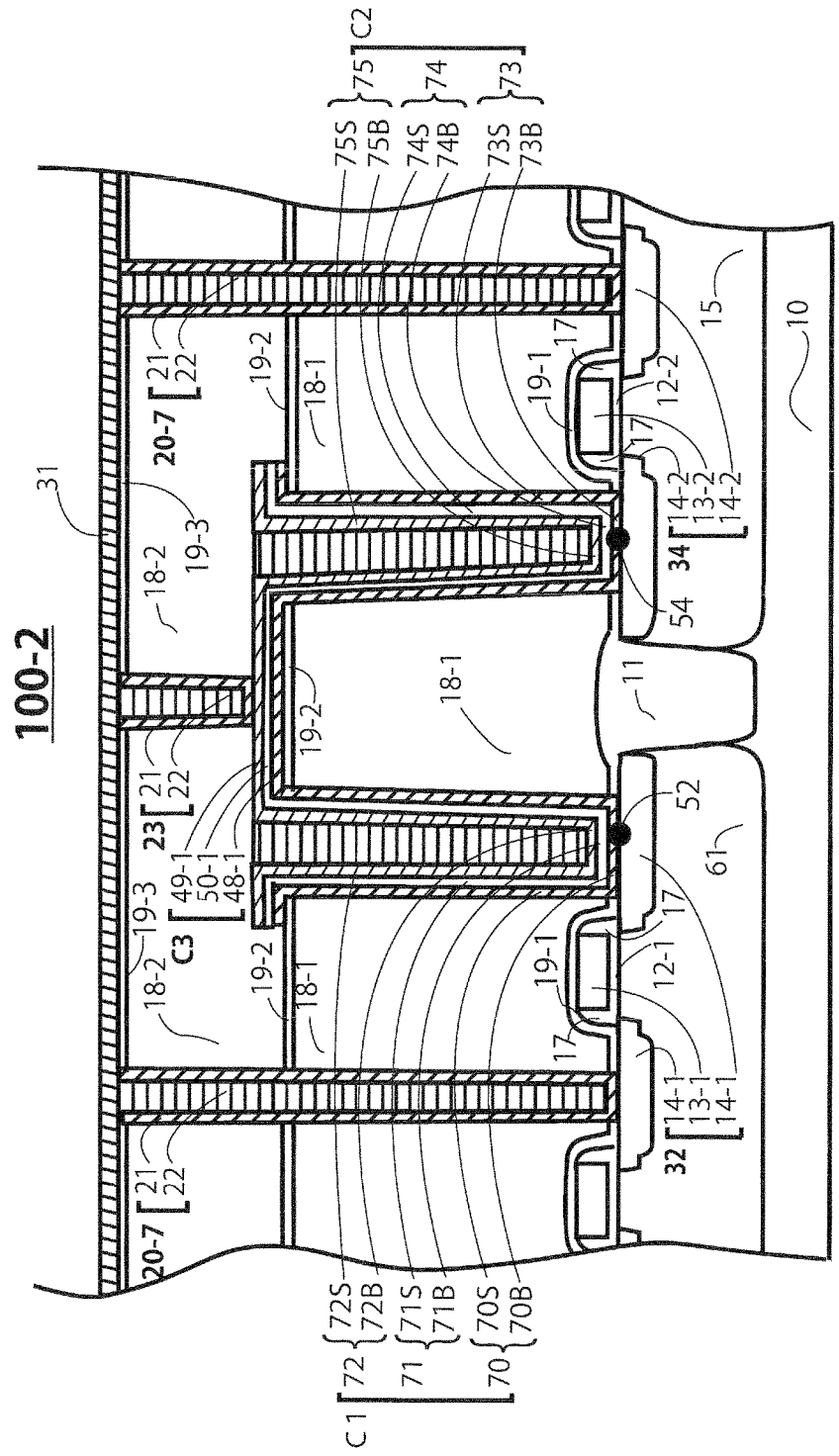
FIG. 37 is a cross sectional view showing a fourteenth process of the process flow to fabricate the DRAM cell of the first embodiment of the invention.

Referring to FIG. 37, then a barrier metal 21, which comprises titanium and titanium nitride, for example, is deposited on the inside the contact holes 20-7A, then, a tungsten plug 22 is filled in the hole. Next, a first metal layer 31 is deposited over the third stop layer 19-3.

Figure 38:
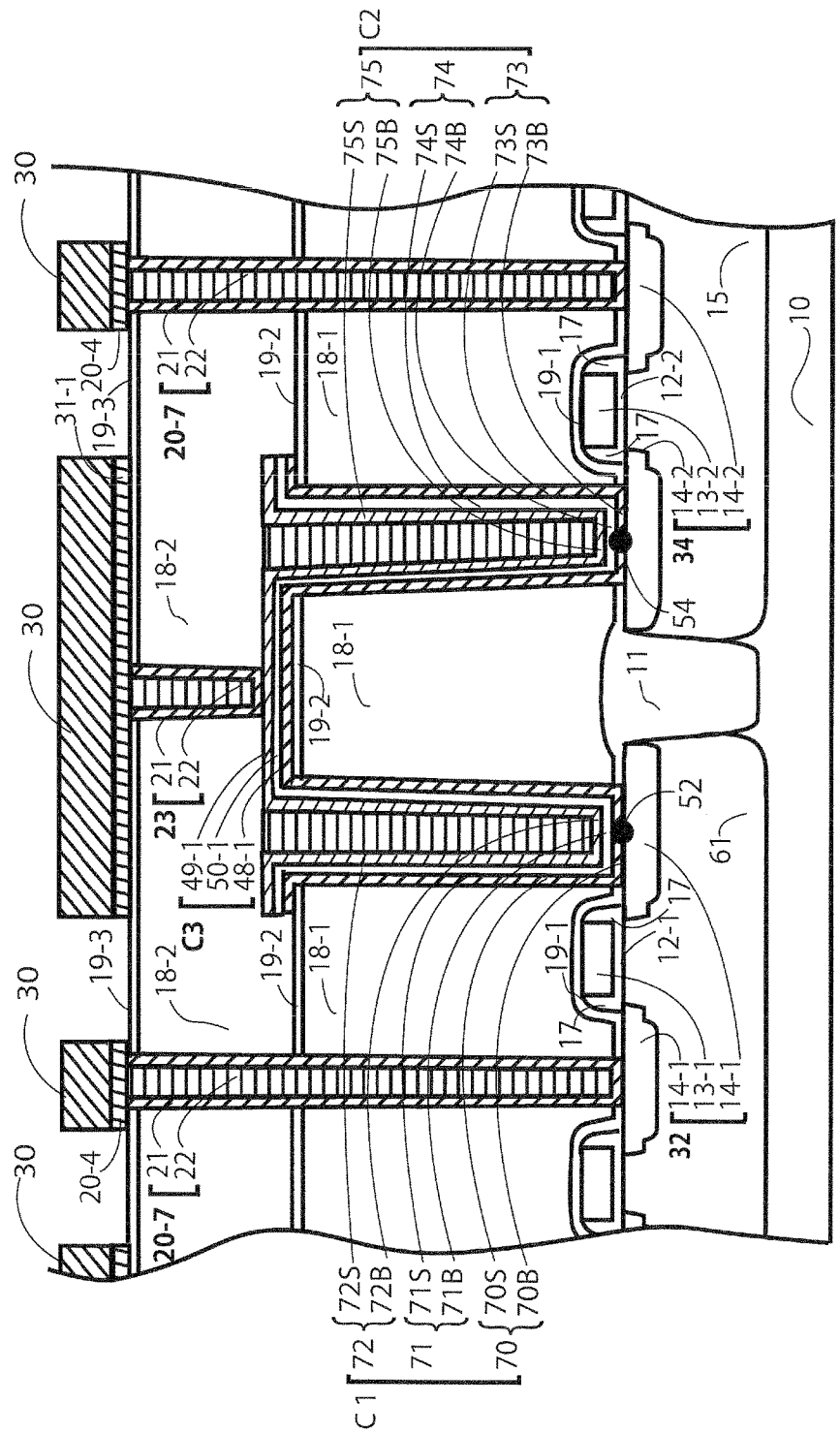
FIG. 38 is a cross sectional view showing a fifteenth process of the process flow to fabricate the DRAM cell of the first embodiment of the invention.

Referring to FIG. 38, then, the nitride mask 30 is deposited over a first metal layer 31. Next, by the patterning of the nitride mask 30, the first metal 31 over the stop layer 19-3 is separated to cell plate pads 31-1 and bit-line pads 20-4.

Figure 39:
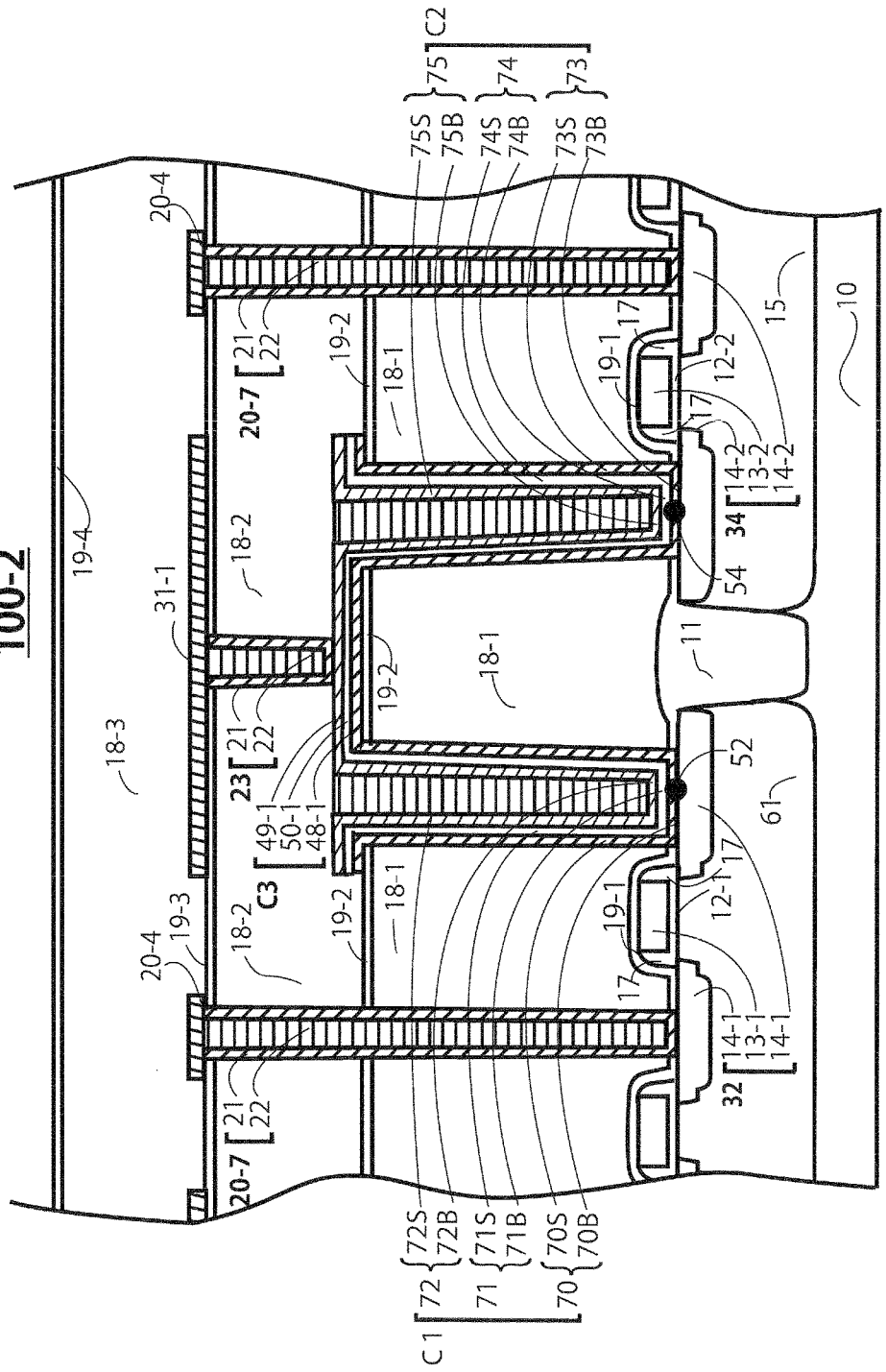
FIG. 39 is a cross sectional view showing a sixteenth process of the process flow to fabricate the DRAM cell of the first embodiment of the invention.

Referring to FIG. 39, after the formations of bit-line pads 20-4 and cell plate pads 31-1, a third insulator layer 18-3 is deposited. Then, the insulator layer 18-3 is planarized, for example by CMP to obtain a flat surface and a fourth stop layer 19-4 is deposited.

Figure 40:
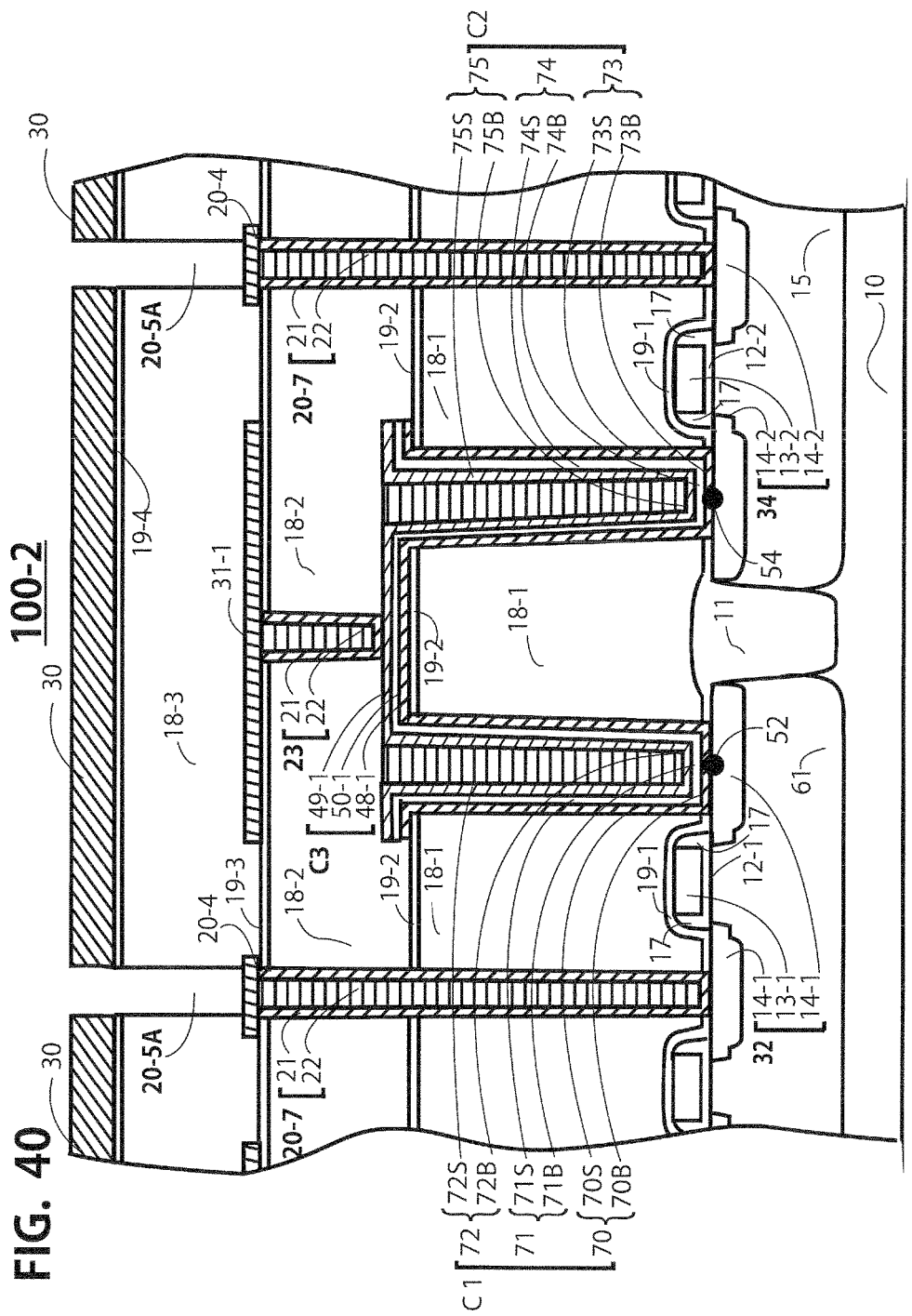
FIG. 40 is a cross sectional view showing an seventeenth process of the process flow to fabricate the DRAM cell of the first embodiment of the invention.

Referring to FIG. 40, next, the nitride mask 30 is deposited over the fourth stop layer 19-4. By the patterning of the nitride mask 30, bit-line contact holes 20-5A are formed by etching through the fourth stop layer 19-4 and the second insulator layer 18-3 to the bit-line pads 20-4.

Figure 41:
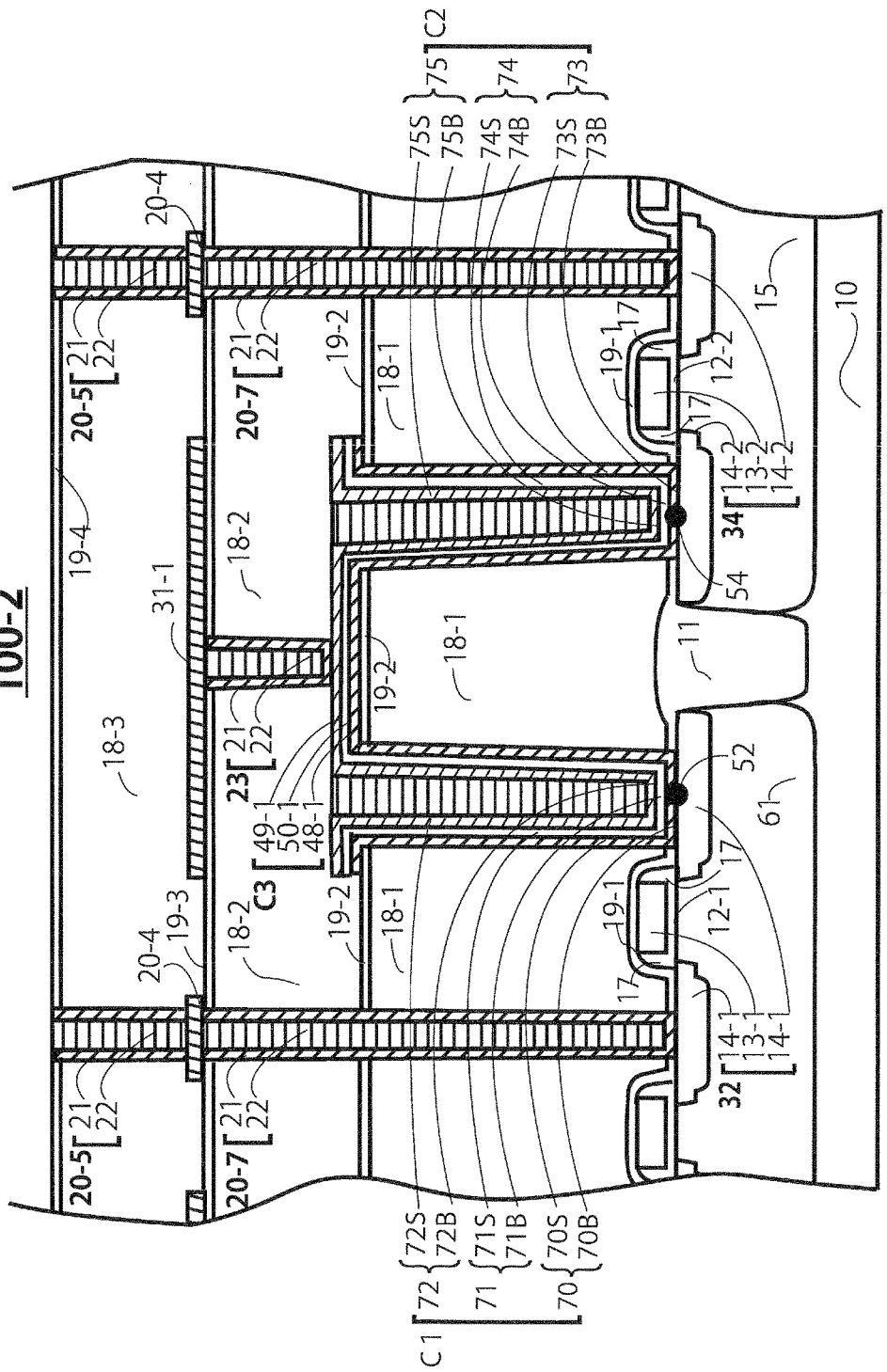
FIG. 41 is a cross sectional view showing a eighteenth process of the process flow to fabricate the DRAM cell of the first embodiment of the invention.

Referring to FIG. 41, then, a barrier metal 21, which includes titanium and titanium nitride, for example, is deposited on the inside the contact holes 20-5A, then, tungsten plug 22 is filled in the contact hole 20-5A.

Figure 42:
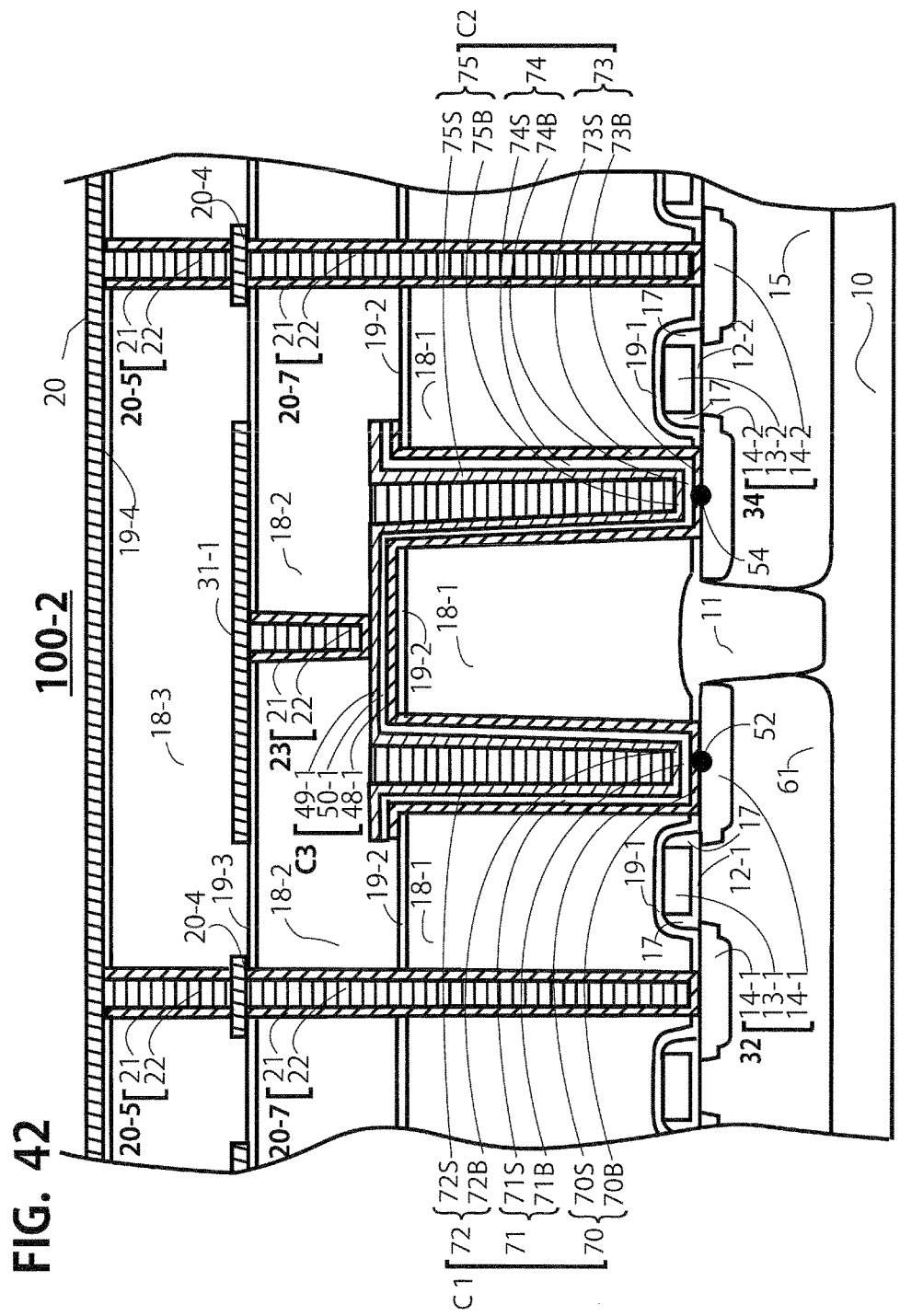
FIG. 42 is a cross sectional view showing a nineteenth process of the process flow to fabricate the DRAM cell of the first embodiment of the invention.

Referring to FIG. 42, finally, a first metal layer 20, which will be a bit-line, is deposited over the fourth stop layer 19-4.

Not shown in FIG. 42, but, after forming the bit-lines by the patterning of this first metal layer 20 by using nitride mask, by next process steps, the final form of the memory cell unit 100-2 of the first embodiment of the invention will be fabricated.

Second Embodiment

Figure 17:
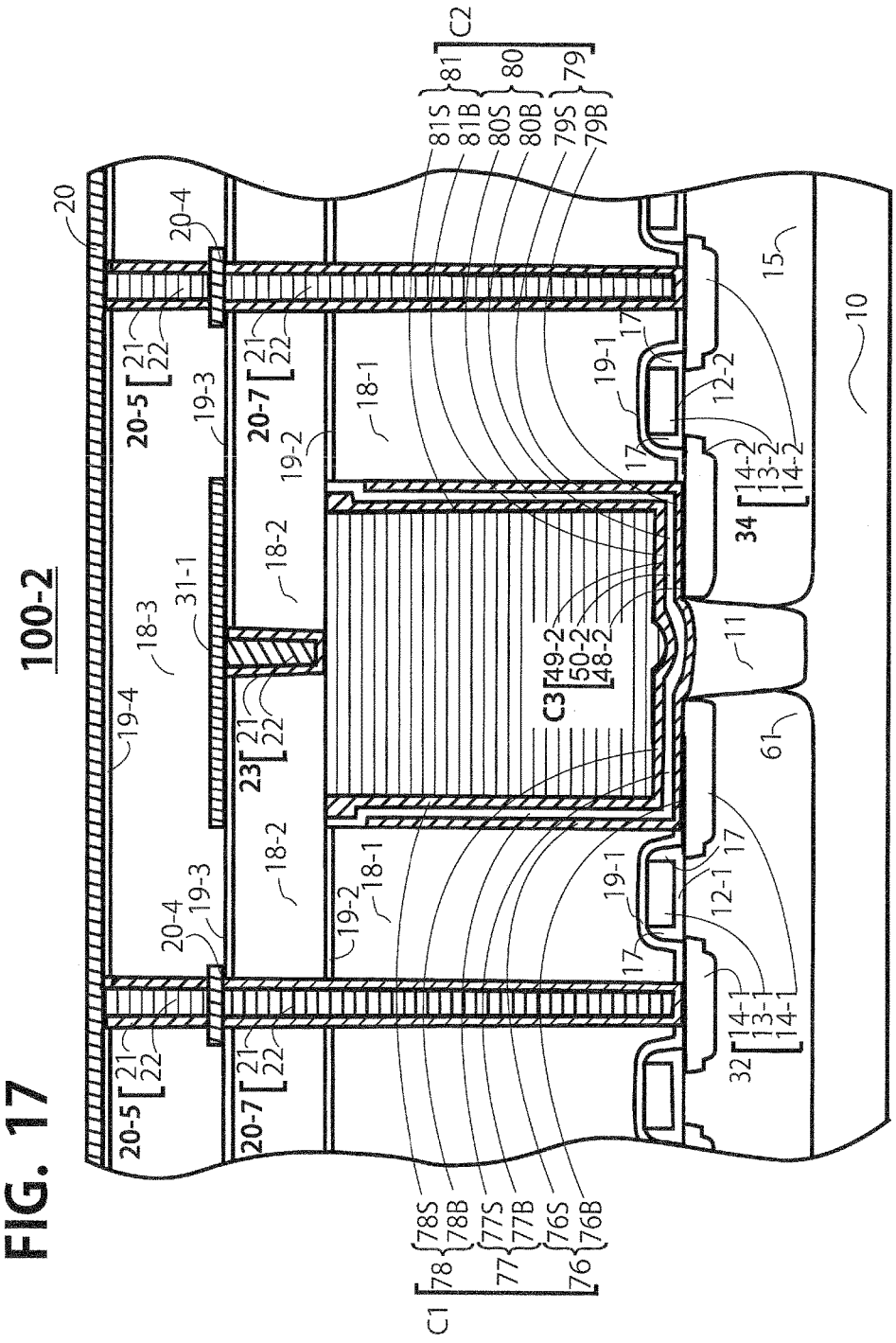
FIG. 17 is a cross sectional view of a two-transistor DRAM cell, which is a second embodiment of the invention, showing a structure taken on line XVII-XVII' of FIG. 18A.
Figures 18A, 18B:
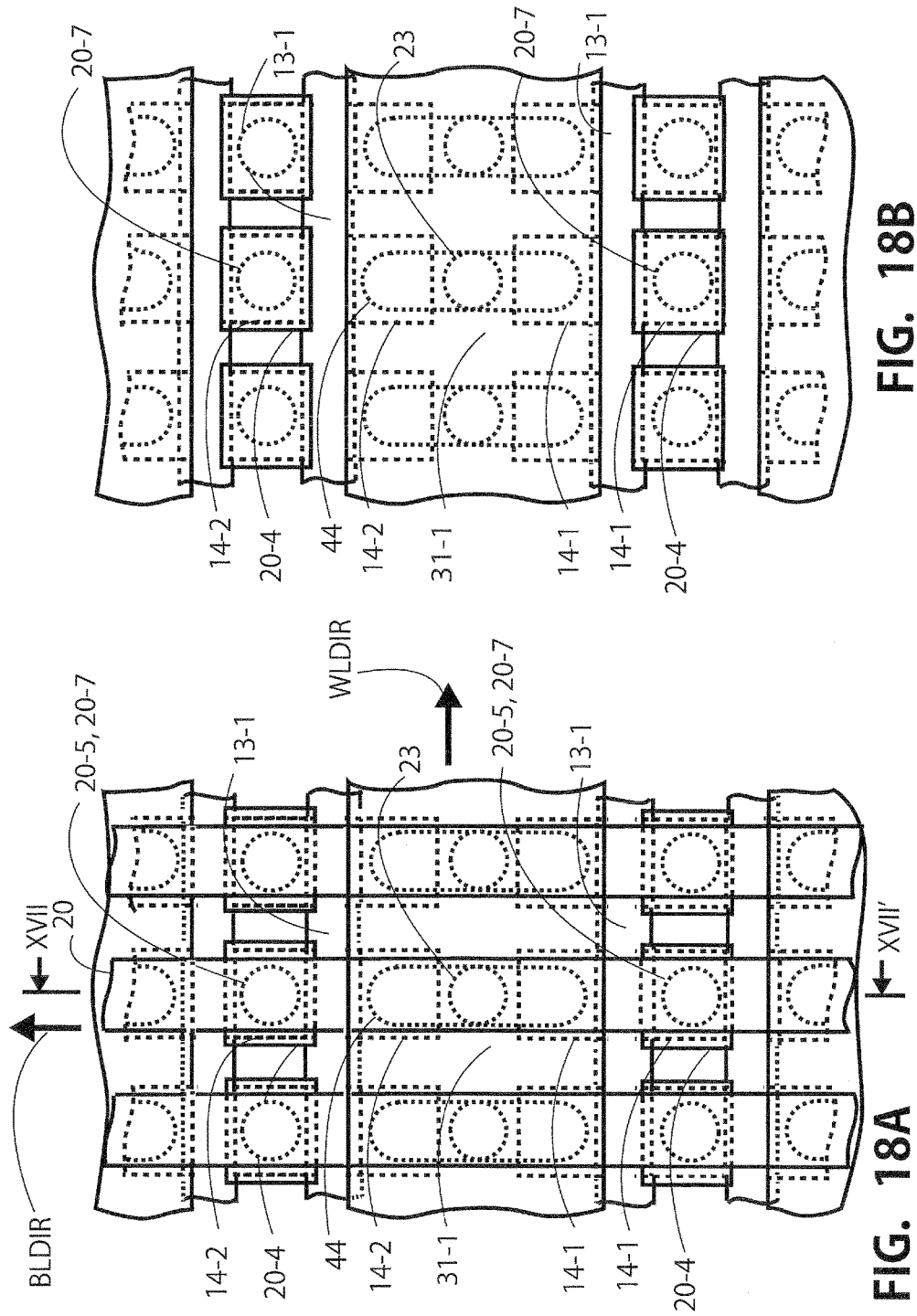
FIG. 18A is a top view showing one example of a memory cell layout configuration in two-transistor DRAM cell according to the second embodiment of the invention.
FIG. 18B is a top view showing the two-transistor DRAM cell layout configuration, in which first metal layers 20 shown in FIG. 8A are removed.

FIG. 17 is a cross sectional view of an example of a DRAM cell according to a second embodiment of the invention, showing a structure taken on line B-B' of FIG. 18A, which shows an example of a first layout configuration of the DRAM cell. FIG. 18B shows a second cell layout configuration, in which a first metal layer 20 and contacts 20-5 penetrating the third insulating layer 18-3, shown in FIG. 18A, are removed. FIG. 18C shows a third DRAM cell layout configuration, in which a second metal layer 31-1, which forms a memory cell plate voltage VPLT wirings, and second metal bit-line pads 20-4 are removed from the second layout configuration shown in FIG. 18B.

The feature of the layout of the second embodiment of the invention is that an N-type transistor 32, a P-type transistor 34 and a common capacitor CCOM are aligned in a bit-line direction BLDIR of the bit-line 20 of FIG. 8A, so that the common capacitor CCOM is arranged between the N-type transistor 32 and the P-type transistor 34, and at substantially a center of the DRAM cell. The top electrode of the common capacitor CCOM connects to a storage plate VPLT supply line 31-1 which is aligned in the word-line direction WLDIR as shown in FIG. 18A.

The main difference between the second embodiment and the first embodiment of the invention is the structure of the common capacitor CCOM. In the first embodiment of the invention, the common capacitor CCOM has a shape of letter "π". In the second embodiment of the invention, the CCOM has a shape of an elliptic cylinder. In the first embodiment, in terms of connections to an adjacent peripheral layer, the third capacitor element C3 of the common capacitance CCOM is formed on the second stop layer 19-2 on the first insulating layer 18-1 above the STI layer 11. On the other hand, in the second embodiment, the third capacitor element C3 is formed directly on the STI layer 11 as shown in FIG. 17. Beside the common capacitor CCOM's structure, other structures and features are similar to those of the first embodiment of the invention.

FIG. 19A is a perspective view of the main parts of the second embodiment of the invention, and the main parts include the N-type transistor 32, the P-type transistor 34 and an elliptic cylinder, which is an entity of the common capacitor CCOM. A cell plate contact 23 is added to the same structure for a later modification's explanation.

As show in FIG. 19A, the outline of the common capacitor CCOM has a shape of elliptic cylinder ELIP, to be more specifically, the elliptic cylinder ELIP is formed by a skin portion CSKIN forming an entity of the common capacitor CCOM including two concentric metal elliptic cylinders and an inside-plugged elliptic cylinder ELPLUG. Not shown in FIG. 19A, the skin portion CSKIN includes an inner elliptic metal cylinder ELCIN, an outer metal cylinder ELCO and dielectric layer DIEL0 in-between as shown in FIG. 19B, which is a cross sectional view of the second embodiment of the invention, taken on a line XIXB-XIXB' of FIG. 19A.

The common capacitor CCOM of the second embodiment includes three capacitor elements, namely, a first capacitor element C1, a second capacitor element C2 and a third capacitor element C3. The common capacitor CCOM of the second embodiment of the invention is formed on three locations as shown in FIG. 19A, the first capacitor element C1 is formed on a surface SURN, including a cell-node 52 thereon, of a first source/drain region 14-1 of N-type transistor 32. The second capacitor element C2 is formed on a surface SURP, including a cell-node 54 thereon, of a first source/drain region 14-2 of the P-type transistor 34. The third capacitor element C3 is formed on a surface SURSTI of a shallow trench insulating region 11.

As for a modification, there is such a case that the third capacitor element is formed on a stop layer being formed on the surface SURSTI of a shallow trench insulating region 11.

Figure 19C:
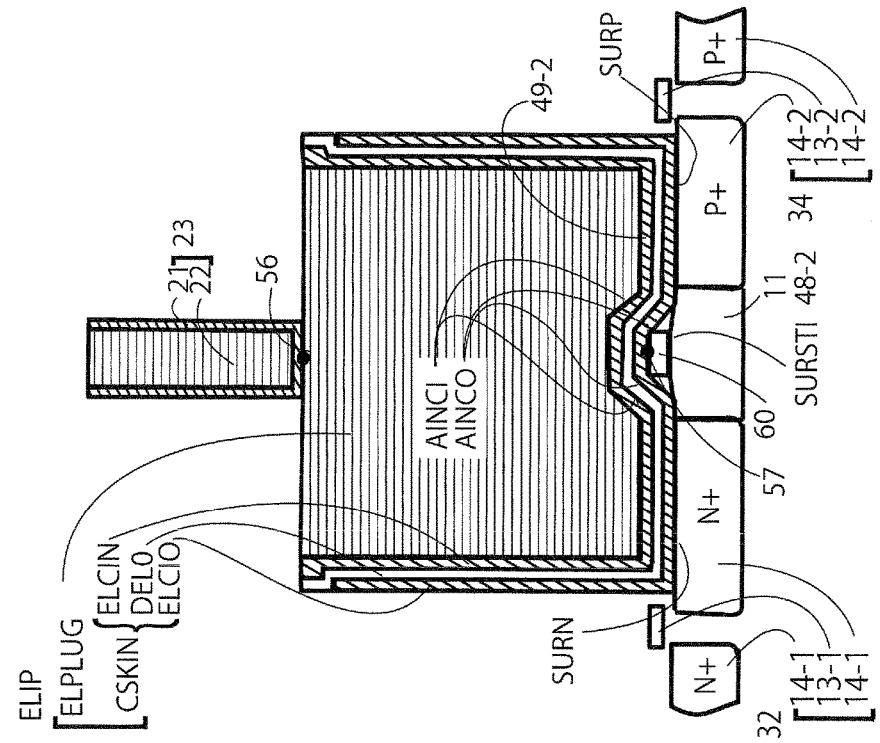
FIG. 19C is a cross sectional view of a third modification of the second embodiment of the invention, taken on the line XIXB-XIXB' of FIG. 19A.
Figure 19B:
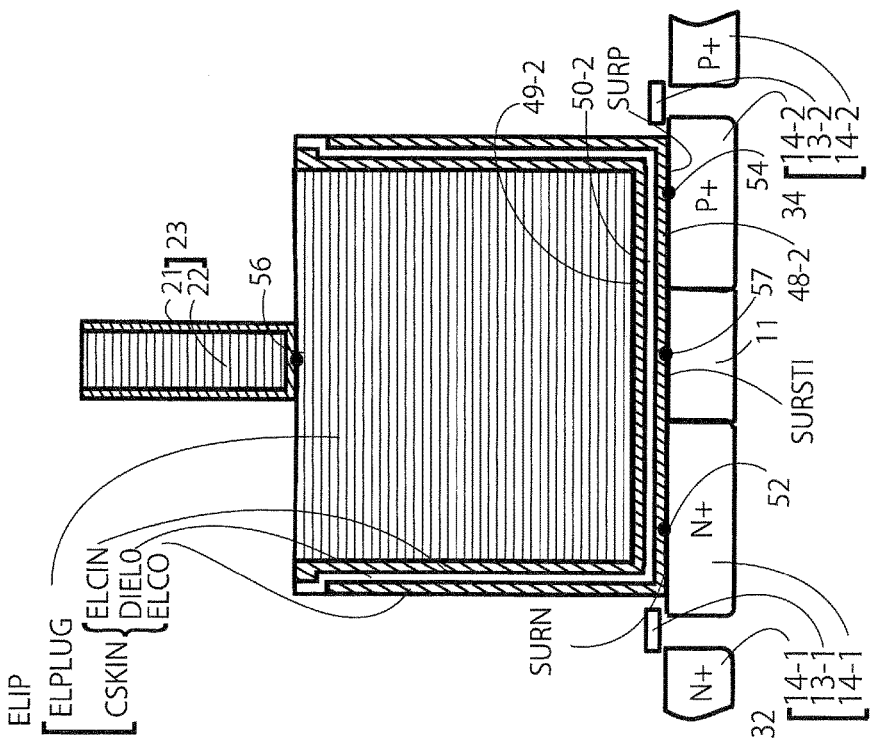
FIG. 19B is a cross sectional view of the second embodiment of the invention, taken on a line XIXB-XIXB' of FIG. 19A.

FIG. 19C shows a modification example of the FIG. 19B, showing such a case that a buffer polysilicon layer 60 is formed as a hard-etching stop layer on a surface SURSTI of shallow trench insulating region 11. By the additional buffer polysilicon layer 60, a center portion of bottoms, over a node 57, of the outer metal cylinder ELCO and inner elliptic metal cylinder ELCIN rise to increase the third capacitor element at the portions of an AINCI and an AINCO as shown in FIG. 19C.

Figure 20:
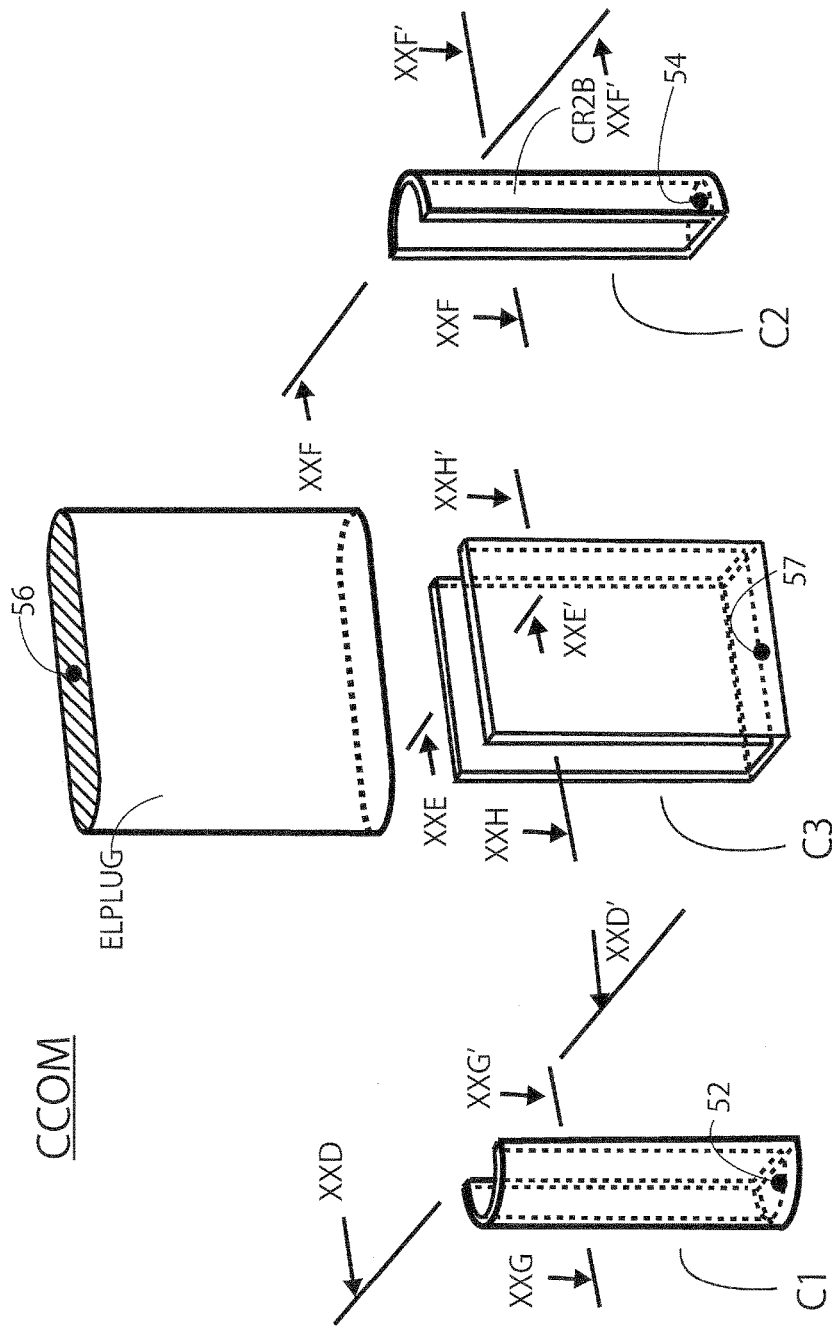
FIG. 20 is an exploded perspective view of parts of a common capacitor of the second embodiment of the invention.

FIG. 20 is an exploded perspective view of four main parts of the common capacitor CCOM, including the first capacitor element C1, the second capacitor element C2, the third capacitor element C3, and the inside plugged elliptic cylinder ELPLUG, which is also shown in FIG. 19A. As shown in FIG. 20, the first capacitor element C1 and the second capacitor element C2 have a shape of semicircular cylinder, and the third capacitor element C3 has a shape of U-shaped groove. FIGS. 20A, 20B and 20C show respective three capacitor elements C1, C2 and C3, more precisely.

In this case, the first capacitor element C1 includes an outer metal semicircular cylinder 76 and an inner metal semicircular cylinder 78 as shown in FIG. 20A. The second capacitor element C2 includes an outer metal semicircular cylinder 79 and an inner metal semicircular cylinder 81 as shown in FIG. 20C. The third capacitor element C3 includes an outer metal U-shaped groove 48-2 and an inner metal U-shaped groove 49-2 as shown in FIG. 20B.

The first capacitor element C1 is formed in metal side-wall portions 76S and 78S, and bottom portions 76B and 78B of the inner and outer metal semicircular cylinders 76 and 78 as shown in FIG. 20A. The second capacitor element C2 is similarly formed in metal side-wall portions 79S and 81S, and bottom portions 79B and 81B of the inner and outer metal semicircular cylinders 79 and 81, as shown in FIG. 20C. The third capacitor element C3 is formed in each left metal side-wall portion 48-2SL and 48-2SL, and in each right metal side-wall portion 48-2SR and 49-2SR, and in each bottom portion 48-2B and 49-2B, of the outer and inner metal U-shaped grooves 48-2 and 49-2 as shown in FIG. 20B.

In the first capacitor element C1, a dielectric layer 77 is sandwiched between the outer metal semicircular cylinder 76 and the inner metal semicircular cylinder 78 as shown in FIG. 20D. In the second capacitor element C2, a dielectric layer 80 is sandwiched between the outer metal semicircular cylinder 79 and the inner metal semicircular cylinder 81 as shown in FIG. 20F. In the third capacitor element C3, a dielectric layer 50-2 is sandwiched between the outer metal U-shaped groove 48-2 and the inner metal U-shaped groove 49-2 as shown in FIG. 20E.

In the cross-sectional view shown in FIG. 20D, the portions ENDLA and ENDRA of capacitor edge structure being top end portions of the left and right metal side-wall, have a unique layer structure in a length of a distance "DIS" from a top end level of the side-walls of the first capacitor element C3, as shown in FIG. 20D, which is one of the present invention's uniqueness. In the portions ENDLA and ENDRA, the portions of the dielectric side-wall layer 77S of the dielectric layer 77 and the metal side-wall 78S of the inner metal semicircular cylinder 78 make a unique cross-sectional pattern, that is, two letter "L"s by the two layers are inverted up and down to face each other and to connect perfectly, while a bottom-end of the metal side-wall 76S is placed below of them having the distance "DIS" from the top end of the metal side-wall 78S of the inner metal semicircular cylinder 78.

This structure is important feature for the common capacitor CCOM of the second embodiment of the invention, because the unique structure enables to prevent an expected electrical-short between the metal side-wall 76S, which is not only the outer semicircular cylinder 76 and but also the bottom metal electrode plate of the first capacitor element C1, and the metal side-wall 78S, which is the outer semi-circular cylinder 78 but also the top metal electrode plate of the first capacitor element C1, by not exposing both end-planes of the metal side-walls, side-by-side on a common top-ends' cut-section plane, and by placing the top-end of the metal side-wall 76S below thereof keeping an enough distance "DIS" from the top-end of the metal side-wall 78S and keep an internal distance "DDIE" in-between thereof inside the side-wall of the first capacitor element C1 by a thickness of the dielectric layer' 77, shown in FIG. 20D.

Hereafter, the unique structure is named as "Double Inverted Facing L-shapes" for the convenience of following explanation. Note that the "Double Inverted Facing L-shapes" can be seen anywhere at the top-end of the side-wall of the first capacitor element C1.

As shown in FIG. 20E, portions ENDLC and ENDRC have also the same "Double Inverted Facing L-shapes" at the same places with the portions ENDLA and ENDRA. As the portions ENDLA and ENDRA, the portions ENDLC and ENDRC also work to prevent outer metal U-shaped groove 48-2, which is the bottom metal electrode plate of the third capacitor element C3, and the inner metal U-shaped groove 49-2's electrical short, where the inner metal U-shaped groove 49-2 is the top metal electrode plate of the third capacitor element C3, Note that, as shown in the explanation of the portions ENDLA and ENDRA, the "Double Inverted Facing L-shapes" can be seen anywhere at the top-end of the left and right side-walls of the third capacitor element C3.

As shown in FIG. 20F, portions ENDLB and ENDRB have also the same "Double Inverted Facing L-shapes" at the same places with the portions ENDLA and ENDRA. In a manner similar to those of the portions ENDLA and ENDRA, the portions ENDLB and ENDRB work to prevent outer metal semicircular cylinder 79, which is the bottom metal electrode plate of the second capacitor element C2, and the inner metal semicircular cylinder 81's electrical short, where the inner metal semicircular cylinder 81 is the top metal electrode plate of the second capacitor element C2. Note that, as shown in the explanation of the portions ENDLA and ENDRA, the "Double Inverted Facing L-shapes" can be seen anywhere at the top-end of the side-wall of the second capacitor element C2.

FIG. 20G, FIG. 20H and FIG. 20I show cross-sectional views cutting the first, third and second capacitor elements C1, C3 and C2, horizontally, respectively. No matter where these capacitor elements C1, C2 and C3 being cut side-ways below the distance "DIS", anywhere under the "Double Inverted Facing L-shapes", Metal-Insulator-Metal capacitor structure can be seen.

Figure 20L:
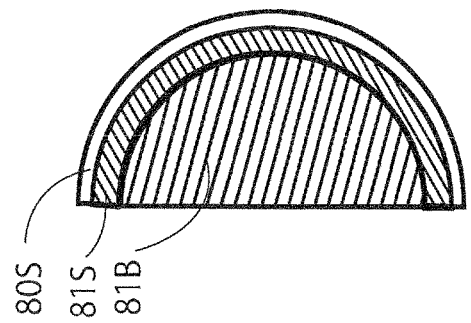
FIG. 20L is a top view of the second capacitor element C2 of the second embodiment of the invention.
Figure 20K:
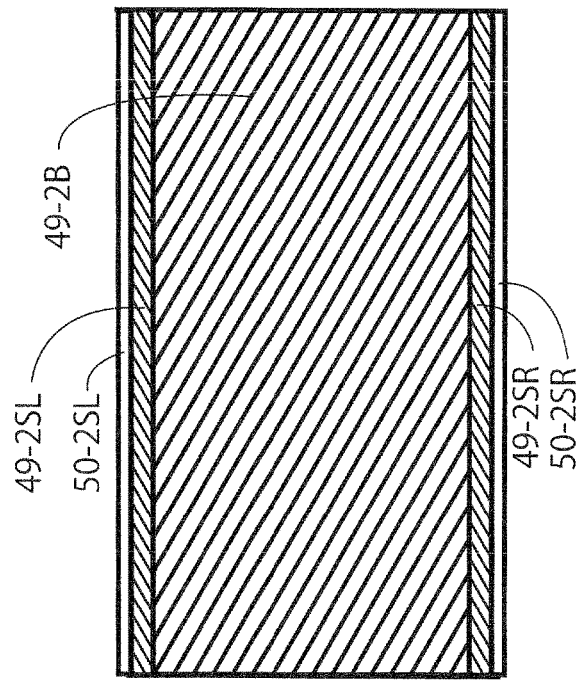
FIG. 20K is a top view of the third capacitor element C3 of the second embodiment of the invention.
Figure 20J:
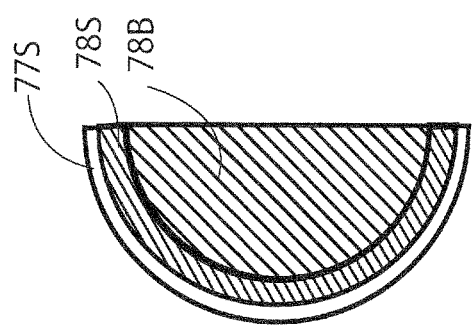
FIG. 20J is a top view of the first capacitor element C1 of the second embodiment of the invention.

When it comes to the "Double Inverted Facing L-shapes", as shown in FIG. 20J, FIG. 20K and FIG. 20L, top views of the first capacitor element C1, the third capacitor element C3 and the second capacitor element C2 show the physical characteristic evidently, respectively.

In the top views, the top-ends of the outer semicircular cylinders' sidewalls, the metal side wall 76S for the first capacitor element C1, the metal side wall 48-2S for the third capacitor element C3 and the metal side wall 79S for the second capacitor element C2, are not observed: because they are hidden by the dielectric side-wall 77S, the dielectric layer 50-2S and the dielectric side-wall 80S by the "Double Inverted Facing L-shapes".

In summary of the characteristics of the second embodiment of the invention, the CSKIN, shown in FIGS. 19A, 19B and 19C, is an entity of the common capacitor CCOM including a Metal-Insulator-Metal or M-I-M capacitor composed of a metal side-wall portion and a bottom metal layer portion, and the edge-line portion of the top-end of the CSKIN have the "Double Inverted Facing L-shapes" structure all over for ensuring the protection of expected current leak problem between the edge of the top metal electrode plate and the edge of the bottom metal electrode plate of the common capacitor CCOM.

The unique cross-sectional pattern, "Double Inverted Facing L-shapes" is one of important features of the second embodiment of the invention.

FIG. 20M is a perspective view of a first modification of the first modification of the second embodiment of the invention. In an actual semiconductor process, when a contact layout mask data size is made by using around minimum design rule size when conventional semiconductor process technology is used, even if a rectangle contact mask data is used, the physical shape of the contact hole becomes cylindrical or nearly cylindrical because angles of the rectangle are rounded. However, when the contact process was good enough to shape a rectangle hole without not so much angle rounding, rectangle shape common capacitor in the second embodiment might be considered as shown in FIG. 20M, in which the cell-plate contact 23 and common capacitor CCOM's actual outline RECT have shapes of rectangular as shown in FIG. 20M.

Figure 21:
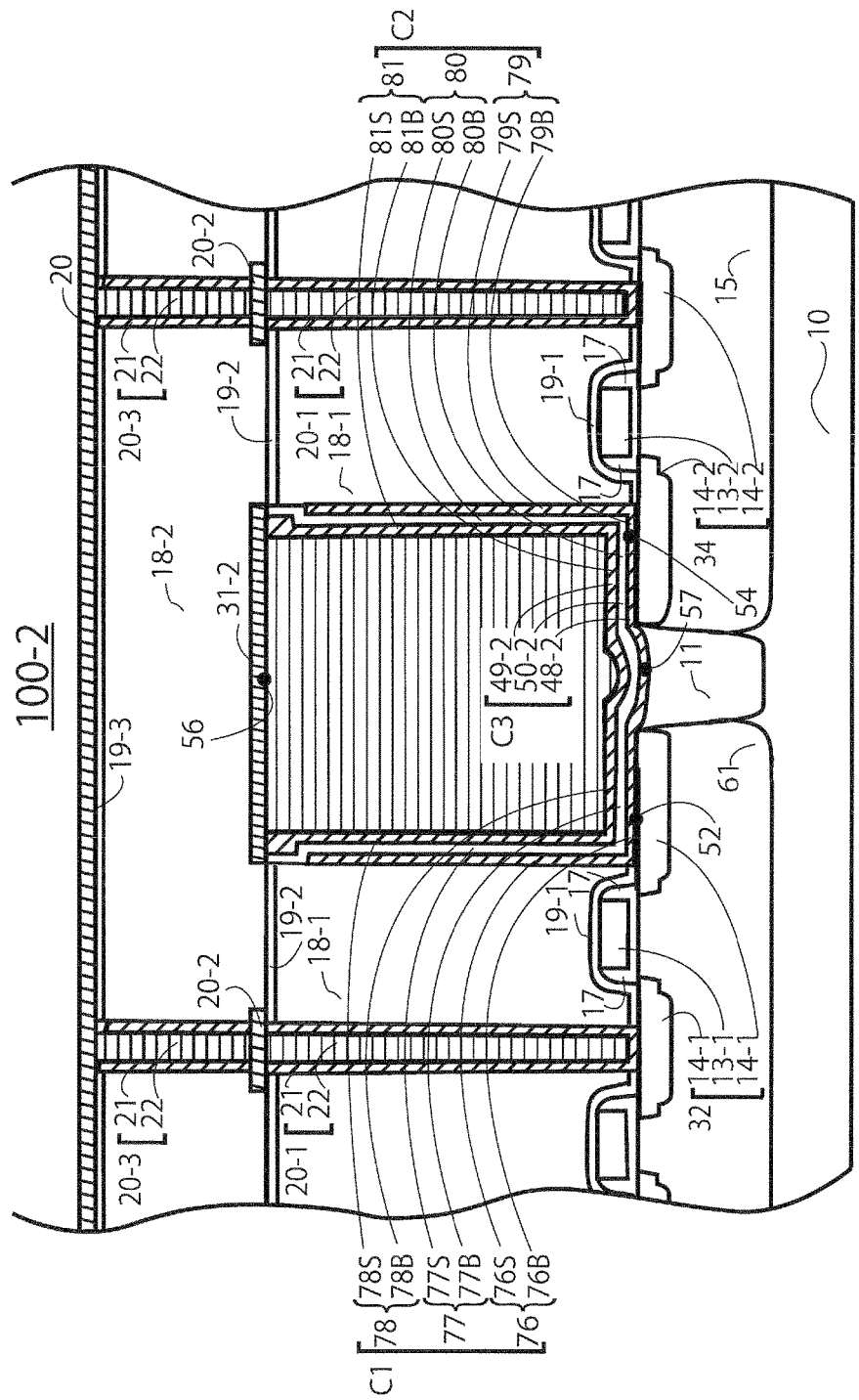
FIG. 21 is a cross sectional view of a DRAM cell, which is a second modification of the second embodiment, taken on a line B-B' of FIG. 18A.

FIG. 21 shows a second modification of the second embodiment of the invention. This is a modification where there is no cell-plate contact 32 and no second metal line 31-1 to which the cell plate voltage VPLT is supplied. Instead of the cell-plate contact 32 and second metal 31-1, the second modification of the second embodiment has a second metal layer 31-1 electrically connected to the top metal electrode plate 49-1 of the third capacitor C3 for a wiring to the cell plate voltage VPLT.

Figure 22:
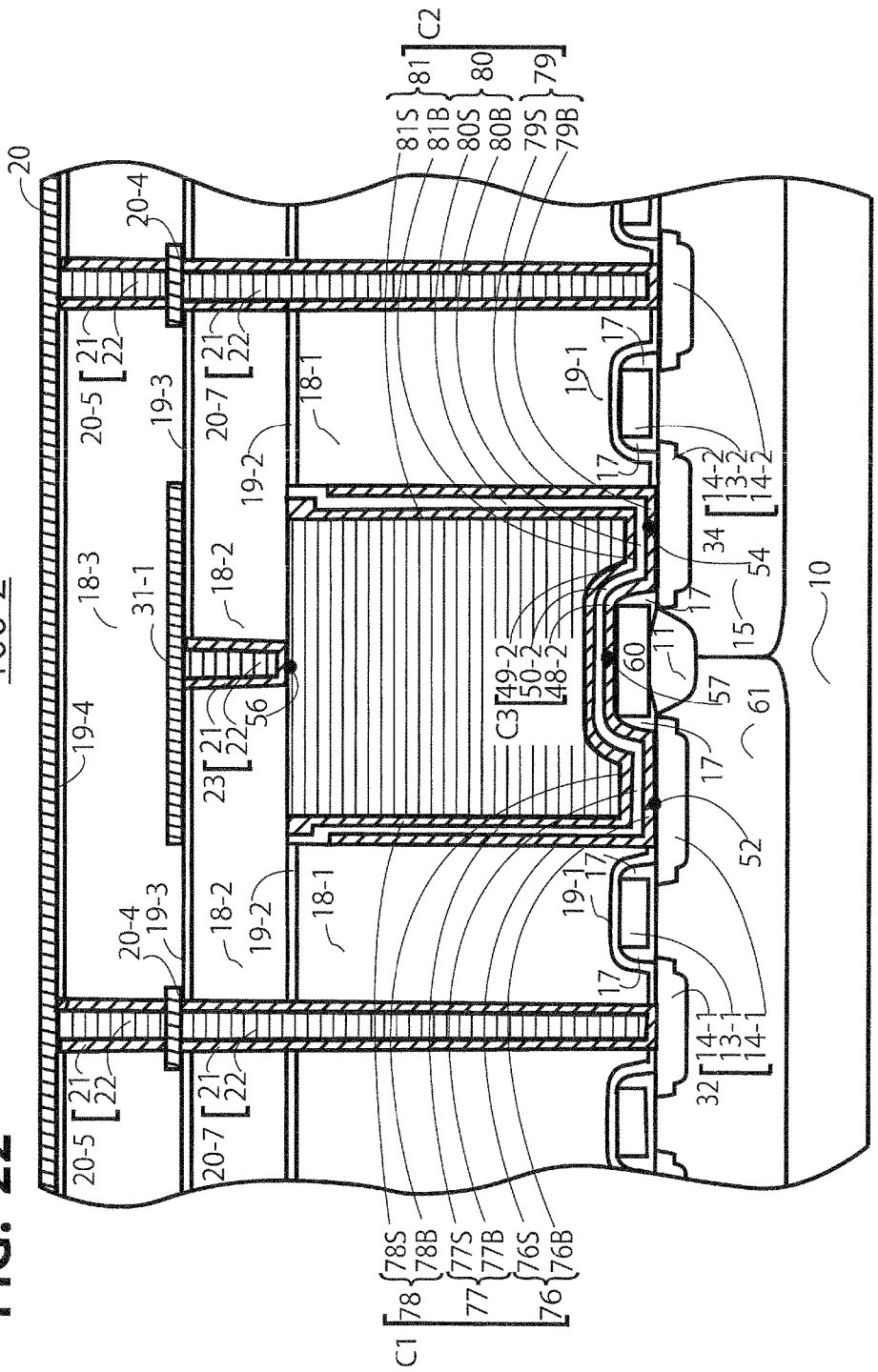
FIG. 22 is a cross sectional view of a DRAM cell, which is a third modification of the second embodiment, taken on the line B-B' of FIG. 18A.

FIG. 22 shows a third modification of the second embodiment of the invention. This is a modification to add a buffer polysilicon gate 60 over a shallow trench insulating region 11 as shown in FIG. 22. The buffer polysilicon gate 60 works as a reliable etching stop when forming a hole in which the common capacitor CCOM is fabricated. Without a hard-stop layer as the buffer polysilicon gate 60 over a shallow trench insulating region 11, there is such a risk that an over-etching might erode the shallow trench insulating region 11, and might cause an electrical short between an N-type transistor and a P-type transistor.

Figure 23:
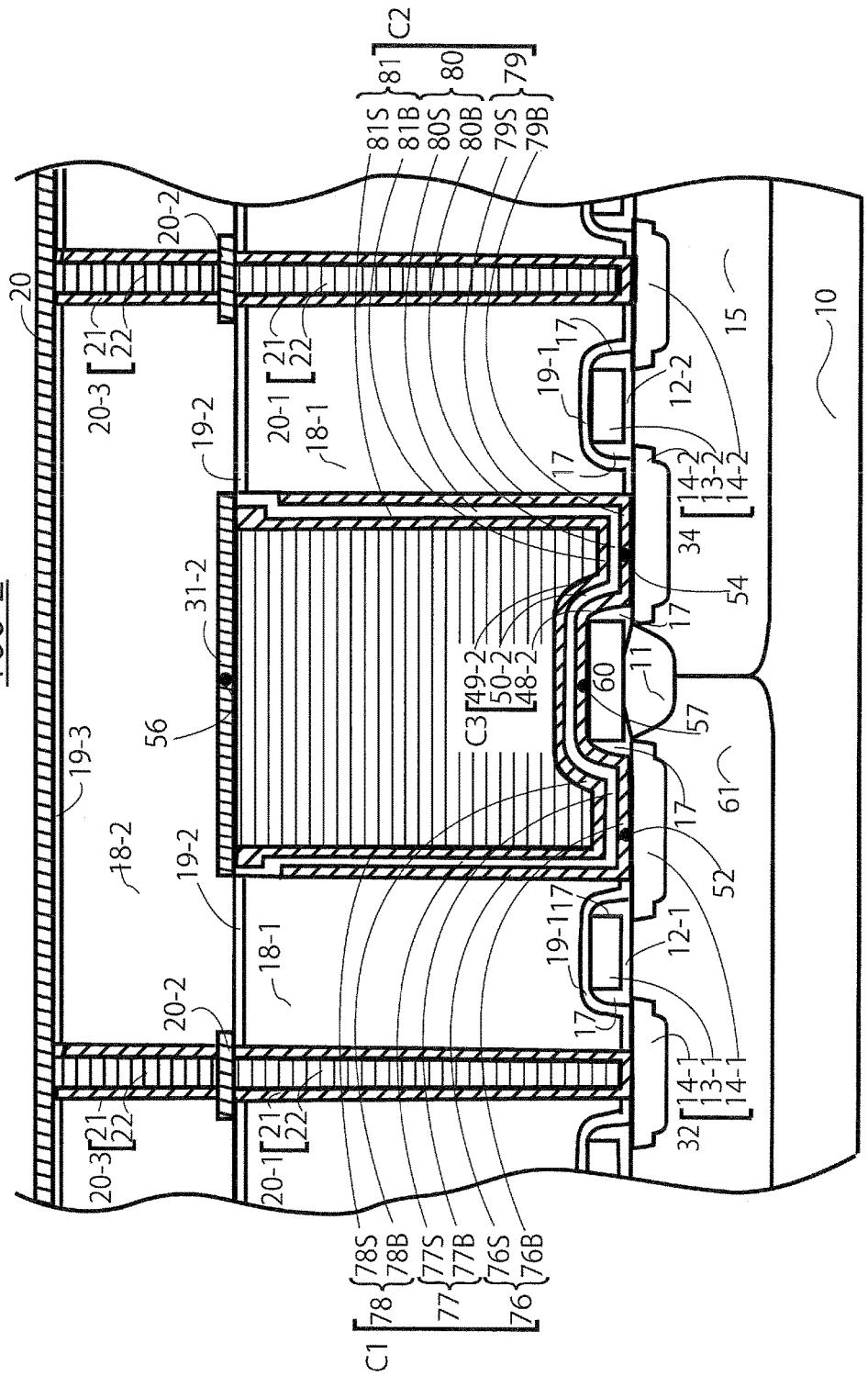
FIG. 23 is a cross sectional view of a DRAM cell, which is a modification of the second modification of the second embodiment, taken on the line B-B' of FIG. 18A.

FIG. 23 shows a modification of the second modification of the second embodiment of the invention. As shown in FIG. 23, a buffer polysilicon gate 60 is added to the second modification of the second embodiment, which is shown in FIG. 21.

Figure 43:
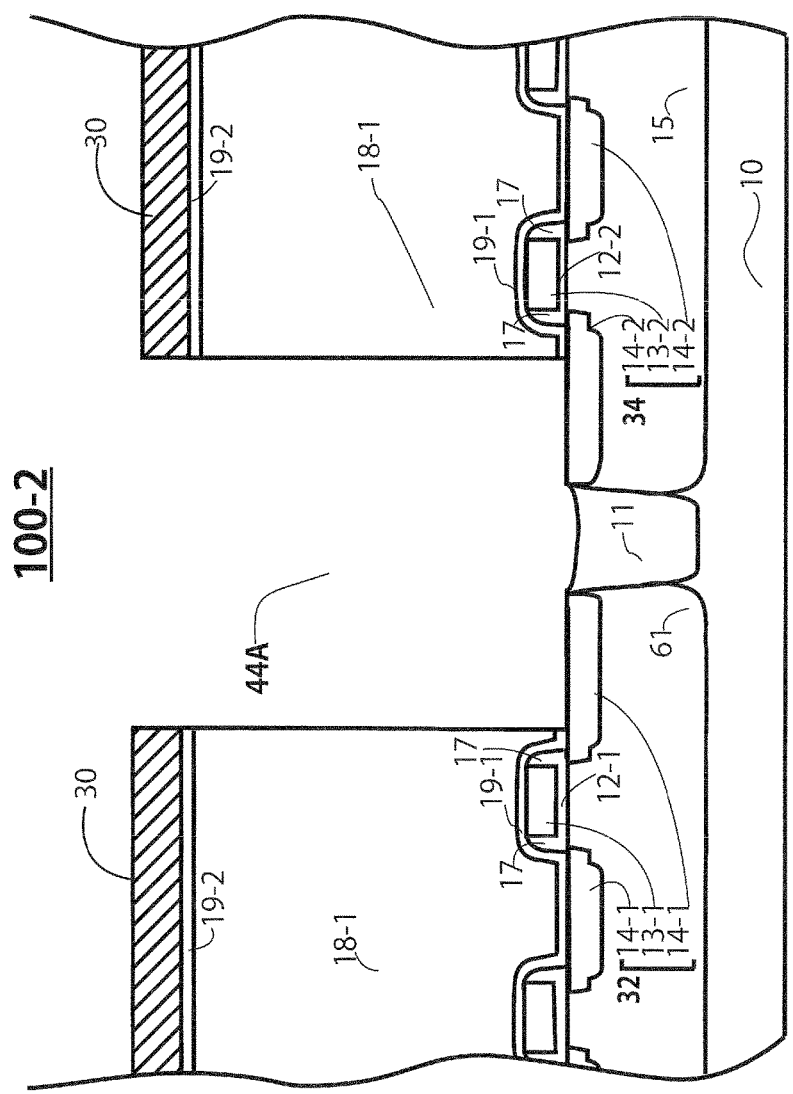
FIG. 43 is a cross sectional view of a first process of a process flow to fabricate the second embodiment of the invention.

Next, how to fabricate the second embodiment of the invention is explained according to the following process steps with reference to FIG. 43 to FIG. 51. Previous process steps before FIG. 43 is omitted because the process step before FIG. 43 are similar to the process steps with F26-30 used for the explanation of the first embodiment.

Referring to FIG. 43, by using contact etching process, a big hole 44A is etched through a second stop layer 19-2, a first insulating layer 18-1 and a first stop layer 19-1 to the surfaces of source/drain regions, 14-1 and 14-2, and shallow trench insulating region 11.

Figure 44:
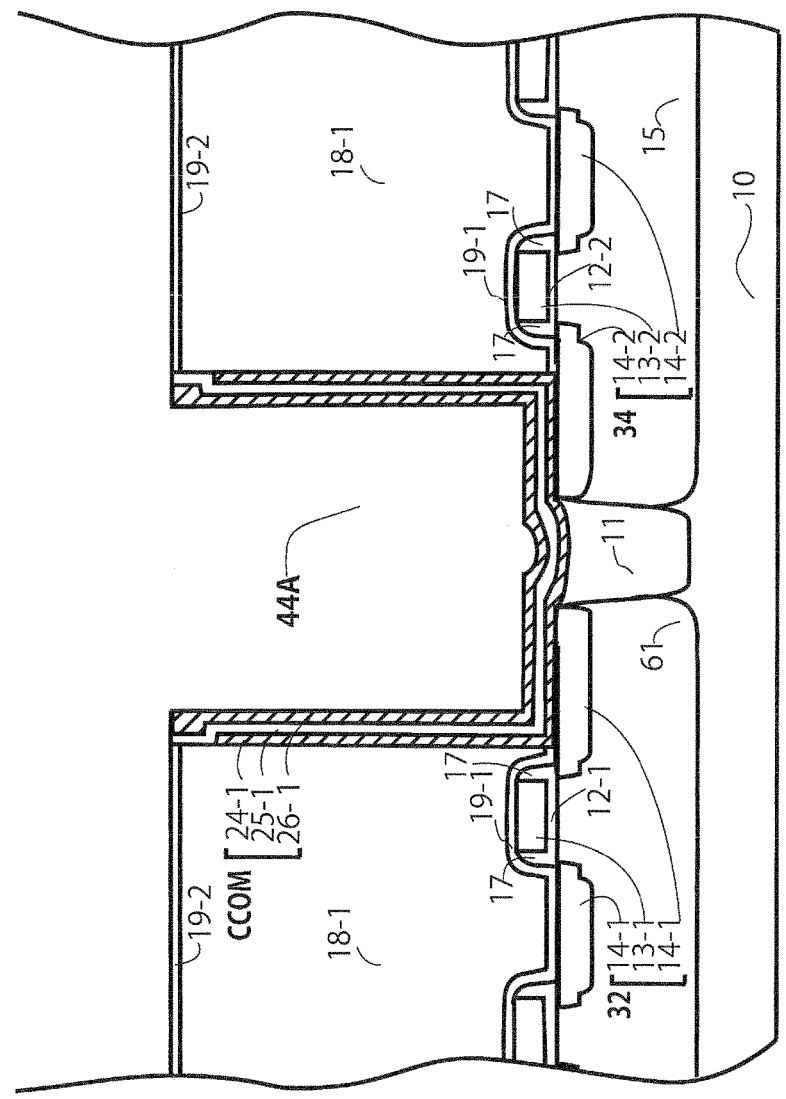
FIG. 44 is a cross sectional view of a second process of the process flow to fabricate the second embodiment of the invention.

Referring to FIG. 44, not shown, a first barrier metal layer 24 made of such as tantalum nitride or titanium nitride, is deposited over the top surface of the device structure including on the inside side-walls and a bottom surface of the big contact hole 44A shown in FIG. 43 by CVD.

Not explained detailed process here, after forming a first metal electrode plate 24-1 by processing the deposited first barrier metal layer 24, which is supposed to be a bottom metal electrode of the common capacitor CCOM, a capacitor dielectric material 25, which has a high dielectric constant such as silicon oxide, silicon nitride, silicon oxy-nitride, or tantalum oxide, is conformally deposited over the surface of all top structures including the first metal electrode plate 24-1.

Next, as a final step to form a metal-insulator-metal structure, a second barrier metal layer 26, which is supposed to be a top metal electrode of the common capacitor CCOM, is deposited over the capacitor dielectric material layer 25, which is made of such as tantalum nitride or titanium nitride.

Then, by removing the deposited capacitor dielectric material layer 25 and the deposited second barrier metal layer 26 on the second stop layers 19-2, the first insulating layers 18-1 thereon, a second metal electrode plate 26-1, which is supposed to be a top metal electrode of the common capacitor CCOM, is formed with a dielectric material plate 25-1.

Here, a formation of a basic structure of the common capacitor CCOM, including the first metal electrode plate 24-1, the dielectric material plate 25-1 and the second metal electrode plate 26-1, is completed as shown in FIG. 44.

As explained above, the common capacitor CCOM including three capacitor elements, namely, the first to third capacitor elements C1, C2 and C3 as shown in FIG. 20, is formed.

Figure 45:
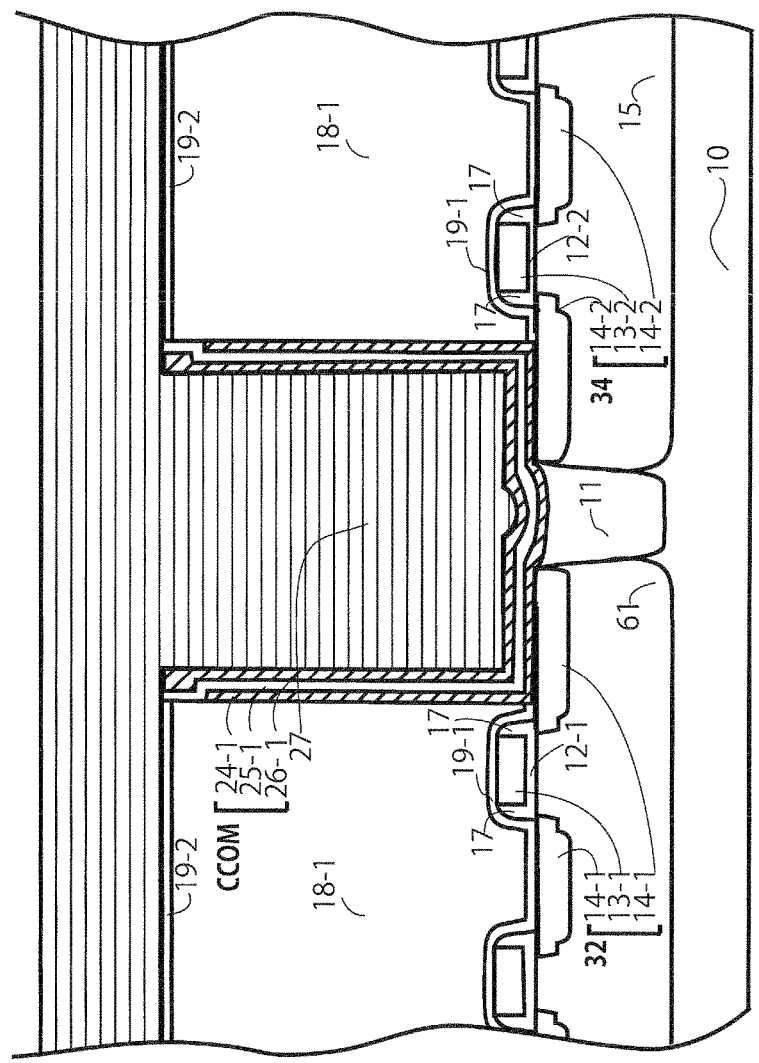
FIG. 45 is a cross sectional view of a third process of the process flow to fabricate the second embodiment of the invention.

Referring to FIG. 45, a second tungsten plug layer 27 is deposited over all the surface of the structure by CVD. Then, the cavity of the big contact hole 44A is filled with the tungsten plug layer 27.

Figure 46:
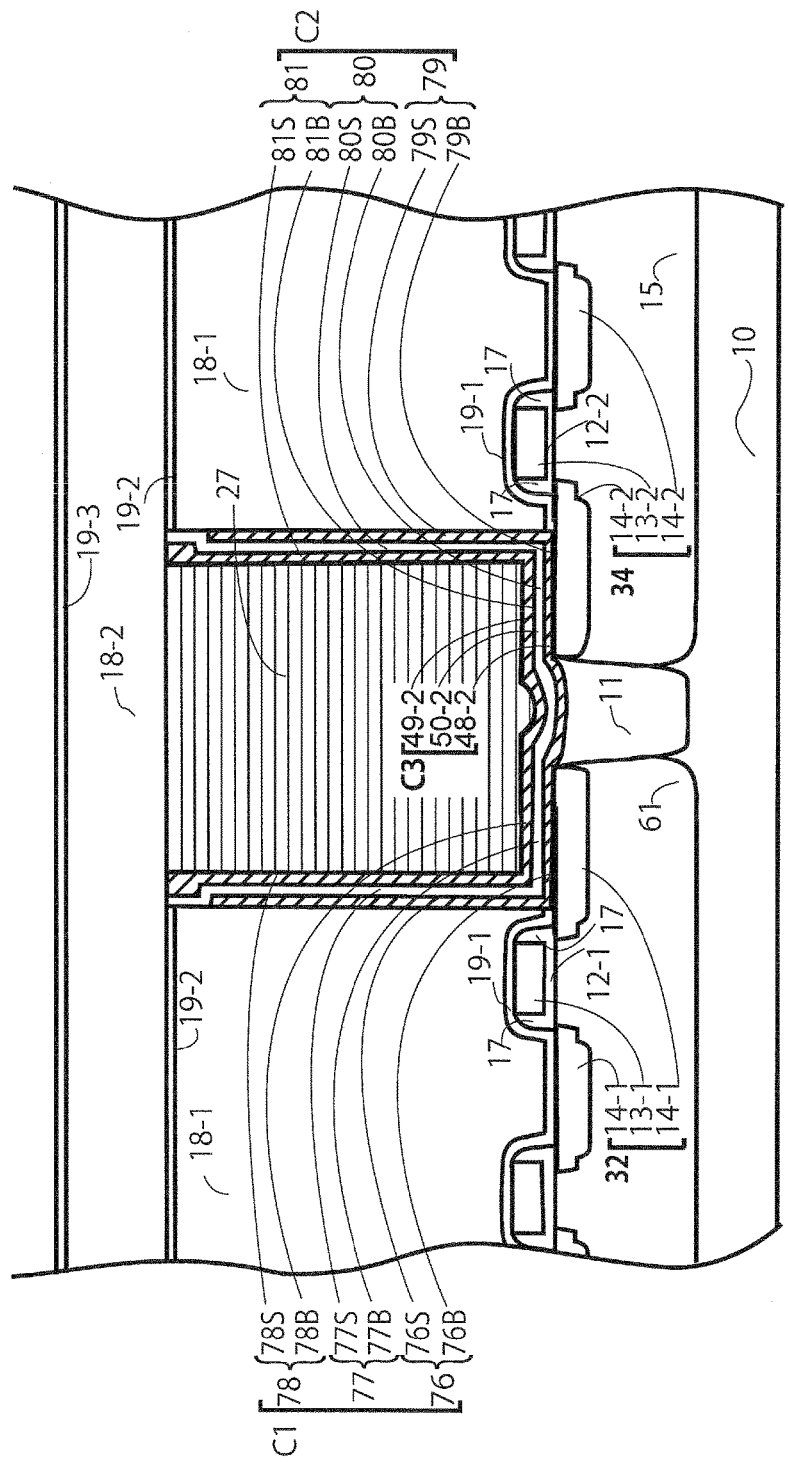
FIG. 46 is a cross sectional view of a fourth process of the process flow to fabricate the second embodiment of the invention.

Referring to FIG. 46, the top surface of the deposited first tungsten plug layer 27 is removed at the level of the second insulating layer 19-2 by a planarization process as Chemical Mechanical Polishing of CMP. Next, the top surface of the second insulating layer 18-2 is planarized, for example by CMP. Then, a third stop layer 19-3 is deposited on a surface of the flatten second insulating layer 18-2.

Figure 47:
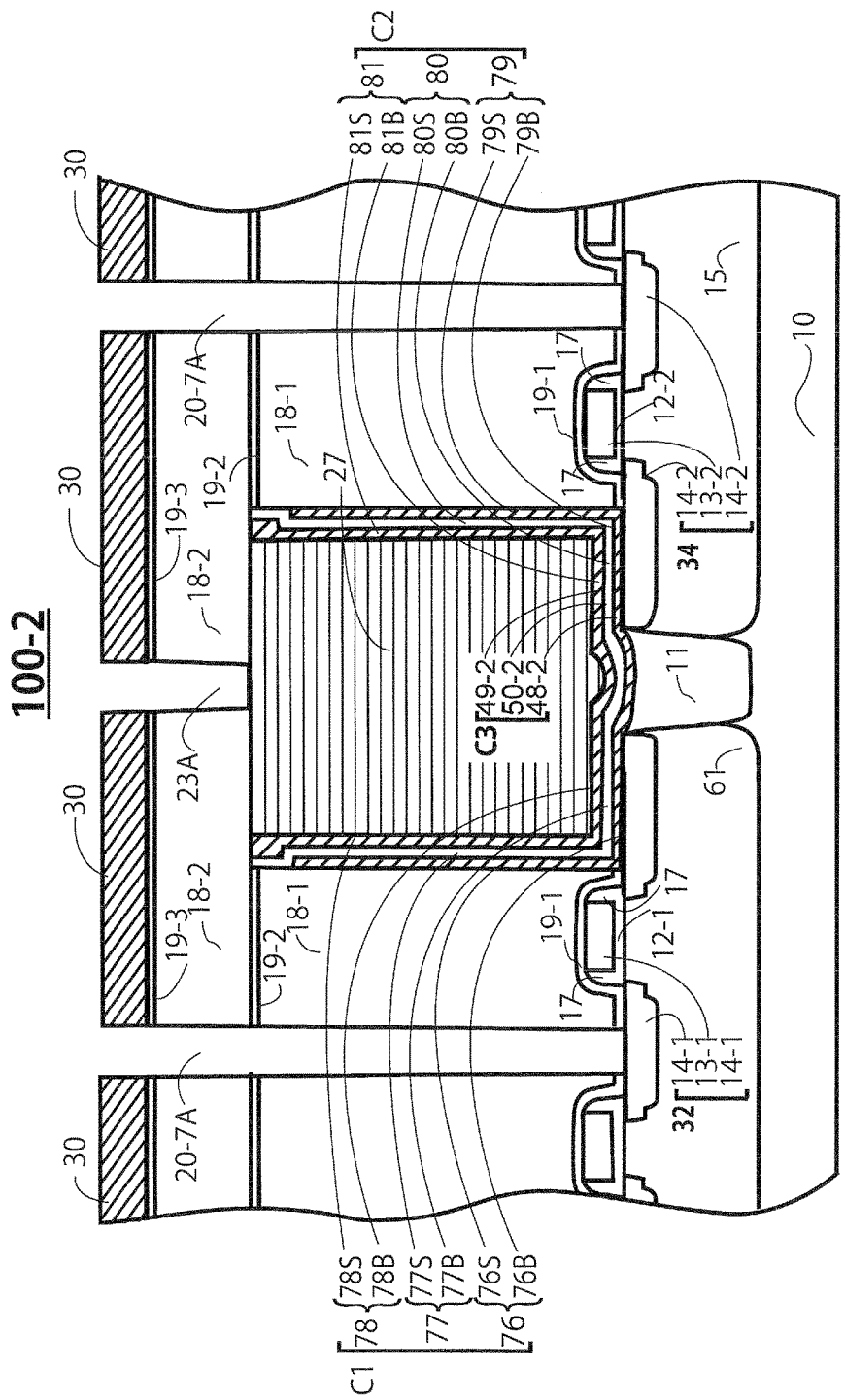
FIG. 47 is a cross sectional view of a fifth process of the process flow to fabricate the second embodiment of the invention.

Referring to FIG. 47, next, by using a patterning using nitride mask 30, bit-line contact holes 20-7As are defined and etched through the third stop layer 19-3, second insulator layer 18-2, second stop layer 19-2, the first insulator layers 18-1 and the first stop layer 19-1 to the surfaces of a second source/drain regions, 14-1 and 14-2, of the N-type and P-type transistors, 32 and 34, respectively. At the same timing, a memory cell plate contact hole 23A is also etched through the third stop layer 19-3, the second insulator layer 18-2 to the top of a surface of the tungsten plug 27 as shown in FIG. 47.

Figure 48:
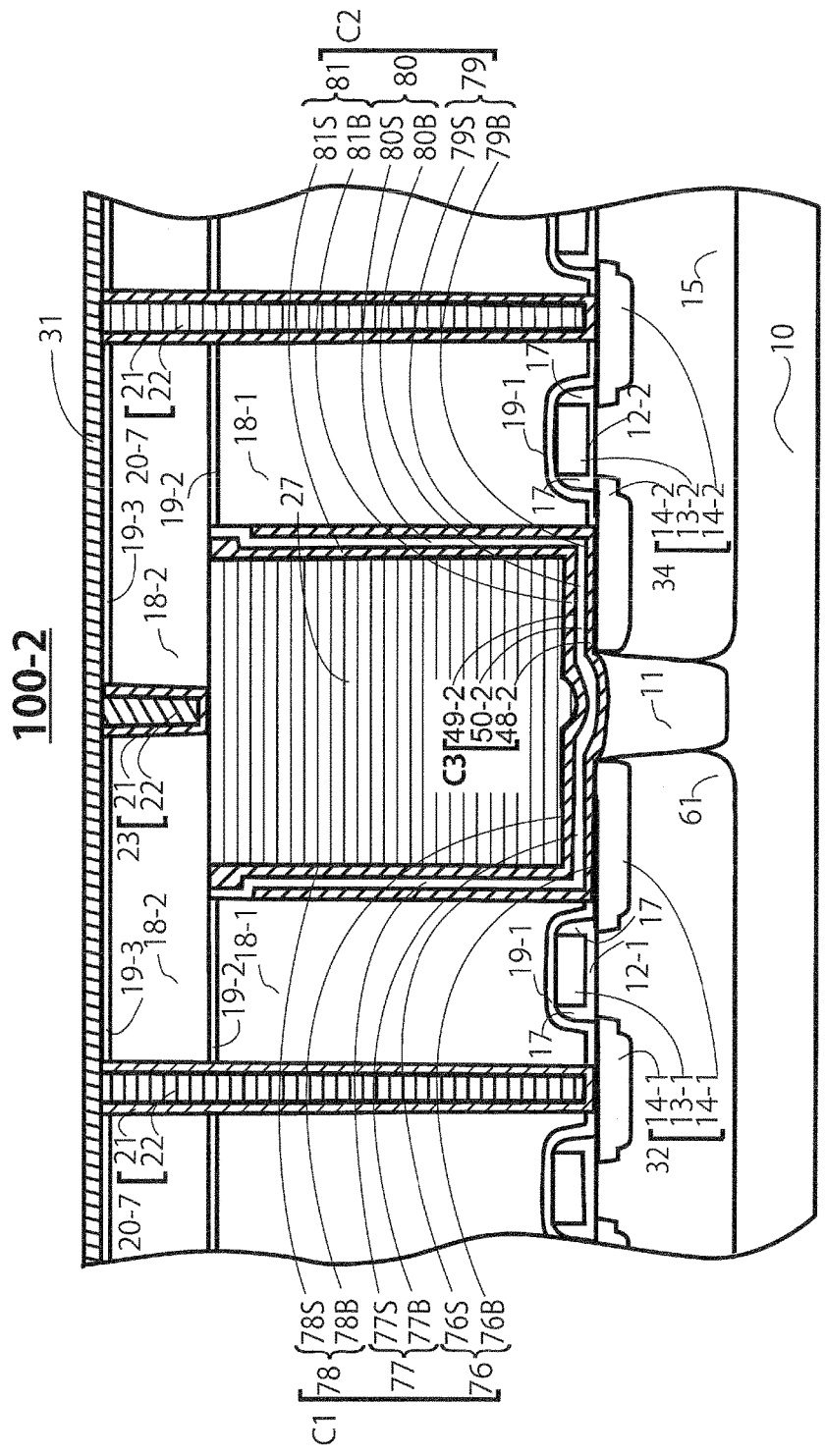
FIG. 48 is a cross sectional view of a sixth process of the process flow to fabricate the second embodiment of the invention.

Referring to FIG. 48, next, the nitride mask 30 is removed and a contact barrier metal 21 made of titanium and titanium nitride, for example, is deposited on the inside the bit-line contact holes 20-7A and a memory cell plate contact hole 23A, and then, a Tungsten plug layer 22 is deposited in the gap of the holes, 20-7As and 23A. Next, a second metal layer 31 is deposited over the third stop layer 19-3 as shown in FIG. 48.

Figure 49:
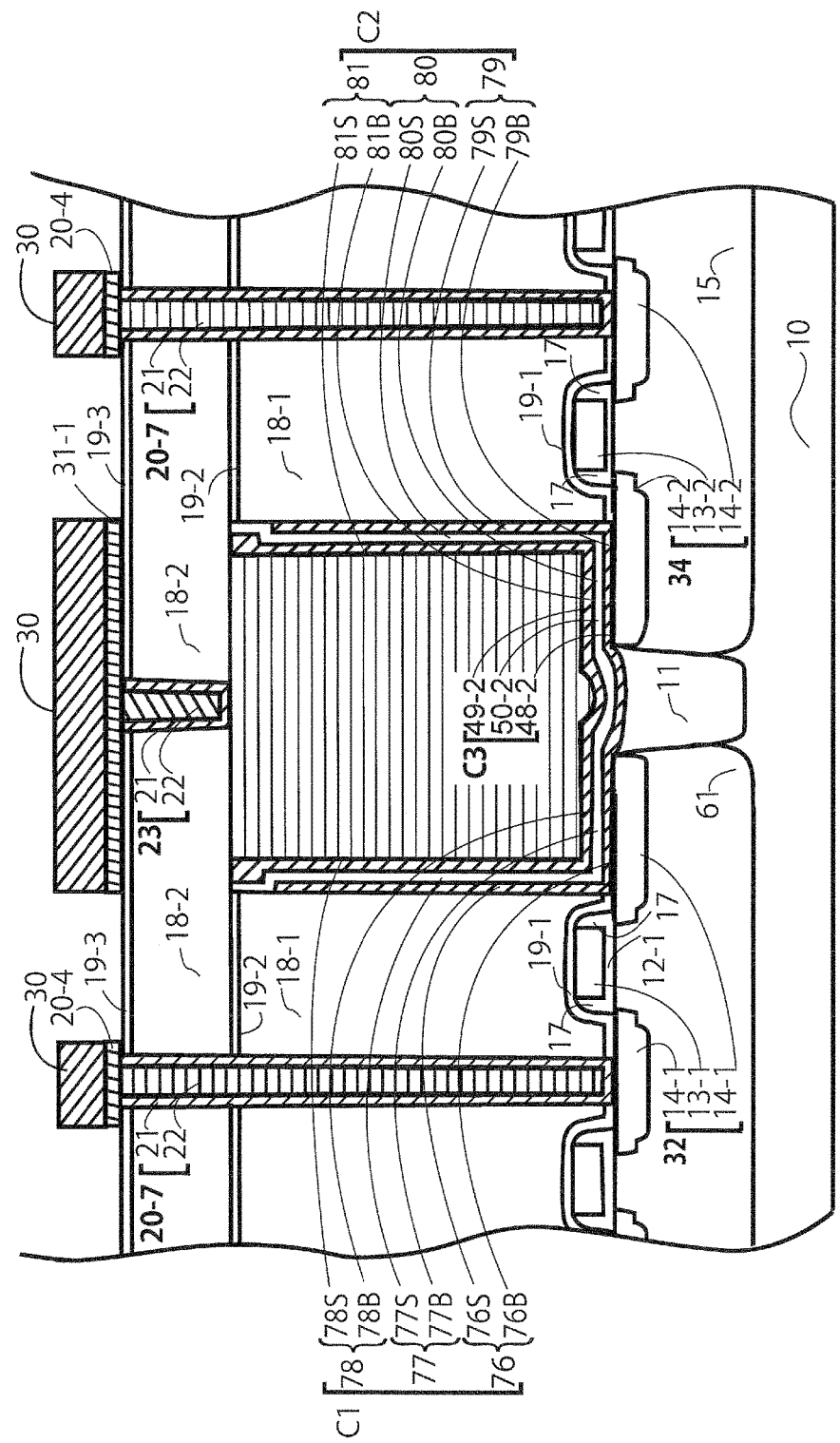
FIG. 49 is a cross sectional view of a seventh process of the process flow to fabricate the second embodiment of the invention.

Referring to FIG. 49, then, a nitride mask 30 is deposited over a first metal layer 31. Next, by the patterning of the nitride mask 30, the first metal 31, shown in FIG. 48, over the third stop layer 19-3 is separated to cell plate pads 31-1 and bit-line pads 20-4 as shown in FIG. 49.

Figure 50:
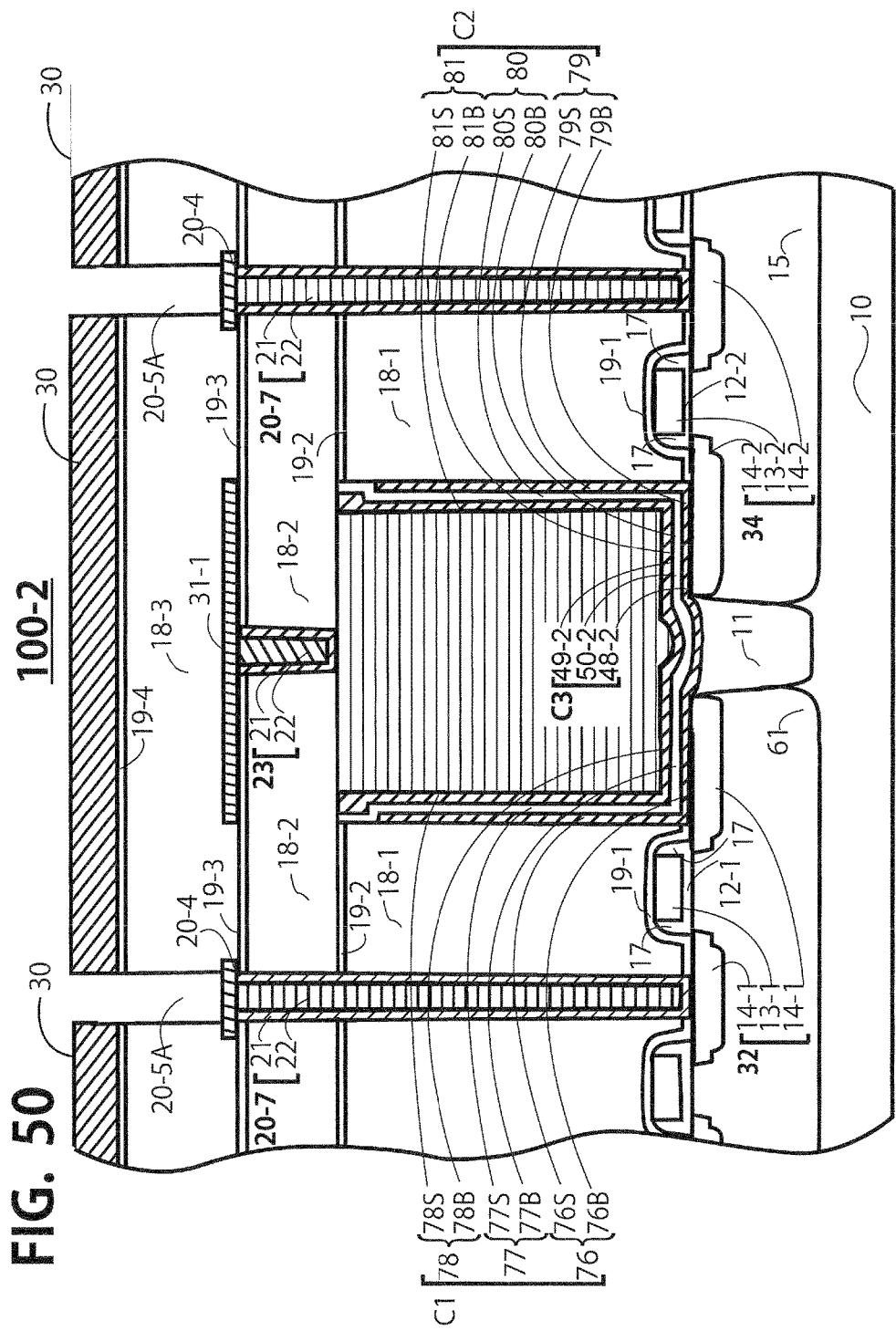
FIG. 50 is a cross sectional view of an eighth process of the process flow to fabricate the second embodiment of the invention.

Referring to FIG. 50, not shown, after the formations of the bit-line pads 20-4 and the cell plate pad 31-1, a third insulator layer 18-3 is deposited. Then, the insulator layer 18-3 is planarized, for example by CMP to obtain a flat surface and a fourth stop layer 19-4 is deposited. Next, the nitride mask 30 is deposited over the fourth stop layer 19-4. Then, by the patterning of the nitride mask 30, bit-line contact holes 20-5A are formed by etching through the fourth stop layer 19-4 and the second insulator layer 18-3 to the bit-line pads 20-4 as shown in FIG. 50.

Figure 51:
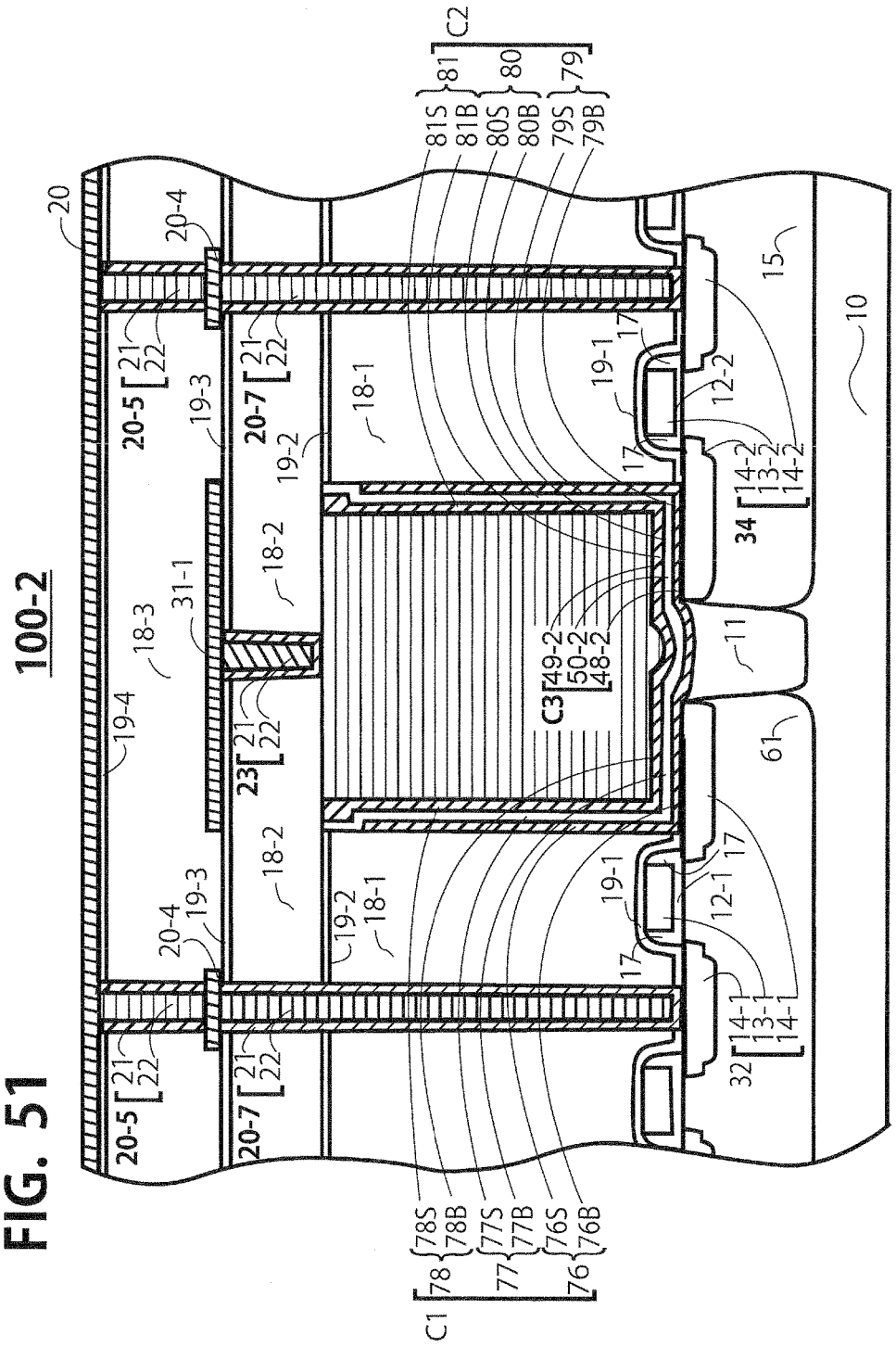
FIG. 51 is a cross sectional view of a ninth process of the process flow to fabricate the second embodiment of the invention.

Referring to FIG. 51, then, a contact barrier metal 21, which is made of titanium and titanium nitride, for example, is deposited on the inside the contact holes 20-5A, then, a tungsten plug 22 is filled in the contact hole 20-5A. Finally, a first metal layer 20, which will be a bit-line, is deposited over the fourth stop layer 19-4. Not shown in FIG. 51, however, after forming bit-lines by a patterning of this first metal layer 20 by using nitride mask, by next process steps, the final form of the memory cell unit 100-2 of the second embodiment of the invention will be fabricated.

What is claimed is:
1. A semiconductor device comprising:
a memory array (8B) including a plurality of DRAM cells (MC2), two synchronously operated complementary word-lines (WLi, WLiB), and a bit-line (20) including a first metal layer (20), a common storage plate power supply (VPLT) including a second metal layer (31-1),
wherein each of DRAM cell (MC2) is selected among from the plurality of DRAM cells by a row address (XAx), and a column address (YAy) which is generated by an address buffer (2-4A),
wherein the two synchronously operated complemental word-lines (WLi, WLiB) include a high-active word-line (WLi), and a low-active word-line (WLiB),
wherein each of the DRAM cells (MC2) comprises:
an N-type transistor (32) including a gate (13-1), a first source/drain region (14-1), and a second source/drain region (14-1);
a P-type transistor (34) including a gate (13-2), a first source/drain region (14-2), and a second source/drain region (14-2); and a shallow trench insulating region (11), which electrically separates the N-type transistor (32) from the P-type transistor (34); and
a common capacitor (CCOM), wherein the gate (13-1) of the N-type transistor (32) is connected to the active-high word-line (WLi), the first source/drain region (14-1) of the N-type transistor (32) is connected to the bottom metal electrode of the common capacitor (CCOM) directly, and the second source/drain region (14-1) of the N-type transistor (32) is connected to the bit-line (20) via a cell contact (20-1, 20-3 or 20-5, 20-7),
wherein the gate (13-2) of the P-type transistor (34) is connected to the low-active word-line (WLiB), the first source/drain region (14-2) of the P-type transistor (34) is connected to a common capacitor (CCOM) directly, the second source/drain region of the P-type transistor (34) is connected to the bit-line (20),
wherein the plurality of DRAM cells (MC2) is aligned in a bit-line direction (BLDIR) of the bit-line (20) so that the common capacitor (CCOM) is arranged around the center of each of the DRAM cell (MC2),
wherein top electrodes of the common capacitor (CCOM) of the said plurality of DRAM cells (MC2) are connected together and jointly to the storage plate power supply (VPLT) which is connected on a second metal layer (31-1) and disposed in the direction (WLDIR) of the word-lines,
wherein the common capacitor (CCOM) comprises:
a first capacitor element (C1);
a second capacitor element (C2); and
a third capacitor element (C3),
wherein the first capacitor element (C1) includes an outer metal cylinder (70), an inner metal cylinder (72), and a dielectric layer (71),
wherein the outer metal cylinder (70) of the first capacitor element (C1) includes a sidewall metal layer (70S) and a bottom metal layer (70B), the inner metal cylinder (72) of the first capacitor element (C1) includes a side-wall metal surface (72S) and a bottom metal layer (72B), the dielectric layer (71) of the first capacitor element (C1) includes a side-wall dielectric layer (71S) and a bottom dielectric layer (71B), and the bottom metal layer (70B) of the outer metal cylinder (70) is connected to a surface (SURN) of the first source/drain region (14-1) of the N-type transistor (32),
wherein the second capacitor element (C2) includes an outer metal cylinder (73), an inner metal cylinder (75), and a dielectric layer (74),
wherein the outer metal cylinder (73) of the second capacitor element (C2) includes a sidewall metal layer (73S) and a bottom metal layer (73B), the inner metal cylinder (75) includes a side-wall metal surface (75S) and a bottom metal layer (72B), the dielectric layer (74) of the second capacitor element (C2) includes a side-wall dielectric layer (74S) and a bottom dielectric layer (74B), and the bottom metal layer (73B) of the outer metal cylinder (73) is connected to a surface (SURP) of the first source/drain region (14-2) of the P-type transistor (34),
wherein the third capacitor element (C3) includes a bottom metal electrode plate (48-1), a top metal electrode plate (49-1), and a dielectric layer (50-1),
wherein the bottom metal electrode plate (48-1) of the third capacitor element (C3) is connected to the sidewall metal layer (70S) of the outer metal cylinder (70) of the first capacitor element C1, and the sidewall metal layer (73S) of the outer metal cylinder (73) of the second capacitor element C2,
wherein the top metal electrode plate (49-1) the third capacitor element (C3) is connected to the sidewall metal layer (72S) of the inner metal cylinder (72) of the first capacitor element C1, and the sidewall metal layer (75S) of the inner metal cylinder (75) of the second capacitor element (C2), and wherein the dielectric layer (50-1) of the third capacitor element (C3) is connected to the side-wall dielectric layer (71S) of the dielectric layer (71) of the first capacitor element (C1), and the side-wall dielectric layer (74S) of the dielectric layer (74) of the second capacitor element (C2).

2. The semiconductor memory device according to claim 1, further comprising a shallow trench insulating region (11), which electrically separating the N-type transistor (32) from the P-type transistor (34).

3. The semiconductor memory device according to claim 2, further comprising:
a first bit-line contact (20-7 and 20-5 via 20-4, 20-1 and 20-3 via 20-2); the first bit-line contact electrically connecting between a second source/drain region (14-1) of the N-type transistor (32) and the bit-line (20); and
a second bit-line contact (20-7 and 20-5 via 20-4, 20-1 and 20-3 via 20-2); the second bit-line contact electrically connecting between a second source/drain region (14-2) of the P-type transistor (34) and the bit-line (20).

4. The semiconductor memory device according to claim 3, further comprising a via metal contact (23) connecting between a top metal electrode plate (49-1) of the third capacitor element (C3) and a second metal layer (31-1) being formed on a second insulating layer (18-2).

5. The semiconductor memory device according to claim 3, further comprising a third metal layer (31-2) being connected to the top metal electrode plate (49-1) of the third capacitor element (C3).

6. The semiconductor memory device according to claim 4, further comprising a barrier gate-polysilicon layer (60) being formed on the shallow trench insulating region (11) being formed between the first source/drain region (14-1) of the N-type transistor (32) and the first source/drain region (14-2) of P-type transistor (34).

7. The semiconductor memory device according to claim 5, further comprising a barrier gate-polysilicon layer (60) being formed on the shallow trench insulating region (11) being formed between the first source/drain region (14-1) of the N-type transistor (32) and the first source/drain region (14-2) of P-type transistor (34).

8. A semiconductor memory device comprising:
a memory array (8B) including a plurality of DRAM cells (MC2), two synchronously operated complementary word-lines (WLi, WLiB and a bit-line (20) including a first metal layer (20), and a common storage plate power supply (VPLT) including a second metal layer (31-1),
wherein each of DRAM cell (MC2) is selected among from the plurality of DRAM cells by a row address (XAx), and a column address (YAy) which is generated by an address buffer (2-4A),
wherein the two synchronously operated complemental word-lines (WLi, WLiB) include a high-active word-line (WLi), and a low-active word-line (WLiB),
wherein each of the DRAM cells (MC2) comprises:
an N-type transistor (32) including a gate (13-1), a first source/drain region (14-1), and a second source/drain region (14-1);
a P-type transistor (34) including a gate (13-2), a first source/drain region (14-2), and a second source/drain region (14-2); and a shallow trench insulating region (11), which electrically separates the N-type transistor (32) from the P-type transistor (34); and
a common capacitor (CCOM),
wherein the gate (13-1) of the N-type transistor (32) is connected to the active-high word-line (WLi), the first source/drain region (14-1) of the N-type transistor (32) is connected to the bottom electrode of the common capacitor (CCOM) directly, and the second source/drain region (14-1) of the N-type transistor (32) is connected to the bit-line (20) via a cell contact (20-1, 20-3 or 20-5, 20-7),
wherein the gate (13-2) of the P-type transistor (34) is connected to the low-active word-line (WLiB), the first source/drain region (14-2) of the P-type transistor (34) is connected to a common capacitor (CCOM) directly, the second source/drain region of the P-type transistor (34) is connected to the bit-line (20),
wherein the plurality of DRAM cells (MC2) is aligned in a bit-line direction (BLDIR) of the bit-line (20) so that the common capacitor (CCOM) is arranged around the center of each of the DRAM cell (MC2),
wherein top electrodes of the common capacitor (CCOM) of the said plurality of DRAM cells (MC2) are connected together and jointly to the storage plate power supply (VPLT) which is connected on a second metal layer (31-1) and disposed in the direction (WLDIR) of the word-lines,
wherein the common capacitor (CCOM) comprises:
a first capacitor element (C1),
a second capacitor element (C2), and
a third capacitor element (C3),
wherein the first capacitor element (C1) includes an outer metal semicircular cylinder (76), an inner metal semicircular cylinder (78) and a dielectric layer (77),
wherein the outer metal semicircular cylinder (76) of the first capacitor element (C1) includes a metal sidewall (76S) and a bottom metal layer (76B), the inner metal semicircular cylinder (78) of the first capacitor element (C1) includes a metal side-wall (78S) and a bottom metal layer (78B), the dielectric layer (77) of the first capacitor element (C1) includes a side-wall dielectric layer (77S) and a bottom dielectric layer (77B), and the bottom metal layer (76B) of the outer metal semicircular cylinder (76) is connected to a surface (SURN) of the first source/drain region (14-1) of the N-type transistor (32),
wherein a capacitor edge structure (ENDLA, ENDRA) covers all over a top edge of the first capacitor element (C1) and is structured in a region from a top edge height level of the metal side-wall (78S) of the inner metal semicircular cylinder (78) to a lower height level having a distance (DIS),
wherein the capacitor edge structure (ENDLA, ENDRA) includes a top edge portion of the metal side-wall (78S) of the inner metal semicircular cylinder (78), a top edge portion of the side-wall dielectric layer (77S) of the dielectric layer (77), and the metal sidewall (76S) of the outer metal semicircular cylinder (76) being located under the capacitor edge structure (ENDLA, ENDRA) or lower, thereby structuring the first capacitor element (C1) with the metal side-wall (78S) of the inner metal semicircular cylinder (78) and side-wall dielectric layer (77S) of the dielectric layer (77),
wherein the second capacitor element (C2) includes an outer metal semicircular cylinder (79), an inner metal semicircular cylinder (81) and a dielectric layer (80), wherein the outer metal semicircular cylinder (79) of the second capacitor element (C2) includes a metal side-wall (79S) and a bottom metal layer (79B), the inner metal semicircular cylinder (81) of the second capacitor element (C2) includes a metal side-wall (81S) and a bottom metal layer (81B), the dielectric layer (80) of the second capacitor element (C2) of the second capacitor element (C2) includes a side-wall dielectric layer (80S) and a bottom dielectric layer (80B), and the bottom metal layer (79B) of the outer metal semicircular cylinder (79) is connected to a surface (SURP) of the first source/drain region (14-2) of the P-type transistor (34), wherein a capacitor edge structure (ENDLB, ENDRB) covers all over a top edge of the second capacitor element C2 and is structured in a region from a top edge height level of the metal side-wall (81S) of the inner metal semicircular cylinder (81) to a lower height level having a distance (DIS), the capacitor edge structure (ENDLB, ENDRB) includes a top edge portion of the metal side-wall (81S) of the inner metal semicircular cylinder (81) and a top edge portion of the side-wall dielectric layer (80S) of the dielectric layer (80), and the metal sidewall (79S) of the outer metal semicircular cylinder (79) being located under the capacitor edge structure (ENDLB, ENDRB) or lower, thereby structuring the second capacitor element (C2) with the metal side-wall (81S) of the inner metal semicircular cylinder (81) and side-wall dielectric layer (80S) of the dielectric layer (80), wherein the third capacitor element (C3) includes an outer U-shaped groove (48-2), an inner metal U-shaped groove (49-2), and a dielectric layer (50-2), wherein the outer U-shaped groove (48-2) including a left metal side-wall (48-2SL), a right metal side-wall (48-2SR), and a bottom metal layer (48-2B), the inner metal U-shaped groove (49-2) includes a left metal side-wall (49-2SL), a right metal side-wall (49-2SR), and a bottom metal layer (49-2B), and the dielectric layer (50-2) includes a left dielectric side-wall (50-2SL), a right dielectric side-wall (50-2SR), and a bottom dielectric layer (50-2B), wherein a capacitor edge structure (ENDLC) covers all over a top edge of a left side portion (49-2SL, 50-2SL and 48-2SL) of the third capacitor element (C3), and is being structured in a region from a top edge height level of the left metal side-wall (49-2SL) of the inner metal U-shaped groove (49-2) to a lower height level having a distance (DIS), and the capacitor edge structure (ENDLC) includes a top edge portion of the left metal side-wall (49-2SL) of the inner metal U-shaped groove (49-2), and a top edge portion of the left dielectric side-wall (50-2SL) of the dielectric layer (50-2), and the left metal side-wall (48-2SL) of the outer U-shaped groove (48-2) being located under the capacitor edge structure (ENDLC) or lower, thereby structuring a portion of the third capacitor element (C3) with the left metal side-wall (49-2SL) of the inner metal U-shaped groove (49-2) and the left dielectric side-wall (50-2SL) of the dielectric layer (50-2), wherein a capacitor edge structure (ENDRC) covers all over a top edge of a right side portion (49-2SR, 50-2SR and 48-2SR) of the third capacitor element (C3), and is structured in a region from a top edge height level of the a right metal side-wall (49-2SR) of the inner metal U-shaped groove (49-2) to a lower height level having a distance (DIS), and the capacitor edge structure (ENDRC) includes a top edge portion of the right metal side-wall (49-2SR) of the inner metal U-shaped groove (49-2), a top edge portion of the right dielectric side-wall (50-2SR) of the dielectric layer (50-2), and the right metal side-wall (48-2SR) of the outer U-shaped groove (48-2) being located under the capacitor edge structure (ENDRC) or lower, thereby structuring a portion of the third capacitor element (C3) with the right metal side-wall (49-2SR) of the inner metal U-shaped groove (49-2) and the right dielectric side-wall (50-2SR) of the dielectric layer (50-2), and wherein the outer U-shaped groove (48-2) is connected to the outer semicircular cylinder (76) of the first capacitor element (C1) and the outer metal semicircular cylinder (79) of the second capacitor element (C2), and the inner metal U-shaped groove (49-2) is connected to the inner metal semicircular cylinder (78) of the first capacitor element C1 and the inner metal semicircular cylinder (81) of the second capacitor element (C2), and the dielectric layer (50-2) of the third capacitor element (C3) is connected to the dielectric layer (77) of the first capacitor element C1 and the dielectric layer (80) of the second capacitor element C2.

9. The semiconductor memory device according to claim 8, further comprising:
a first bit-line contact (20-7 and 20-5 via 20-4, 20-1 and 20-3 via 20-2), which electrically connecting a second source/drain region (14-1) of the N-type transistor (32) to the bit-line (20); and
a second bit-line contact (20-7 and 20-5 via 20-4, 20-1 and 20-3 via 20-2), which electrically connecting a second source/drain region (14-2) of the P-type transistor (34) to the bit-line (20).

10. The semiconductor memory device according to claim 9, further comprising a via metal contact (23) connecting a top metal electrode plate ( ) of the third capacitor element (C3), and a second metal layer (31-1) formed on a second insulating layer (18-2).

11. The semiconductor memory device according to claim 9, further comprising a second metal layer (31-2) being connected on the top electrode plate (49-2) of the third capacitor element (C3).

12. The semiconductor memory device according to claim 10, further comprising a buffer gate-polysilicon layer (60) being formed on the shallow trench insulating region (11).

13. The semiconductor memory device according to claim 11, further comprising a buffer gate-polysilicon layer (60) formed on the shallow trench insulating region (11).

* * * * *

UNITED STATES PATENT AND TRADEMARK OFFICE
CERTIFICATE OF CORRECTION

PATENT NO. : 10,020,311 B1
APPLICATION NO. : 15/666834
DATED : July 10, 2018
INVENTOR(S) : Owen Li et al.

It is certified that error appears in the above-identified patent and that said Letters Patent is hereby corrected as shown below:

On the Title Page

Item (72) Inventors:
Owen Li, Zhubei (TW); Wenliang Chen, Zhubei (TW)

Should read:
(72) Inventors: Owen Li, Zhubei (TW); Wenliang Chen, Zhubei (TW); Tse-Hsien Wu, Zhubei (TW), Jen-Chi Chuang, Zhubei (TW)

Signed and Sealed this
Twenty-seventh Day of August, 2019

Andrei Iancu
*Director of the United States Patent and Trademark Office*